(12) United States Patent
Sasaki et al.

(10) Patent No.: US 8,426,948 B2
(45) Date of Patent: Apr. 23, 2013

(54) LAMINATED SEMICONDUCTOR WAFER, LAMINATED CHIP PACKAGE AND METHOD OF MANUFACTURING THE SAME

(75) Inventors: Yoshitaka Sasaki, Milpitas, CA (US); Hiroyuki Ito, Milpitas, CA (US); Atsushi Iijima, Hong Kong (CN)

(73) Assignees: Headway Technologies, Inc., Milpitas, CA (US); Sae Magnetics (H.K.) Ltd., Hong Kong (CN)

( * ) Notice: Subject to any disclaimer, the term of this patent is extended or adjusted under 35 U.S.C. 154(b) by 320 days.

(21) Appl. No.: 12/848,595

(22) Filed: Aug. 2, 2010

(65) Prior Publication Data

US 2012/0025355 A1 Feb. 2, 2012

(51) Int. Cl.
*H01L 23/544* (2006.01)

(52) U.S. Cl.
USPC ......... 257/620; 257/622; 257/723; 257/777; 438/3

(58) Field of Classification Search .................. 257/74, 257/618, 620, 622, 684, 686, 688, 692, 693, 257/723, 772, 777, E25.006, E25.013, E23.011, 257/E23.012, E23.039, E23.114, E21.614; 438/3, 26, 33, 42, 107, 109, 113, 455, 458, 438/460, 461, 462, 953
See application file for complete search history.

(56) References Cited

U.S. PATENT DOCUMENTS

| 7,192,805 B2* | 3/2007 | Jobetto ............... 438/114 |
| 2004/0101993 A1* | 5/2004 | Salmon ............... 438/107 |
| 2007/0018320 A1* | 1/2007 | Tanida et al. ........... 257/737 |

FOREIGN PATENT DOCUMENTS

| JP | A-2003-7909 | 1/2003 |
| JP | A-2003-163324 | 6/2003 |
| JP | A-2007-234881 | 9/2007 |
| JP | A-2008-187061 | 8/2008 |
| JP | A-2010-103574 | 5/2010 |

* cited by examiner

*Primary Examiner* — Eduardo A Rodela
(74) *Attorney, Agent, or Firm* — Oliff & Berridge, PLC

(57) ABSTRACT

In a laminated semiconductor substrate, a plurality of semiconductor substrates are laminated. Each of the semiconductor substrate has a plurality of scribe-groove parts formed along scribe lines. Further, each of the semiconductor substrate has a plurality of device regions insulated from each other and has a semiconductor device formed therein. Further, an uppermost substrate and a lowermost substrate have electromagnetic shielding layer formed in regions other than the scribe-groove parts using a ferromagnetic body. Further, in the laminated semiconductor substrate, a through hole which penetrates the plurality of semiconductor substrates laminated in a laminated direction is formed in the scribe-groove part, and the laminated semiconductor substrate has a through electrode penetrating the plurality of semiconductor substrates through the through hole.

22 Claims, 41 Drawing Sheets

Fig.27
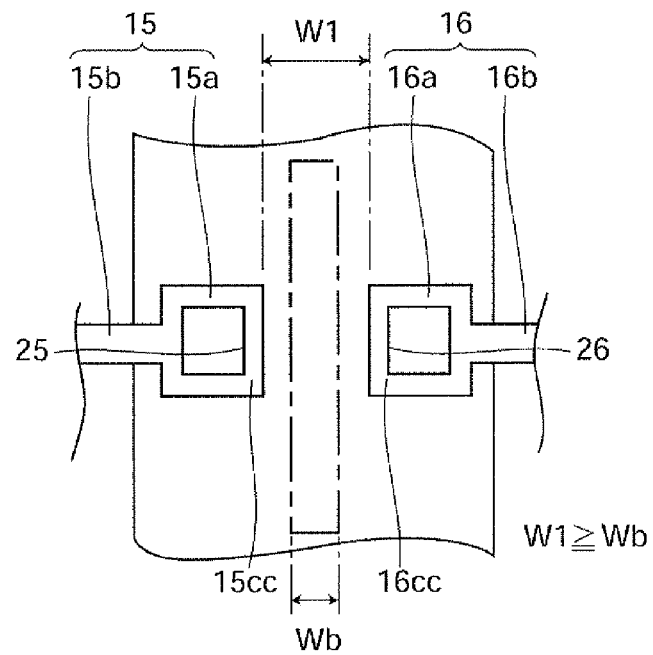
(a)
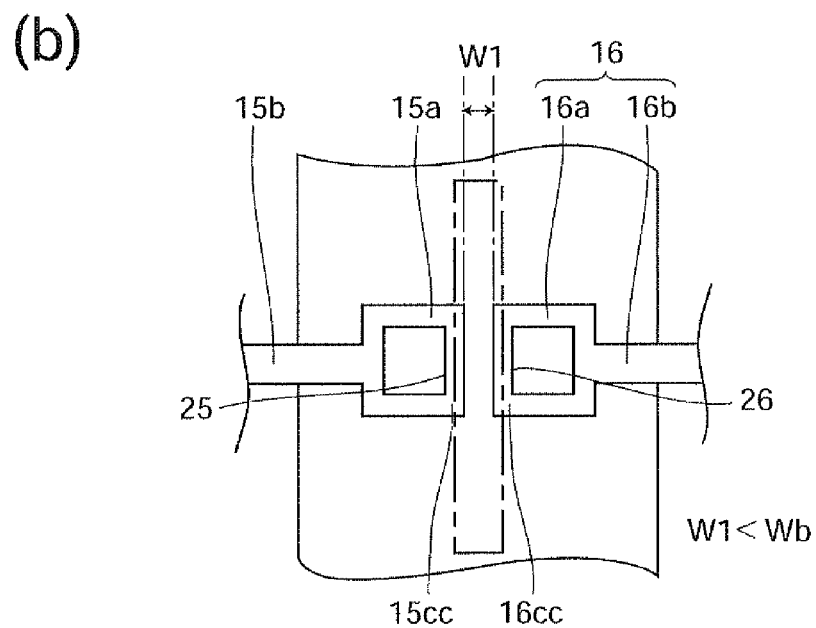
(b)

Fig.28
(a)
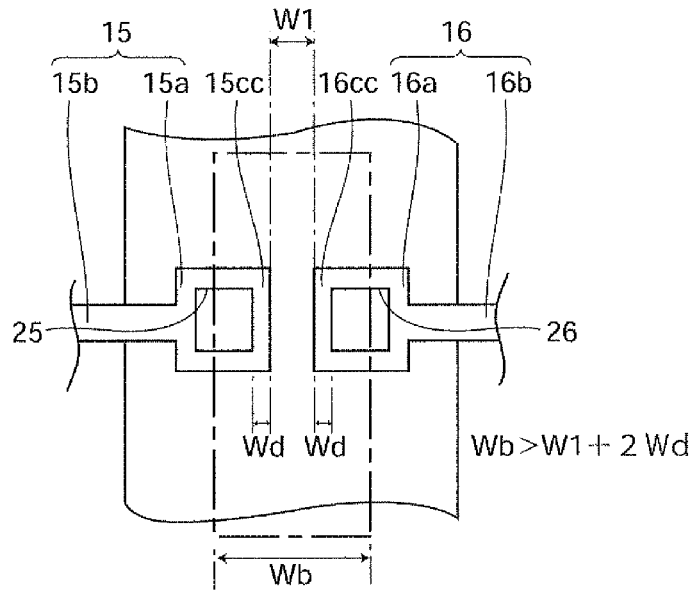
Wb > W1 + 2Wd
(b)
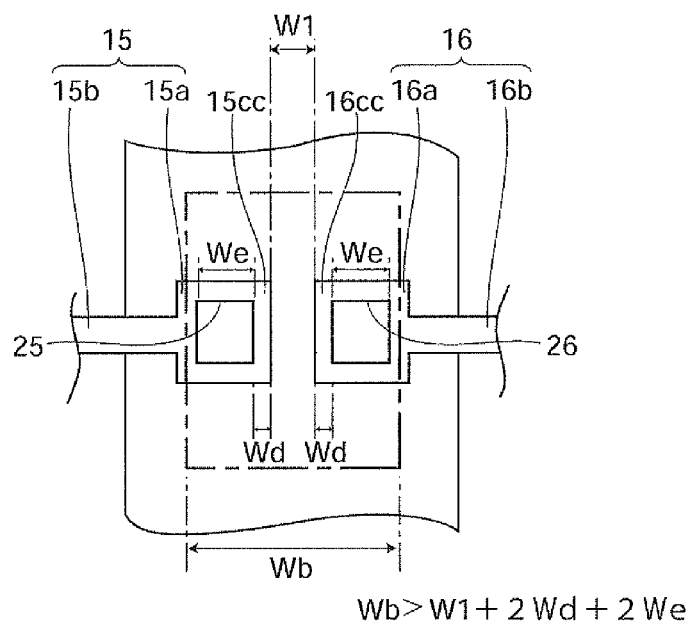
Wb > W1 + 2Wd + 2We

LAMINATED SEMICONDUCTOR WAFER, LAMINATED CHIP PACKAGE AND METHOD OF MANUFACTURING THE SAME

BACKGROUND

1. Field of the Invention

The present invention relates to a laminated semiconductor substrate for manufacturing a laminated chip package including a plurality of laminated semiconductor chips, a laminated chip package and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of semiconductor chips has received attention recently. Known as such a SIP is a package having a plurality of laminated semiconductor chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of semiconductor chips on a substrate and connecting a plurality of electrodes formed on each of the semiconductor chips and external connecting terminals formed on the substrate by wire bonding. The through electrode system is a system of forming a plurality of through electrodes in each of the laminated semiconductor chips and realizing wiring between the respective semiconductor chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the semiconductor chips.

Conventionally as methods of manufacturing the laminated chip package, for example, techniques disclosed in Japanese Patent Application Laid-Open No. 2003-163324 (referred also to as patent document 1), Japanese Patent Application Laid-Open No. 2003-7909 (referred also to as patent document 2), Japanese Patent Application Laid-Open No. 2008-187061 (referred also to as patent document 3), Japanese Patent Application Laid-Open No. 2007-234881 (referred also to as patent document 4) are known.

The patent document 1 discloses a laminated-type semiconductor device in which a plurality of layers of unit semiconductor devices having identical semiconductor chips are laminated. In the laminated-type semiconductor device, an insulating resin layer with through holes is formed around the semiconductor chips. In the through hole, a wiring plug is formed. The wiring plug extends from the front surface to the rear surface of the semiconductor chip, and an external electrode is connected to the front surface. Further, a wiring pattern is connected to the rear surface. One wiring pattern is formed for each laminated-type semiconductor device, and another wiring pattern is formed across adjacent laminated-type semiconductor devices to be shared between the adjacent laminated-type semiconductor devices (see FIG. 1, FIG. 2 and so on).

Besides, the patent document 2 discloses a laminated-type semiconductor device having a structure in which a plurality of semiconductor devices having through electrodes which reach the rear surface from the front surface provided therearound are laminated (see FIG. 47). The patent document 3 discloses a laminated memory in which a plurality of memory chips having through holes formed inside the peripheral edge part are laminated (see FIG. 6 and so on). Furthermore, the patent document 4 discloses a semiconductor device in which semiconductor substrates having through electrodes formed inside the peripheral edge part are laminated (see FIG. 2 and so on).

SUMMARY OF THE INVENTION

For manufacturing the laminated chip package (laminated-type semiconductor device), many processes including a diffusing process, a semiconductor inspection process and so on need to be performed. In these processes, an enormous number of apparatuses such as the etching apparatus, the exposure apparatus, the inspection apparatus and so on are used. These apparatuses use electric power as the power source and thus radiate some electromagnetic waves to the outside.

For this reason, all of the semiconductor wafer being the material of the laminated chip package, the partially manufactured semiconductor chip, and the completed laminated chip package are placed under the external environment in which some electromagnetic waves exist, and the laminated chip package is manufactured under the external environment in which some electromagnetic waves exist.

However, in the laminated-type semiconductor devices disclosed in the above patent documents, measures for avoiding the influence of the electromagnetic waves existing in the external environment are not implemented. Therefore, the influence of the electromagnetic waves existing in the external environment can be exerted on the completed laminated-type semiconductor devices.

For example, the laminated-type semiconductor device described in the patent document 4 is manufactured by laminating a plurality of semiconductor chips which are cut out of a wafer. In this laminated-type semiconductor device, individual semiconductor chips are cut out of the wafer having groove parts formed therein and resin layers formed in the groove parts. Therefore, only a part of the surface of each semiconductor chip is covered with the resin layer, and other parts of the surface are exposed.

Accordingly, any of the completed laminated-type semiconductor device as well as the partially manufactured wafer and the individual semiconductor chip is likely to take the influence of the electromagnetic waves. This laminated-type semiconductor device has a problem of being likely to take the influence of the electromagnetic waves for a long time. This may cause, for example, mixture of noise by the influence of the electromagnetic waves into the signal flowing through the wiring layer of each semiconductor chip. When the noise mixes into the signal flowing through the wiring layer, the waveform of the signal can vary to cause, for example, the effect that misjudgment will be made in the inspection process.

In this regard, there is an idea that the influence of the electromagnetic waves is avoided by a conductive film as in the semiconductor chip described in JP 2010-103574 (also referred to as the patent document 5). However, the conductive film disclosed in the patent document 5 has a structure covering substantially the whole semiconductor chip. Therefore, if the conductive film is formed on the above-described laminated-type semiconductor device, the conductive film will be formed after a plurality of semiconductor chips are laminated. The conductive film can shield against the electromagnetic waves after the plurality of semiconductor chips are laminated, but cannot avoid the influence of the electromagnetic waves exerted on the individual semiconductor chips as well as the wafer at the pre-lamination stage.

Meanwhile, the patent document 5 discloses that a shielding metal film is formed on the entire single surface of a wafer before semiconductor chips are cut out of it. However, in the laminated-type semiconductor device described in the patent document 4, many through electrodes are dispersedly located not only around the semiconductor chip but also the inside of the semiconductor chip. In the laminated-type semiconductor device in the patent document 4, a plurality of semiconductor chips cut out of the wafer are laminated. If the shielding metal film as in the patent document 5 is formed on the entire single surface of the wafer before the semiconductor chips are cut out of the wafer, the shielding metal film will be connected to those many through electrodes. Then, the through electrodes are electrically connected to each other by the shielding metal film, which is inconvenient for operating the laminated-type semiconductor device.

Further, the conductive film described in the patent document 5 is formed by applying a conductive paint. Therefore, this conductive film could not sufficiently shield against the magnetic field. To avoid the influence of the electromagnetic waves, it is preferable to shield against not only the electric field but also the magnetic field. However, the conventional technique described in the patent document 5 could not shield against the magnetic field, and could not achieve a sufficient effect of shielding against the electromagnetic waves.

As described above, in the conventional techniques, it is very difficult to achieve a sufficient effect of shielding against the electromagnetic waves for a long time from the wafer stage to the post-completion stage of the laminated chip package having the through electrodes while avoiding the situation that the through electrodes are electrically connected to each other via the shielding layer for shielding against the electromagnetic waves.

The present invention is made to solve the above problem, and it is an object to achieve the effect of shielding against the electromagnetic waves for a long time from the wafer stage to the post-completion stage while avoiding the situation that through electrodes are electrically connected to each other via a shielding layer to thereby enhance the shielding effect and sufficiently avoid the influence of the electromagnetic waves, in a laminated semiconductor substrate and a laminated chip packaged each having the through electrodes and manufacturing methods of the same.

To solve the above problem, the present invention is a laminated semiconductor substrate laminated a plurality of semiconductor substrates having a plurality of scribe-groove parts formed along scribe lines, the plurality of semiconductor substrates each including: a plurality of device regions insulated from each other, each of which is in contact with at least one of the plurality of scribe-groove parts and has a semiconductor device formed therein; and an electromagnetic shielding layer formed in regions other than the scribe-groove parts using a ferromagnetic body, provided in each of an uppermost substrate laminated on the top side and a lowermost substrate laminated on the bottom side among the plurality of semiconductor substrates, the laminated semiconductor substrate including: a through hole formed in the scribe-groove part which penetrates the plurality of semiconductor substrates laminated in a laminated direction in which the plurality of semiconductor substrates are laminated; and a through electrode penetrating the plurality of semiconductor substrates through the through hole.

In this laminated semiconductor substrate, the electromagnetic shielding layer is formed in regions other than the scribe-groove parts and through holes are formed in the scribe-groove parts, so that the places where the electromagnetic shielding layer is formed are isolated from the places where the through electrodes are formed. Further, because the uppermost substrate and the lowermost substrate each have the electromagnetic shielding layer, at least these two substrates are shielded from the electromagnetic waves from the stage of the semiconductor substrates. Further, the electromagnetic shielding layers of the uppermost substrate and the lowermost substrate shield against the electromagnetic waves from the stage of the semiconductor substrate to the post-completion stage. The electromagnetic shielding layer is formed using a ferromagnetic body and thus makes lines of magnetic force likely to pass through it and the electromagnetic waves likely to detour round the electromagnetic shielding layer.

In the above-described laminated semiconductor substrate, it is preferable that all of the plurality of semiconductor substrates including the uppermost substrate and the lowermost substrate each have the electromagnetic shielding layer.

In this configuration, all of the laminated semiconductor substrates are shielded from the electromagnetic waves from the stage of the semiconductor substrate, and the electromagnetic shielding layers of the semiconductor substrates more surely shield against the electromagnetic waves for the time from the stage of the semiconductor substrate to the post-completion stage. Furthermore, the device region in each semiconductor substrate is sandwiched between the two upper and lower electromagnetic shielding layers.

Further, in the above-described laminated semiconductor substrate, it is preferable that all of the plurality of semiconductor substrates including the uppermost substrate and the lowermost substrate each have the electromagnetic shielding layer, and in all of the plurality of semiconductor substrates, all of the plurality of device regions are formed on a first surface being one of surfaces of the semiconductor substrate, and the electromagnetic shielding layer is formed on the first surface to cover all of the plurality of device regions from the outside.

In this laminated semiconductor substrate, all of the laminated semiconductor substrates are shielded from the electromagnetic waves from the stage of the semiconductor substrate. Further, the electromagnetic shielding layers shield all of the plurality of device regions from the electromagnetic waves.

Further, in the above-described laminated semiconductor substrate, it is possible that all of the plurality of semiconductor substrates including the uppermost substrate and the lowermost substrate each have the electromagnetic shielding layer, and in all of the plurality of semiconductor substrates, all of the plurality of device regions are formed on a first surface being one of surfaces of the semiconductor substrate, and the electromagnetic shielding layer is formed on a second surface on the rear surface side of the first surface.

Further, in the above-described laminated semiconductor substrate, it is preferable that the electromagnetic shielding layer is formed in regions other than the scribe-groove parts on the first surface, and has individual structures having sizes according to the plurality of device regions respectively, individually covering all of the plurality of device regions, and separated from one another.

In this laminated semiconductor substrate, the electromagnetic shielding layer is formed at parts where the effect of electromagnetic shielding layer are effectively exhibited. Further, the individual electromagnetic shielding layers individually shield all of the plurality of device regions while keeping the respective insulating states.

Further, in the above-described laminated semiconductor substrate, it is preferable that the electromagnetic shielding layer is formed at corresponding positions corresponding to the plurality of device regions on the second surface and having sizes according to the plurality of device regions respectively, and the laminated semiconductor substrate further comprises an added electromagnetic shielding layer formed using a ferromagnetic body on the first surface in the uppermost substrate.

Further, in the above-described laminated semiconductor substrate, it is preferable that the laminated semiconductor substrate has an added electromagnetic shielding layer formed using a ferromagnetic body on a second surface on the rear surface side of the first surface in the lower most substrate.

Further, in case of the above-described laminated semiconductor substrate, it is preferable that the electromagnetic shielding layer is formed using a soft magnetic material.

In the above-described laminated semiconductor substrate, it is preferable that the plurality of semiconductor substrates each further includes: a first wiring electrode and a second wiring electrode which are connected to the respective semiconductor devices in a first device region and a second device region adjacent to each other across at least one interposed groove part of the plurality of scribe-groove parts of the plurality of device regions, and extend to the inside of the interposed groove part from the first device region and the second device region respectively, and are separated from each other, the laminated semiconductor substrate further includes: a plurality of laminated chip regions each of which is composed of the device regions laminated in the laminated direction in all of the plurality of semiconductor substrates, the through hole penetrates the interposed groove parts of the plurality of semiconductor substrates, and a plurality of the first wiring electrodes constituting a laminated electrode group laminated in the laminated direction of the first wiring electrodes appear in the through hole, and the through electrode is in contact with all of the first wiring electrodes appearing in the through hole.

Further, in the above-described laminated semiconductor substrate, it is preferable that where the first wiring electrodes having a common position among the first wiring electrodes in each of the plurality of semiconductor substrates are common wiring electrodes, the laminated electrode group is composed of the common wiring electrodes identical, regarding all of the plurality of semiconductor substrates.

Further, in the above-described laminated semiconductor substrate, it is preferable that the first wiring electrode has an electrode pad disposed inside the interposed groove part and having a hole part formed along the laminated direction, and the through hole is formed in a straight line connecting all of the hole parts formed in the respective electrode pads of the plurality of the first wiring electrodes constituting the laminated electrode group.

Further, the present invention provides a laminated chip package laminated a plurality of semiconductor chips having a semiconductor device, the plurality of semiconductor chips each including: a resin insulating layer made of an insulating resin formed to surround the semiconductor chip; and a wiring electrode which is connected to the semiconductor device and has an end part disposed on the resin insulating layer, an electromagnetic shielding layer formed in a region other than the resin insulating layer using a ferromagnetic body, provided in each of an uppermost chip laminated on the top side and a lowermost chip laminated on the bottom side among the plurality of semiconductor chips; a through hole formed penetrating the resin insulating layers of the plurality of semiconductor chips laminated in a laminated direction in which the plurality of semiconductor chips are laminated; and a through electrode penetrating the plurality of semiconductor chips through the through hole.

In the above-described laminated chip package, it is preferable that all of the plurality of semiconductor chips including the uppermost chip and the lowermost chip each have the electromagnetic shielding layer.

In the above-described laminated chip package, it is preferable that all of the plurality of semiconductor chips including the uppermost chip and the lowermost chip each have the electromagnetic shielding layer, and in all of the plurality of semiconductor chips, the semiconductor device is formed on a first surface being one of surfaces of the semiconductor chip, and the electromagnetic shielding layer is formed on the first surface to cover the semiconductor device from the outside.

Further, in the above-described laminated chip package, it is preferable that all of the plurality of semiconductor chips including the uppermost chip and the lowermost chip each have the electromagnetic shielding layer, and in all of the plurality of semiconductor chips, the semiconductor device is formed on a first surface being one of surfaces of the semiconductor chip, and the electromagnetic shielding layer is formed on a second surface on the rear surface side of the first surface.

Further, in the above-described laminated chip package, it is preferable that a plurality of the wiring electrodes constituting a laminated electrode group laminated in the laminated direction among the wiring electrodes appear in the through hole, and the through electrode is in contact with all of the wiring electrodes appearing in the through hole.

Further, the present invention provides a method of manufacturing a laminated semiconductor substrate, including: a substrate with groove forming step of forming a plurality of scribe-groove parts along scribe lines in a first surface where semiconductor devices are formed, in all of a plurality of unprocessed substrates having the semiconductor devices formed thereon, to form a plurality of substrates with groove including a plurality of device regions each of which is in contact with at least one of the plurality of scribe-groove parts and has the semiconductor device formed therein; an electromagnetic shielding layer forming step of forming an electromagnetic shielding layer in regions other than the scribe-groove parts using a ferromagnetic body, on the first surface or a second surface on the rear surface side of the first surface, in at least two of the plurality of substrates with groove; a lamination step of laminating the plurality of substrates with groove such that substrates with shielding layer each having the electromagnetic shielding layer among the plurality of substrates with groove formed in the substrate with groove forming step are placed on the top side and the bottom side respectively to manufacture a laminated wafer; a through hole forming step of forming a through hole penetrating the plurality of substrates with groove laminated in a laminated direction in which the plurality of substrates with groove are laminated, in the laminated wafer; and a through electrode forming step of forming a through electrode penetrating the plurality of substrates with groove through the through hole.

Further, it is preferable that in the electromagnetic shielding layer forming step, the electromagnetic shielding layer is formed in all of the plurality of substrates with groove to make all of the plurality of substrates with groove into the substrates with shielding layer, and in the lamination step, a plurality of only the substrates with shielding layer are laminated.

Further, it is preferable that in the electromagnetic shielding layer forming step, the electromagnetic shielding layer is formed on the first surface to have individual structures having sizes according to the plurality of device regions respectively, individually covering all of the plurality of device regions, and separated from one another.

Further, in the above-described method of manufacturing a laminated semiconductor substrate, it is preferable that in the electromagnetic shielding layer forming step, when forming the electromagnetic shielding layer on the second surface of the substrate with groove, the second surface of the substrate with groove is polished until the scribe-groove parts appear, and then the electromagnetic shielding layer is formed on the second surface to make the substrate with groove into the substrate with shielding layer, and the lamination step is executed by laminating another substrate with groove on the second surface of the substrate with shielding layer.

Further, in the above-described method of manufacturing a laminated semiconductor substrate, it is preferable that the method further includes an electrode forming step of forming a first wiring electrode and a second wiring electrode which are connected to the respective semiconductor devices in a first device region and a second device region adjacent to each other across at least one interposed groove part of the plurality of scribe-groove parts among the plurality of device regions in the substrate with groove, and extend to the inside of the interposed groove part from the first device region and the second device region respectively, and are separated from each other, the electromagnetic shielding layer forming step is executed after the first wiring electrode and the second wiring electrode are formed by executing the electrode forming step.

Further, the present invention provides a method of manufacturing a laminated chip package, including the step of: cutting the laminated semiconductor substrate manufactured by the above-described manufacturing method along the scribe-groove parts to cause resin insulating layers made of an insulating resin to appear in a cut surface to manufacture laminated chip packages.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 27 is a view illustrating an example of a relation of blade and wiring electrode, in which (a) shows a case of W1≧Wb, and (b) shows a case of W1<Wb;

FIG. 28 is a view illustrating an example of a relation of blade and wiring electrode, in which (a) shows a case of Wb>W1+2Wd, and (b) shows a case of Wb>W1+2Wd+2We;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment

Structure of Laminated Semiconductor Wafer 100

To begin with, the structure of a laminated semiconductor wafer 100 will be described with reference to FIG. 1 to FIG. 4. The laminated semiconductor wafer 100 is manufactured using a semiconductor wafer 1. The laminated semiconductor wafer 100 is a laminated semiconductor substrate according to a first embodiment of the present invention. In the laminated semiconductor wafer 100, a plurality of semiconductor wafers 1 are laminated. In the laminated semiconductor wafer 100 illustrated in FIG. 1, eight semiconductor wafers 1 are laminated. Since it is sufficient that a plurality of semiconductor substrates are laminated in the laminated semiconductor substrate according to the present invention, the number of the semiconductor wafers 1 which are laminated within the laminated semiconductor wafer 1 is not limited to eight.

Figure 1:
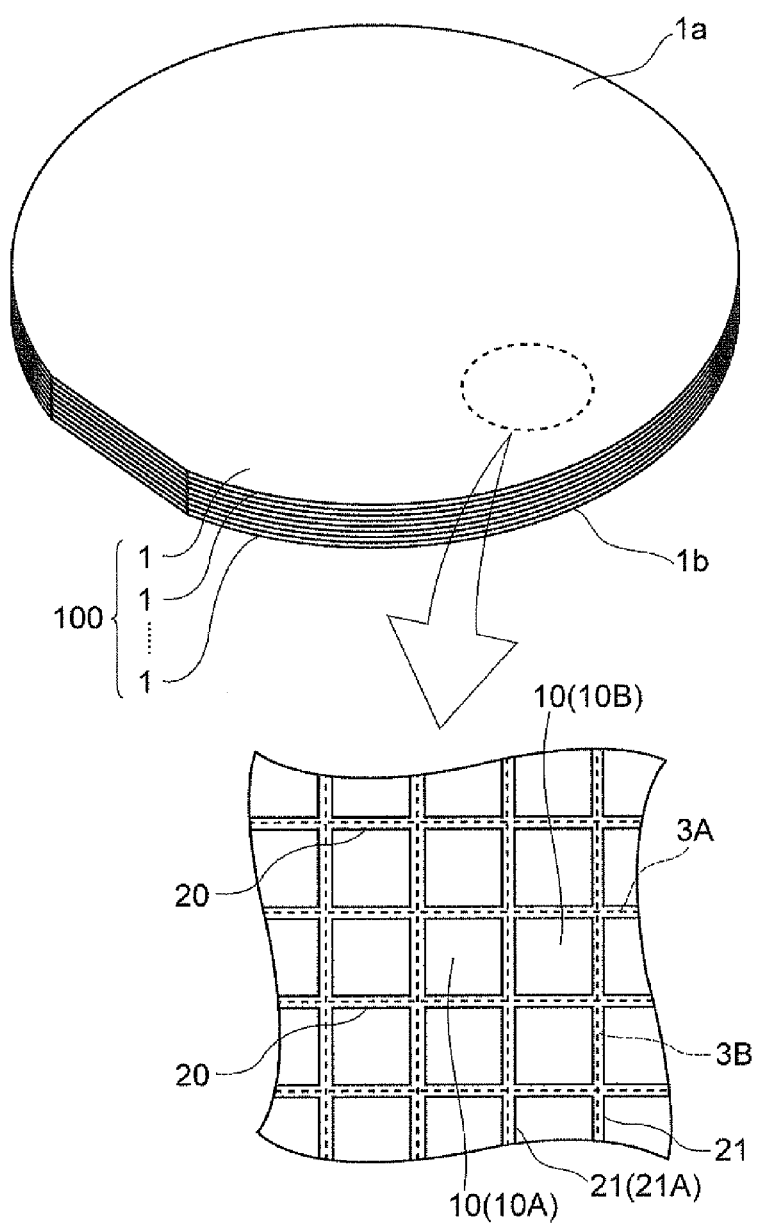
FIG. 1 is a perspective view illustrating the entire laminated semiconductor wafer according to a first embodiment of the present invention.
Figure 2:
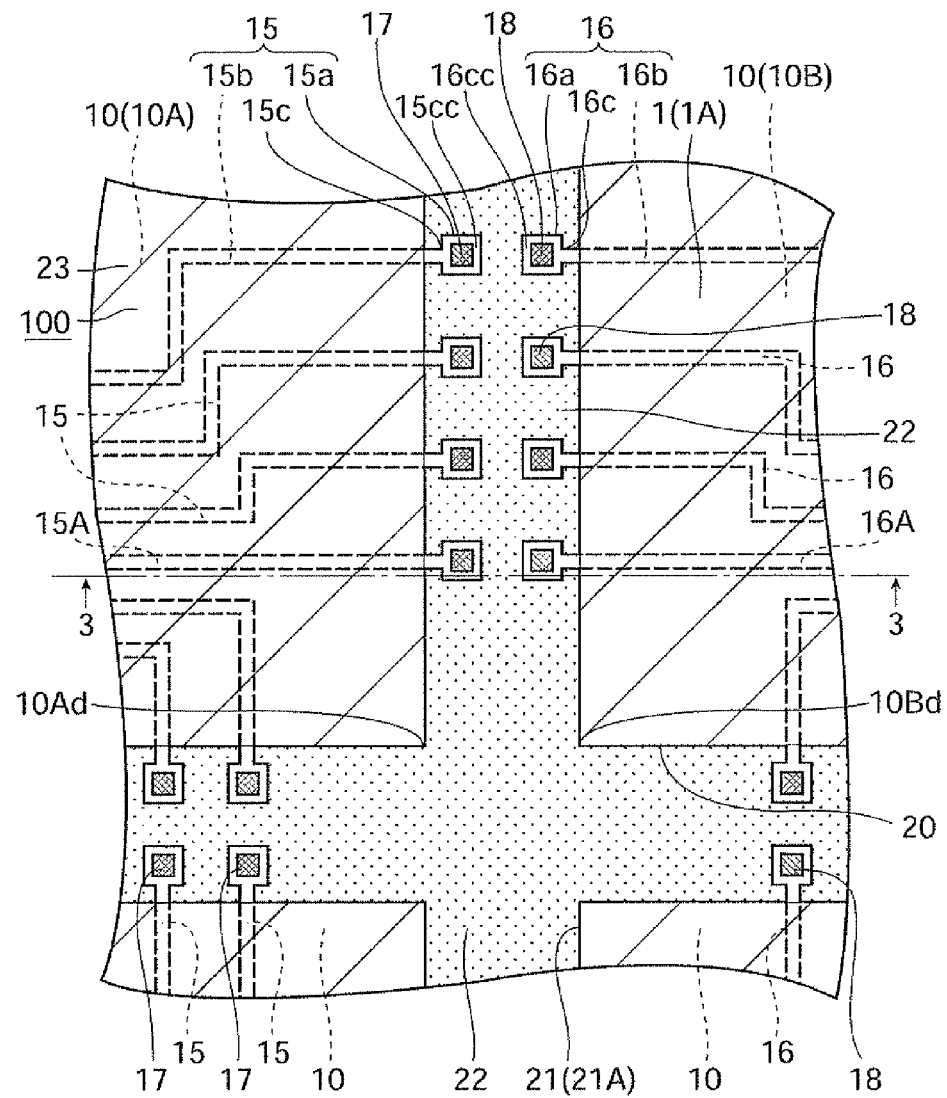
FIG. 2 is a plan view illustrating a principal part of two device regions of the laminated semiconductor wafer in FIG. 1.
Figure 3:
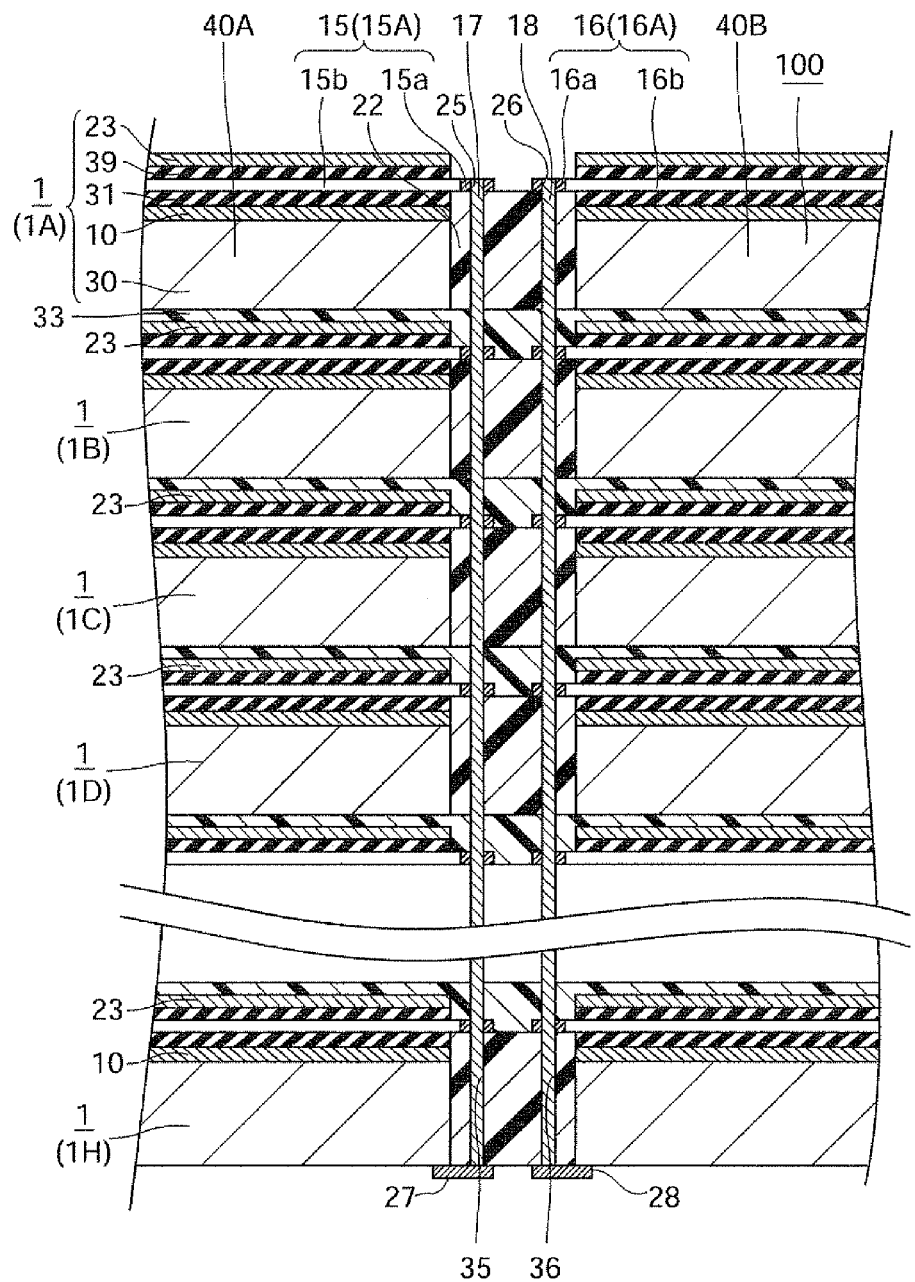
FIG. 3 is a sectional view taken along the line 3-3 in FIG. 2.
Figure 4:
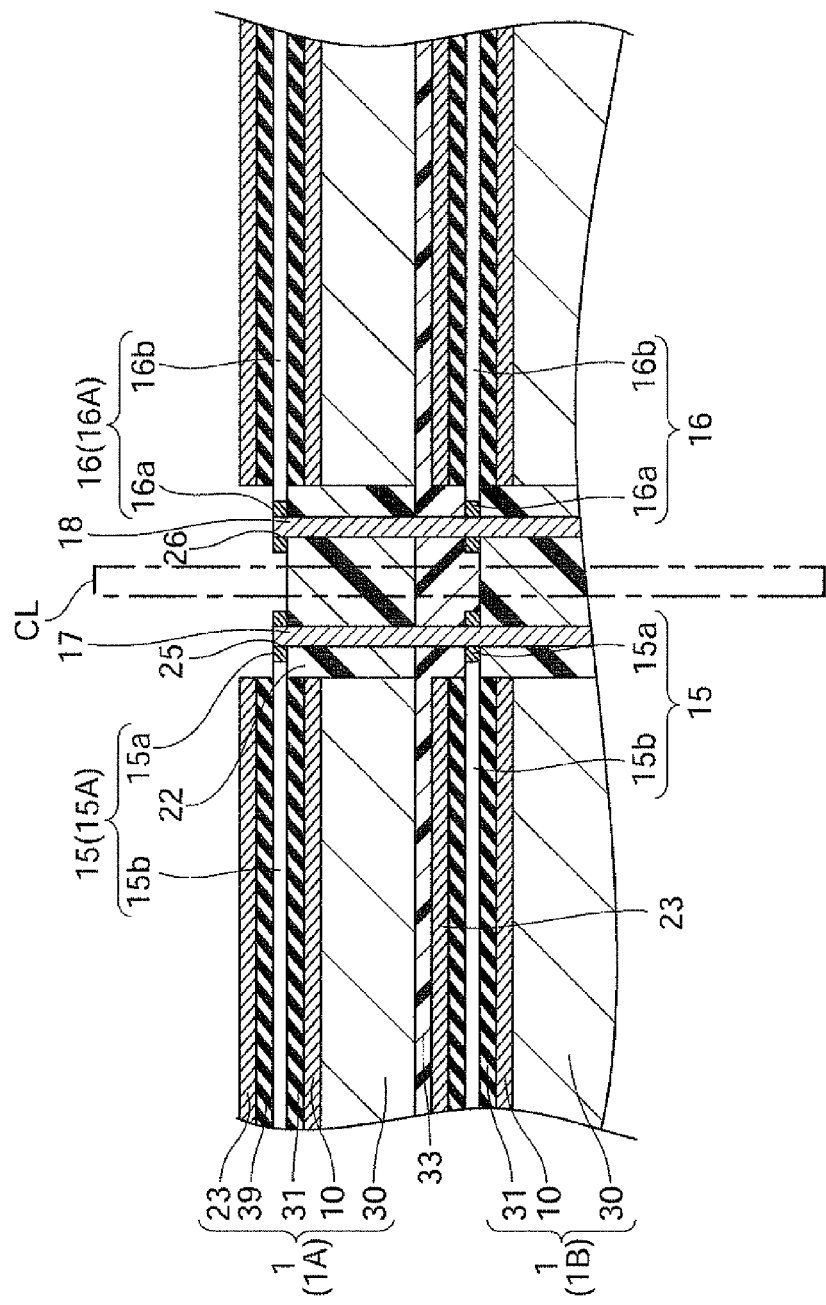
FIG. 4 is a sectional view illustrating a principal part of the laminated semiconductor wafer taken along the line 3-3 in FIG. 2.

Here, FIG. 1 is a perspective view illustrating the entire laminated semiconductor wafer 100. FIG. 2 is a plan view illustrating two device regions 10 of the laminated semiconductor wafer 100. Besides, FIG. 3 is a sectional view taken along the line 3-3 in FIG. 2, and FIG. 4 is a sectional view illustrating a principal part of the laminated semiconductor wafer 100 taken along the line 3-3 in FIG. 2.

The semiconductor wafer 1 is composed using a silicon wafer. The semiconductor wafer 1 has, as illustrated in FIG. 1, scribe lines 3A and 3B formed on a first surface 1a of the silicon wafer (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B.

The semiconductor wafer 1 further has groove parts 20 and 21 formed in the first surface 1a. The groove parts 20 and 21 are formed along the scribe lines 3A and 3B, respectively, and each of them has a depth of about 20 to 60 μm and a width of about 50 to 120 μm. The later-described device region 10 is formed within a rectangular region surrounded by the adjacent groove parts 20, 20 and groove parts 21, 21.

Since the groove parts 20, 21 are formed along the scribe lines 3A and 3B, the groove parts 20, 21 have a constitution as a scribe groove parts of the present invention. Further, the groove parts 20, 21 are formed as through groove parts which reach the second surface 1b from the first surface 1a. A later-described in-groove insulating layer 22 is formed closely the inside of the groove parts 20, 21.

A large number of device regions 10 are formed on the semiconductor wafers 1. In FIG. 1, FIG. 2, one of the plurality of groove parts 21 is set groove part 21A, and adjacent two device regions 10 across the groove part 21A are set device regions 10A, 10B. The groove part 21A has a constitution as an interposed groove part of the present invention. Respective device regions 10A, 10B have a constitution as a first device region, a second device region according to the present invention.

The semiconductor wafer 1 has a silicon substrate 30 composed of the silicon wafer, and the device regions 10 are formed in the upper parts of the silicon substrate 30, as illustrated in FIG. 3, FIG. 4. A plurality of connecting pads 32 are formed on the surface of the device region 10 as illustrated in later-described FIG. 13 and so on, and a part other than the connecting pads 32 is covered with the protecting insulating layer 31.

The protecting insulating layer 31 is formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15, 16 to the connecting pads 32. The connecting pads 32 are connected to the semiconductor device in the device region 10 (see FIG. 9 for details).

Each of the device regions 10 has the memory part formed on the first surface 1a by performing wafer process, and a plurality of wiring electrodes 15 and 16 are formed as illustrated in detail in FIG. 2. Each of the device regions 10 is in contact with both of the groove parts 20, 21. Note that the wafer process means a manufacturing process of forming a semiconductor element and an integrated circuit on the semiconductor wafer such as the silicon wafer or the like.

When the above-described one semiconductor wafer 1 is cut along the scribe lines 3A and 3B, a chip-shape semiconductor piece, surrounded by the in-groove insulating layer 22, mainly comprising the device region 10 and the silicon substrate 30 is obtained. In the semiconductor wafer 1, a part, surrounded by the in-groove insulating layer 22, mainly comprising the device region 10 and the silicon substrate 30 is referred also to as a chip-planned area.

In addition to the memory part, an integrated circuit and a semiconductor element such as a CPU, a sensor, a drive circuit for the sensor may be formed as the semiconductor devices within the device region 10. Further, a memory part and an integrated circuit constituting a controller for controlling the memory part may be formed in the device region 10.

Next, the in-groove insulating layer 22 will be described. The in-groove insulating layer 22 is formed inside of the groove parts 20, 21. In FIG. 2, a surface of the in-groove insulating layer 22 is illustrated in a part with dot.

The in-groove insulating layer 22 is formed using an insulating resin such as an epoxy resin or a polyimide resin, or an insulating material made of silicon silicate glass (SOG) or the like closely filled the inside of the groove parts 20, 21. In this embodiment, a case using a resin for material of the in-groove insulating layer 22 is discussed.

It is especially preferable to form the in-groove insulating layer 22 using a resin having a low thermal expansion coefficient. This ensures that when the semiconductor wafer 1 is cut along the groove parts 20 and 21 by a dicing saw, the cutting can be easily performed.

Besides, since the in-groove insulating layer 22 is formed closely the inside of the groove parts 20, 21, an entire circumference of the respective device regions 10 are surrounded by the in-groove insulating layer 22. The in-groove insulating layer 22 is formed of insulating material. By this in-groove insulating layer 22, adjacent device regions 10 are electrically insulated.

Figure 20:
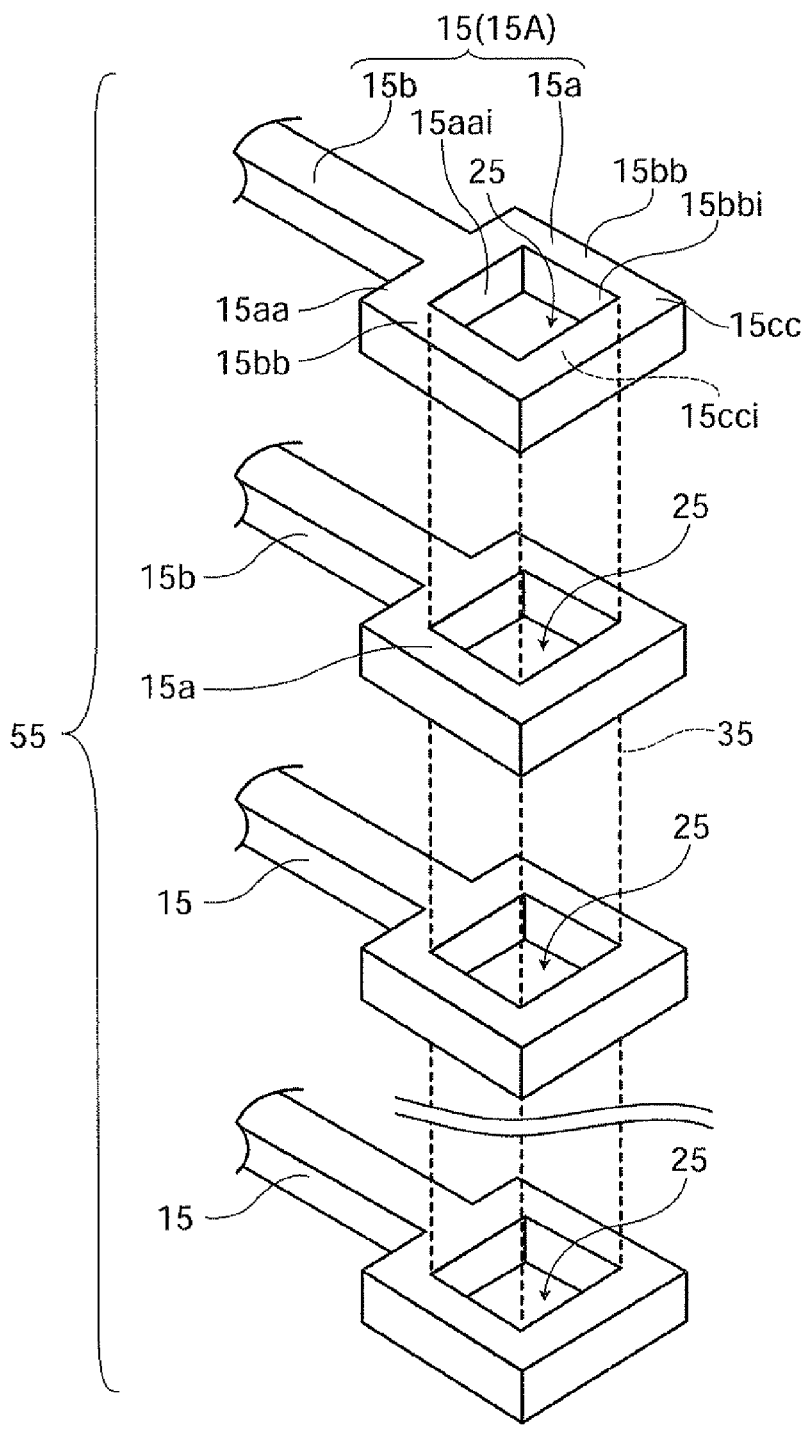
FIG. 20 is a perspective view illustrating a principal part of wiring electrodes stacked with along a laminated direction of the semiconductor wafer among a large number of wiring electrodes formed in the laminated semiconductor wafer in FIG. 1.
Figure 21:
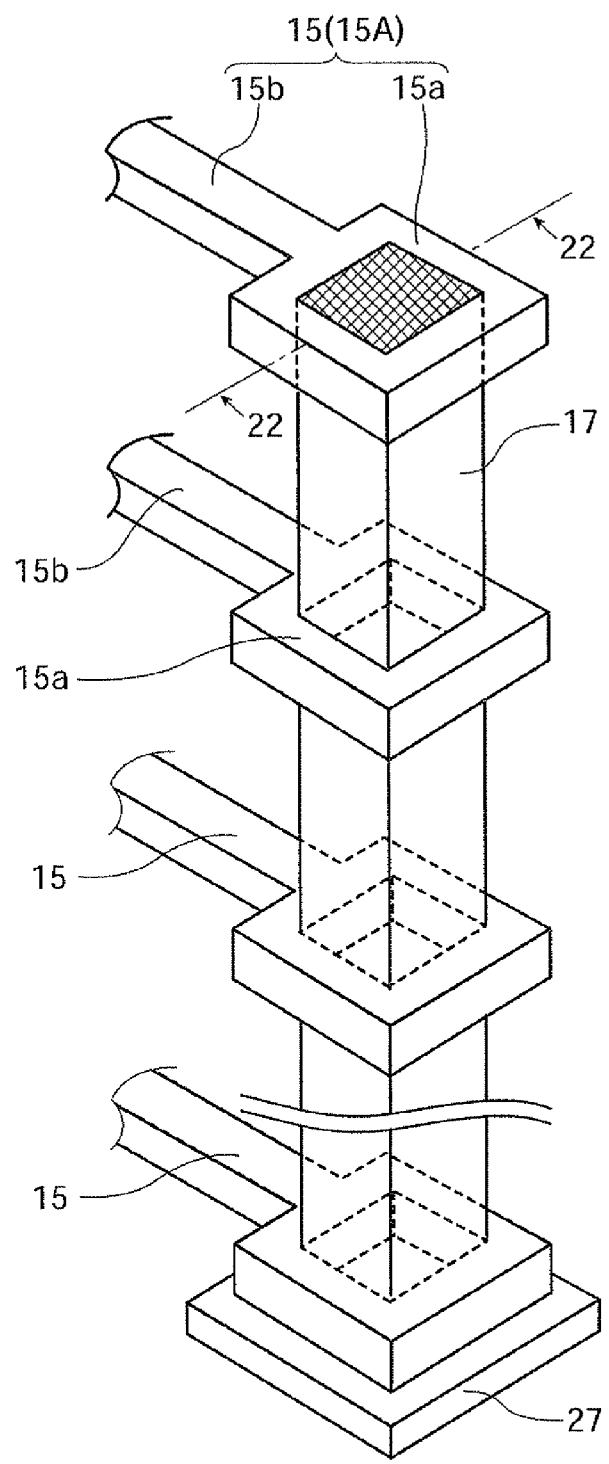
FIG. 21 is a perspective view illustrating a principal part of wiring electrodes, stacked with along a laminated direction of the semiconductor wafer among a large number of wiring electrodes formed in the laminated semiconductor wafer in FIG. 1, and a through electrode.
Figure 22:
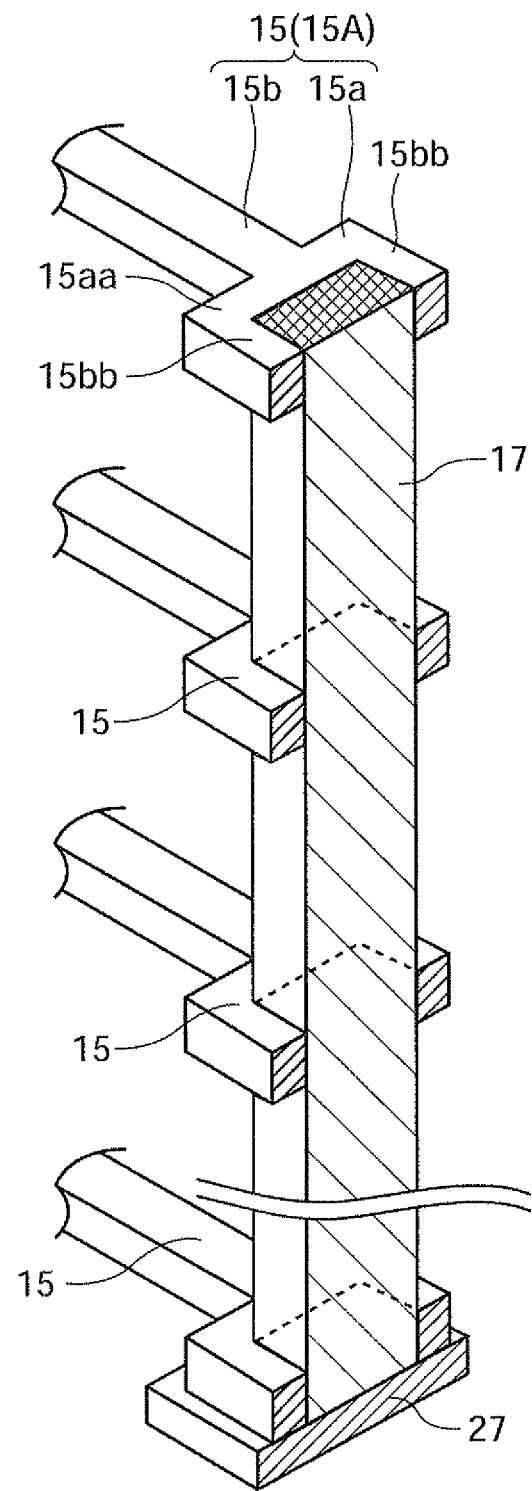
FIG. 22 is a sectional view taken along the line 22-22 in FIG. 21.

Next, wiring electrodes 15, 16 will be described with reference to FIG. 20 to FIG. 22 in addition to FIG. 2 to FIG. 4. Here, FIG. 20 is a perspective view illustrating a principal part of eight wiring electrodes 15 stacked with along a laminated direction of the semiconductor wafer 1 (hereinafter referred to as a "laminated direction") among a large number of wiring electrodes 15 formed in the laminated semiconductor wafer 100. FIG. 21 is a perspective view illustrating the eight wiring electrodes 15 and a through electrode 17. FIG. 22 is a sectional view taken along the line 22-22 in FIG. 21.

A plurality of each of the wiring electrodes 15, 16 are formed along the peripheries of the devices regions 10A, 10B, respectively as illustrated in FIG. 2. Further, parts of the wiring electrodes 15, 16 are formed extending from the devices regions 10A, 10B into the inside of the groove part 21A. Other parts of the electrodes 15 are formed extending to the inside of the groove part 20. The wiring electrodes 15, 16 are formed such that they are not in contact with each other but separated with a predetermined space therebetween. Further, the wiring electrodes 15, 16 are electrically insulated from each other. The wiring electrodes 15, 16 have a constitution as a first wiring electrode and a second wiring electrode, respectively. Note that though four wiring electrodes 15 and four wiring electrodes 16 extending to the inside of the groove part 21A are illustrated in FIG. 2, illustration of other wiring electrodes 15, 16 extending to the inside of the grove part 21A is omitted. FIG. 3 illustrates the section of the laminated semiconductor wafer 100 passing through a pair of wiring electrodes 15A, 16A among the plurality of the wiring electrodes 15, 16 extending to the inside of the groove part 21A.

Both of the wiring electrodes 15, 16 are made of a conductive material such as Cu, Au or the like. The wiring electrodes 15, 16 have electrode pads 15a, 16a and line-shape terminal parts 15b, 16b, respectively. Further, parts of the line-shape terminal parts 15b, 16b extending to the innermost of the groove part 21A are tip parts 15c, 16c, respectively, and the electrode pads 15a, 16a are connected to the respective tip parts 15c, 16c.

The electrode pads 15a, 16a are in rectangular shapes having substantially the same size. Further, the electrode pads 15a, 16a are formed such that the widths thereof along the length direction (the top-to-down direction in FIG. 2) of the groove part 21A are larger than those of the line-shape terminal parts 15b, 16b. The front side surfaces of both of the electrode pads 15a, 16a are flat. The side surfaces of both of the electrode pads 15a, 16a are also flat.

The electrode pads 15a, 16a are opposed to each other with a middle part in the width direction of the groove part 21A (the scribe line 3B) intervening therebetween. For example, the wiring electrodes 15A, 16A are formed such that the distances from corner parts 10Ad, 10Bd of the device regions 10A, 10B are identical to prevent displacement of the wiring electrodes 15A, 16A along the length direction of the groove part 21A.

The electrode pads 15a, 16a have later-described extended terminal parts 15cc, 16cc, respectively. Parts of the extended terminal parts 15cc, 16cc extending to the innermost of the groove part 21A are opposed to each other with the scribe line 3B intervening therebetween. More specifically, regarding to the extended terminal part 15cc, a side surface part on the outer side of the extended terminal part 15 cc illustrated in FIG. 20 is a part extending to the innermost of the groove part 21A, and this part is opposed to the extended terminal part 16cc. The side surface part on the outer side of the extended terminal part 15 cc has a constitution as an endmost part.

Beside, the electrode pad 15a has a hole part 25 formed at the center thereof as illustrated in detail in FIG. 20, The hole part 25 penetrates from the front side to the rear side of the electrode pad 15a along the thickness direction of the semiconductor wafer 1, namely, the laminated direction. The electrode pad 15a has a base part 15aa and two crossing parts 15bb in addition to the extended terminal part 15 cc. The base part 15aa, the two crossing parts 15bb, and the extended terminal part 15 cc surround the periphery of the hole part 25. Therefore, the electrode pad 15a is formed in a rectangular ring shape. Note that the electrode pad 16a also has a hole part 26 similar to the hole part 25 and is also formed in a rectangular ring shape as illustrated in FIG. 3.

The base part 15aa is a part that is connected to the line-shape terminal part 15b and wider than the line-shape terminal part 15b. The two crossing parts 15bb are parts that are connected to the base part 15aa and extend in a direction crossing the base part 15aa from the base part 15aa. The extended terminal part 15 cc is a part that is connected to the two crossing parts 15bb and extends farthest in the electrode pad 15a. Besides, inner side surfaces of the base part 15aa, the two crossing parts 15bb and the extended terminal part 15 cc facing the hole part 25 are an inner surface 15aai, two inner surfaces 15bbi, and an inner surface 15cci, respectively. All parts of these inner surfaces appear in a later-described through hole 35 and are in direct contact with a later-described through electrode 17 as illustrated in FIG. 21, FIG. 22.

The line-shape terminal parts 15b, 16b are line-shape parts leading from the electrode pads 15a, 16a to the connecting pads 32, respectively.

Next, an electromagnetic shielding layer 23 and an electrode insulating layer 39 will be described. As illustrated in FIG. 3 and FIG. 4, the semiconductor wafer 1 has the electromagnetic shielding layer 23 and the electrode insulating layer 39. The electromagnetic shielding layer 23 and the electrode insulating layer 39 are formed on the first surface 1a of the semiconductor wafer 1. The electromagnetic shielding layer 23 is illustrated also in FIG. 2, and parts with hatchings indicate the surface of the electromagnetic shielding layer 23.

The electromagnetic shielding layer 23, which is the electromagnetic shielding layer in the present invention, is formed to shield against electromagnetic waves existing under the external environment and protect the laminated semiconductor wafer 100 from the electromagnetic waves. The electromagnetic shielding layer 23 is formed on the electrode insulating layer 39. The electromagnetic shielding layer 23 has a thickness of about 1 to 5 µm. The illustrated electromagnetic shielding layer 23 and electrode insulating layer 39 are formed in regions other than the groove parts 20, 21. The electromagnetic shielding layer 23 and the electrode insulating layer 39 are not formed in the groove parts 20, 21 and thus are not formed on the surface of the in-groove insulating layer 22.

The electromagnetic shielding layers 23 have sizes corresponding to the respective plurality of device regions 10, and are formed in rectangular shapes according to the device regions 10. Further, the electromagnetic shielding layers 23 individually cover all of the device regions 10. The individual electromagnetic shielding layers 23 are arranged with spaces according to the groove parts 20, 21 intervening therebetween and thus separated from one another. Therefore, the adjacent individual electromagnetic shielding layers 23 are not in contact with but insulated from one another. The structures of the electromagnetic shielding layer 23 which individually cover all of the device regions 10 and are separated from one another are called individual structures. The electromagnetic shielding layers 23 have the individual structures, and are formed in a thin film form, as a whole, covering all of the plurality of device regions 10 from the outside.

The electromagnetic shielding layer 23 is formed using a ferromagnetic body. The ferromagnetic body is a material exhibiting the ferromagnetism. In the ferromagnetic body, magnetic atoms or free electrons of metal bring magnetic moments in parallel lines to thereby form spontaneous magnetization. Further, the ferromagnetic body has adjacent spins lining up in parallel in the same direction and has a large magnetic moment as a whole, and is thus able to have spontaneous magnetization without external magnetic field. The ferromagnetic body has a property of allowing lines of magnetic force to easily pass therethrough as compared to paramagnetic material such as aluminum and copper.

Examples of the ferromagnetic body include a soft magnetic material and a hard magnetic material. It is preferable to form the electromagnetic shielding layer 23 using the soft magnetic material. This is because the soft magnetic material has a higher magnetic permeability than that of the hard magnetic material and thus allows lines of magnetic force to pass therethrough more easily. Examples of the soft magnetic material include metal materials such as permalloy (an alloy of Ni—Fe), permendur (an alloy of Co—Fe) and so on and ceramic materials such as ferrite and so on. It is preferable to form the electromagnetic shielding layer 23 using a metal material. This is because the metal material has a remarkably low resistivity so that electric current flows therethrough much more easily than through the silicon substrate 30. For example, the volume resistivity of permalloy is about $16 \times 10^{-8}$ Ω·m and the volume resistivity of iron (Fe) is about $10 \times 10^{-8}$ Ω·m, whereas the volume resistivity of silicon is about $3.97 \times 10^{3}$ Ω·m and the volume resistivity of epoxy resin is about $1 \times 10^{12}$ Ω·m. Further, the magnetic permeability of permalloy is about 10000, whereas the magnetic permeability of aluminum is about 1.

In this embodiment, the electromagnetic shielding layer 23 is formed using the soft magnetic material made of metal such as permalloy or permendur. For forming the electromagnetic shielding layer 23, for example, PB permalloy (Ni—Fe), PC permalloy (Cu—Mo—Ni—Fe) or the like can be used. Alternatively, the magnetic material such as CoNiFe or the like can also be used.

The electrode insulating layer 39 is formed in regions other than the groove parts 20, 21 and formed on the device regions 10 similarly to the electromagnetic shielding layer 23. The electrode insulating layer 39 can be formed using an insulating resin such as epoxy resin or polyimide resin. The electrode insulating layer 39 enters the space between the adjacent wiring electrodes 15 and directly covers the side surfaces and the upper surface of a part of the wiring electrode 15 existing on the device region 10 (see FIG. 7 for details). In this manner, the electrode insulating layer 39 insulates each wiring electrode 15. The wiring electrode 16 is also insulated by the electrode insulating layer 39 in the similar manner. The upper surface of the electrode insulating layer 39 is formed flat.

The laminated semiconductor wafer 100 has a structure such that the above-described semiconductor wafers 1 are bonded together with an insulating adhesive to be laminated one on the other. In the laminated semiconductor wafer 100, as illustrated in FIG. 3, eight identical semiconductor wafers 1A, 1B, 1C, 1D . . . and 1H are laminated. Incidentally, illustration of the semiconductor wafers 1E to 1G is omitted in FIG. 3.

Further, in the laminated semiconductor wafer 100, all of the eight semiconductor wafers 1A to 1H has the electromagnetic shielding layer 23 and electrode insulating layer 39 respectively. The laminated semiconductor wafer 100 has a multilayer structure in which a plurality of electromagnetic shielding layers 23 are laminated in the laminated direction. In each of the eight semiconductor wafers 1A to 1H, the electromagnetic shielding layer 23 is formed on the first surface 1a. Among the eight semiconductor wafers 1A to 1H, the semiconductor wafer 1A is laminated on the top side, and therefore the semiconductor wafer 1A has the configuration as the uppermost substrate in the present invention. Besides, the semiconductor wafer 1H is laminated on the bottom, and therefore the semiconductor wafer 1H has the configuration as the lowermost substrate in the present invention.

The laminated semiconductor wafer 100 has laminated chip regions 40A, 4013. The laminated chip regions 40A, 40B include respective eight device regions 10A, 10B laminated in the laminated direction in the semiconductor wafers 1A to 1H. The laminated chip regions 40A, 40B are regions that are insulated from each other by the in-groove insulating layers 22 and later-described adhesive layers 33 and will be later-described discrete laminated chip packages 200, respectively. When the laminated semiconductor wafer 100 is cut along the groove parts 20, 21, the laminated chip regions 40A, 40B are separated to form a plurality of laminated chip packages 200 (described later in detail).

Further, in the laminated semiconductor wafer 100, through holes 35, 36 are formed as illustrated in detail in FIG. 3. The through holes 35, 36 are formed in the groove parts 20, 21. The through holes 35, 36 are formed for the respective electrode pads 15a, 16a. Therefore, a plurality of each of through holes 35, 36 are formed in the laminated semiconductor wafer 100. One through electrode 17, 18 is formed inside each through hole 35, 36, respectively. Further, electrode pads 27, 28 are formed on the semiconductor wafer 1H side of the laminated semiconductor wafer 100. The electrode pads 27, 28 are connected to the through electrodes 17, 18, respectively.

Each of the semiconductor wafers 1A to 1H has the identical device regions 10A, 10B, in-groove insulating layer 22, wiring electrodes 15, 16 and so on. When the laminated semiconductor wafer 100 is seen in the laminated direction, eight electrode pads 15a, 16a are arranged along the respective through holes 35, 36. The illustration of the relation between the through hole 35 and the electrode pads 15a is, for example, as illustrated in FIG. 20.

Further, the wiring electrodes 15, 16 of the respective eight electrode pads 15a, 16a along the through holes 35, 36 have common positions in the semiconductor wafers 1A to 1H. For example, all of the wiring electrodes 15A in the respective semiconductor wafers 1A, 1B, 1C, 1D . . . and 1H are formed in the device regions 10A and formed at positions having the identical positional relation with the corner parts 10Ad. These electrode pads 15a are arranged in a straight line along the through hole 35.

Here, it is assumed that the wiring electrodes 15, 16 having common positions among the wiring electrodes 15, 16 in the respective semiconductor wafers 1A to 1H are common wiring electrodes. In the laminated semiconductor wafer 100, the common wiring electrodes are arranged in a straight line along the laminated direction. For example, the eight wiring electrodes 15A in total in the respective semiconductor wafers 1A, 1B, 1C, 1D . . . and 1H are the common wiring electrodes. The wiring electrodes 15A being identical wiring electrodes 15 constitute a laminated electrode group 55 illustrated in FIG. 20. The laminated electrode group 55 is composed of a plurality of wiring electrodes 15 and wiring electrodes 16 laminated in the laminated direction.

The through hole 35 is formed in a straight line connecting, along the laminated direction, all of the hole parts 25 formed in the respective electrode pads 15a of the eight wiring electrodes 15 constituting the laminated electrode group 55. Further, the through hole 35 penetrates the groove parts 21A, the in-groove insulating layers 22, and the adhesive layers 33 of the semiconductor wafers 1A to 1H as illustrated in FIG. 3. This is resulted from that the electrode pads 15a extend to the insides of the groove parts 21A, the in-groove insulating layers 22 are formed inside the groove parts 21A, and the adhesive layers 33 are formed between the semiconductor wafers 1A to 1H.

The through hole 36 is formed in a straight line connecting, along the laminated direction, all of the hole parts 26 formed in the respective electrode pads 16a of the eight wiring electrodes 16 constituting the laminated electrode group. The through hole 36 also penetrates the groove parts 21A, the in-groove insulating layers 22, and the adhesive layers 33 like the through hole 35.

The whole inner surfaces, facing the hole parts 25, 26, of the eight electrode pads 15a, 16a constituting the respective laminated electrode groups 55 appear in the through holes 35, 36. In other words, regarding the through hole 35, all of the whole parts of the inner surface 15aai, two inner surfaces 15bbi, and inner surface 15cci of the electrode pads 15a appear in the through hole 35 as illustrated in FIG. 20. Further, the through electrodes 17, 18 are formed inside the above-described through holes 35, 36. Therefore, the whole inner surfaces, facing the hole parts 25, of all of the eight electrode pads 15a constituting the laminated electrode group 55 are individually in direct contact with the peripheral surface of the through electrode 17 as illustrated in FIG. 21, FIG. 22. Note that though the through hole 36, the electrode pads 16a and the through electrode 18 are not illustrated in FIG. 21, FIG. 22, they are identical to the through hole 35, the electrode pads 15a and the through electrode 17.

The through electrodes 17, 18 penetrate all of the semiconductor wafers 1A to 1H passing through the inside of the through holes 35, 36, respectively. Further, the through electrode 17, 18 is formed in a straight one-bar shape. The through electrode 17, 18 is a one conductor without joint. Rectangular parts with mesh in FIG. 2 indicate the front surfaces of the through electrodes 17, 18. Both of the through electrodes 17, 18 are made of a metal member such as Cu, Au or the like. The through electrodes 17, 18 are in direct contact with the eight electrode pads 15a, 16a appearing in the through holes 35, 36, respectively. Since the whole inner surfaces of the respective eight electrode pads 15a, 16a appear in the through holes 35, 36 as describe above, the through electrodes 17, 18 are in contact with the whole inner surfaces of the eight electrode pads 15a, 16a, respectively.

Figure 9:
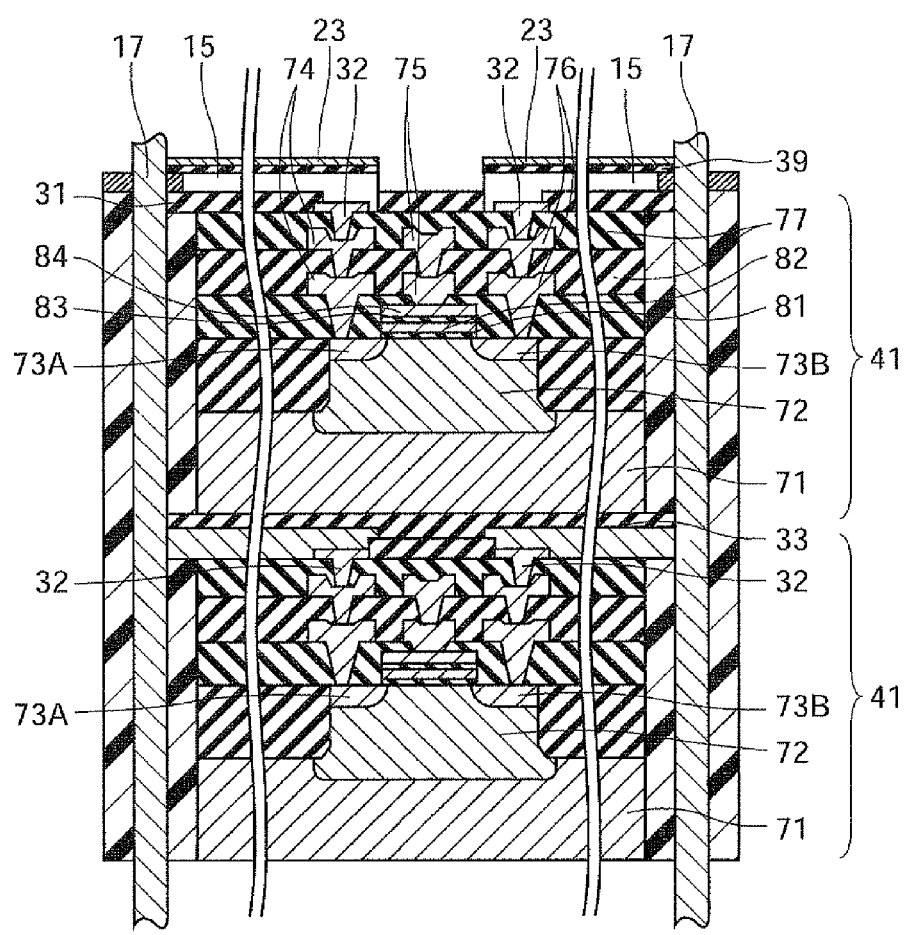
FIG. 9 is a sectional view mainly illustrating memory cells of a laminated semiconductor wafer in FIG. 1.

Meanwhile in the memory part of the device region 10, a number of memory cells 41 as the semiconductor devices are formed. The memory cell 41 has a structure as illustrated in FIG. 9. FIG. 9 is a sectional view mainly illustrating memory cells 41 of a laminated semiconductor wafer 100.

To the memory cell 41, the wiring electrodes 15 and 16 are connected via the connecting pads 32. The memory cell 41 is formed on the surface of an N-type substrate 71 constituting the semiconductor wafer 1. In FIG. 9, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

(Operation and Effect of Laminated Semiconductor Wafer 100)

As described above, in the laminated semiconductor wafer 100, all of the eight semiconductor wafers 1A to 1H has the electromagnetic shielding layer 23 respectively. The electromagnetic shielding layer 23 is formed using the soft magnetic material and therefore has an extremely high magnetic permeability and allows lines of magnetic force to pass therethrough more easily incommensurable with other material. Therefore, most of the lines of magnetic force existing near the laminated semiconductor wafer 100 pass through the electromagnetic shielding layers 23. Accordingly, the electromagnetic shielding layers 23 have an effect of detouring the lines of magnetic force to prevent the lines of magnetic force from passing through a part to be protected. Further, the electromagnetic shielding layer 23 has a remarkably low resistivity so that electric current much more easily flows the electromagnetic shielding layer 23 than through the silicon substrate 30 or the in-groove insulating layer 22.

Figure 40:
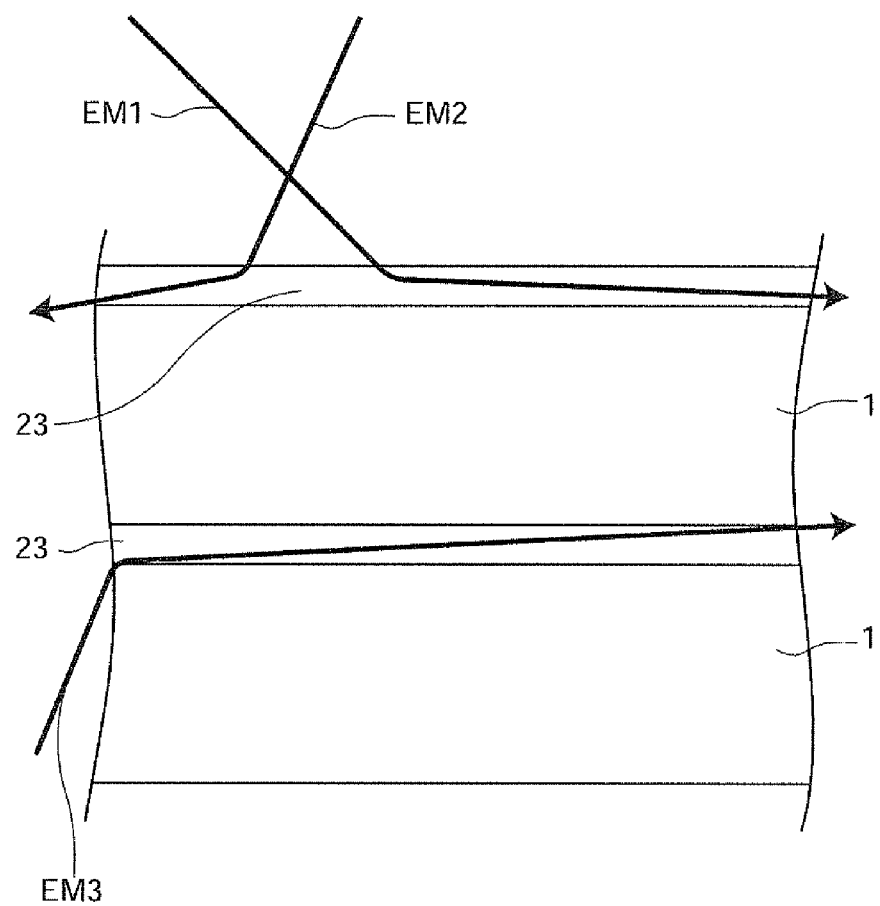
FIG. 40 is a view schematically illustrating the passages of the electromagnetic waves passing through electromagnetic shielding layers.

Accordingly, in the laminated semiconductor wafer 100, for example, when electromagnetic waves EM1, EM2, EM3 exist under the external environment as illustrated in FIG. 40, the respective magnetic field components will pass through the electromagnetic shielding layers 23. Further, the electromagnetic shielding layers 23 exist on the routes along which the electromagnetic waves EM1, EM2, EM3 propagate, and the electromagnetic shielding layers 23 are formed of a metal through which electric current easily flows. Therefore, the electric currents according to the electric field energies of the electromagnetic waves EM1, EM2, EM3 flow through the electromagnetic shielding layers 23. Then, the electric field components of the electromagnetic waves EM1, EM2, EM3 are cancelled, whereby the electric field components of the electromagnetic waves EM1, EM2, EM3 attenuate.

The electromagnetic shielding layers 23 detour the electromagnetic waves EM1, EM2, EM3 and attenuate them as described above, thereby making it possible to prevent the electromagnetic waves EM1, EM2, EM3 from affecting the device regions 10.

Further, the conductive material such as copper or aluminum has a remarkably low resistivity and allows electric current to easily flow therethrough, but exhibits no or little magnetism and has a magnetic permeability much lower than that of the soft magnetic material because the conductive material is a paramagnetic material. For this reason, the layer for shielding against the electromagnetic waves that is formed of the conductive material such as copper, aluminum or the like cannot detour the magnetic fields, unlike the electromagnetic shielding layer 23. Since the electromagnetic waves proceed through a space by changes in the electric field and the magnetic field being propagated like a chain reaction, it is preferable to shield against both of the electric field and the magnetic field in order to enhance the effect of shielding against the electromagnetic waves. In this regard, the laminated semiconductor wafer 100 has the electromagnetic shielding layers 23 and thus is able to enhance the effect of shielding against the electromagnetic waves and achieve the special shielding effect that cannot be achieved by the shielding layer made of the conductive material such as copper or aluminum.

Meanwhile, the laminated semiconductor wafer 100 is manufactured by sequentially laminating the eight semiconductor wafers 1A to 1H as will be described later in detail. By cutting the laminated semiconductor wafer 100 along the groove parts 20, 21, later-described laminated chip packages 200 are manufactured.

In the laminated semiconductor wafer 100, each of the semiconductor wafers 1A to 1H has the electromagnetic shielding layer 23 and has the effect of shielding against the electromagnetic waves. As well as the laminated semiconductor wafer 100 before the laminated chip packages 200 are cut out of it, the individual semiconductor wafers 1A to 1H that are the materials of the laminated semiconductor wafer 100 have the respective electromagnetic shielding layers 23. Accordingly, the effect of shielding against the electromagnetic waves can be achieved for a long time from the wafer stage corresponding to a comparatively preceding stage in the manufacturing process of the laminated chip package 200 to the post-completion stage of the laminated semiconductor wafer 100. Further, each of the eight semiconductor wafers 1A to 1H has the electromagnetic shielding layer 23 and thereby more surely shield against the electromagnetic waves. Accordingly, the laminated semiconductor wafer 100 has an effect of highly shielding against the electromagnetic waves existing under the external environment and is configured to be capable of sufficiently avoiding the influence of the electromagnetic waves.

Further, in the laminated semiconductor wafer 100, the electromagnetic shielding layer 23 is formed in regions other than the groove parts 20, 21 but not formed in the groove parts 20, 21 in the individual semiconductor wafer 1A to 1H. The through holes 35, 36 are formed in the groove parts 20, 21, and the through electrodes 17, 18 are formed in the through holes 35, 36.

In the laminated semiconductor wafer 100, the electromagnetic shielding layer 23 is formed at the stage of the wafer structure (the stage of the semiconductor wafer 1A to 1H), and the regions of the electromagnetic shielding layer 23 are clearly distinguished from the regions of the through electrodes 17, 18. The places where the electromagnetic shielding layer 23 is formed and the places where the through electrodes 17, 18 are formed are definitely isolated. Therefore, in the laminated semiconductor wafer 100, the electromagnetic shielding layer 23 is never connected to the through electrodes 17, 18. The electromagnetic shielding layer 23 is insulated to be surely electrically separated from the through electrodes 17, 18. Therefore, in the laminated semiconductor 100, passing electric current through, for example, one of the through electrodes 17 never causes a situation that the through electrode 17 is electrically connected to another through electrode 17 via the electromagnetic shielding layer 23. The influence when the through electrodes 17 are connected to each other is never exerted on the semiconductor device in the device region 10. The situation that the through electrodes 17 or the through electrodes 18 are electrically connected to each other via the electromagnetic shielding layer 23 is surely avoided.

Further, the electromagnetic shielding layer 23 can be formed for each of the semiconductor wafers 1A to 1H. Though many semiconductor chips are included only in the semiconductor wafer 1A, the electromagnetic shielding layer 23 can be formed not only for the individual semiconductor chips but for all of the semiconductor chips in block. Thus, less burden is required for forming the electromagnetic shielding layer 23, so that the electromagnetic shielding layer 23 can be formed easily and in a short time.

Since all of the eight semiconductor wafers 1A to 1H each have the electromagnetic shielding layer 23, the shielding effect is able to be obtained in each of the semiconductor wafers 1A to 1H, resulting in a higher shielding effect. For example, when there are electromagnetic waves proceeding toward the side surface of the laminated semiconductor wafer 100, the electromagnetic shielding layers 23 that are the passage for the electromagnetic waves are provided at eight locations. This easily makes the magnetic field components of the electromagnetic waves to detour and attenuate the electric field components. Accordingly, in the laminated semiconductor wafer 100, the shielding effect is able to be enhanced.

Further, the electromagnetic shielding layer 23 is formed covering all of the plurality of device regions 10 from the outside and thus is able to effectively protect all of the plurality of device regions 10 from the electromagnetic waves. Since the respective electromagnetic shielding layers 23 are evenly arranged along the laminated direction, uniform shielding effect can be expected in each of the semiconductor wafers 1A to 1H. The individual electromagnetic shielding layers 23 have the sizes according to the device regions 10 and are not formed in the groove parts 20, 21, so that the electromagnetic shielding layer 23 is formed at parts where the effect of electromagnetic shielding layer are effectively exhibited. This configuration makes it possible to cut the waste of the soft magnetic material for forming the electromagnetic shielding layer 23 while the electromagnetic shielding layer 23 more effectively exhibits the shielding effect, and reduce the manufacturing cost of the laminated semiconductor wafer 100 and the laminated chip package 200. Since the adjacent individual electromagnetic shielding layers 23 are insulated from one another without contact, the individual electromagnetic shielding layers 23 individually shield all of the plurality of device regions 10 while keeping the respective insulating states.

In the laminated semiconductor wafer 100, the lowermost semiconductor wafer 1H also has the electromagnetic shielding layer 23. Therefore, if there are electromagnetic waves entering from the rear surface side, the electromagnetic waves reach the electromagnetic shielding layer 23 of the semiconductor wafer 1H before entering deep in the laminated semiconductor wafer 100, and thus the electromagnetic waves do not affect the semiconductor wafers 1A to 1G. Accordingly, it is possible to shield against the electromagnetic waves entering from the rear surface side in the laminated semiconductor wafer 100, so that the shielding effect is enhanced.

In the laminated semiconductor wafer 100, the eight semiconductor wafers 1A to 1H each having the electromagnetic shielding layer 23 are laminated. Therefore, for example, regarding the semiconductor wafer 1A, the electromagnetic shielding layer 23 of the semiconductor wafer 1A is disposed on the upper side of the device region 10 and the electromagnetic shielding layer 23 of the semiconductor wafer 1B is disposed on the lower side of the device region 10.

In other words, the device region 10 of each of the semiconductor wafers 1A to 1G is sandwiched between the two upper and lower electromagnetic shielding layers 23. Accordingly, the effect of shielding against the electromagnetic waves is more effective in the laminated semiconductor wafer 100. Further, the electromagnetic shielding layer 23 is formed to cover the wiring electrode 15 and thus extremely reduces the possibility that the noise caused from the electromagnetic waves mixes into the signal passing through the wiring electrode 15.

In the laminated semiconductor wafer 100, the wiring electrodes 15, 16 are formed in the two device regions 10A, 10B adjacent to each other with the groove part 21A intervening therebetween. The wiring electrodes 15, 16 extend from the device regions 10A, 10B to the inside of the groove part 21A, and are arranged such that they are not in contact with each other but separated with a predetermined space therebetween. Further, the whole peripheries of the device regions 10A, 10B are surrounded by the in-groove insulating layer 22 and thus insulated from each other. Further, the laminated chip regions 40A, 40B are formed of the eight device regions 10A, 10B laminated in the laminated direction. In the laminated chip regions 40A, 40B, the eight device regions 10 included therein respectively are connected by the wiring electrodes 15, 16 and the through electrodes 17, 18.

Since the laminated semiconductor wafer 100 has the above-described structure, a package inspection is able to be performed for the individual laminated chip package in a state of the wafer structure in which the plurality of semiconductor wafers 1 are laminated, without cutting and physically separating the laminated chip regions 40A, 40B.

In other words, the package inspection only for the laminated chip region 40A is able to be performed by bringing a probe into contact with the electrode pads 15. Further, the package inspection only for the laminated chip region 40B is able to be performed by bringing a probe into contact with the electrode pads 16. The laminate chip regions 40A, 408 are regions that will be discrete laminated chip packages 200 respectively, and the package inspection is able to be performed for each of the laminate chip regions 40A, 40B, even in the laminated semiconductor wafer 100. Therefore, in the laminated semiconductor wafer 100, the package inspection for the whole individual laminated chip package is able to be performed in a state of the wafer structure.

Accordingly, the laminated semiconductor wafer 100 has a structure in which the package inspection is easily performed for the whole individual laminated chip packages. The laminated semiconductor wafer 100 is able to be subjected to the package inspection even at a stage of the wafer test before the laminated chip packages are completed. Therefore, the use of the laminated semiconductor wafer 100 enables enhancement of the efficiency of the whole inspection process required for manufacture of the laminated chip packages, resulting in a reduced manufacturing time. Consequently, the laminated semiconductor wafer 100 has a structure with which the number of laminated chip packages manufacturable per unit time can be increased by reducing the manufacturing time.

Further, the laminated chip regions 40A, 40B include sets of wirings for constituting the laminated chip packages 200, such as the wiring electrodes 15, 16, the through electrodes 17, 18 and so on. Therefore, the package inspection reflecting the contact resistance which can occur at connection parts between the wirings can be performed for the laminated semiconductor wafer 100.

Furthermore, the through holes 35, 36 are formed in the laminated semiconductor wafer 100. The through hole 35 is formed in a straight line connecting all of the hole parts 25 of the wiring electrodes 15 constituting the laminated electrode group 55 and is thus very easy to form. The through hole 36 is also easy to form. Since the through hole 35, 36 is formed in a straight line, the through electrode 17, 18 is a conductor in a one-bar shape and is thus easy to form.

Further, the through electrode 17, 18 is a one conductor in a bar shape without joint passing through the respective through hole 35, 36, and thus has a structure in which the contact resistance caused by the contact between conductors for connecting the semiconductor wafers does not occur.

All of the wiring electrodes 15 constituting the laminated electrode group 55 (the inner surfaces of the electrode pads 15a in detail) appear in the through hole 35. Therefore, by filling the inside of the whole through hole 35 with metal such as Cu, Au or the like, the through electrode 17 can be obtained in the form connected to all of the wiring electrodes 15 constituting the laminated electrode group 55. This also applies to the through hole 36 and the through electrode 18. Accordingly, in manufacturing the laminated semiconductor wafer 100, the through electrodes 17, 18 can be easily connected to all of the eight wiring electrodes 15, 16 constituting the laminated electrode groups 55.

The through electrode 17, 18 is completed only by forming one conductor passing through the through hole, 35, 36 even though the eight semiconductor wafers 1A to 1H are laminated. Therefore, it is unnecessary to repeat the process of forming the through electrode for each individual semiconductor wafer. Therefore, in the laminated semiconductor wafer 100, the time required for forming the through electrodes can be reduced. Accordingly, the laminated semiconductor wafer 100 has a structure with which the number of laminated chip packages manufacturable per unit time can be further increased by further reducing the manufacturing time.

Further, the through electrode 17, 18 is a one conductor in a bar shape without joint and thus has a contact resistance lower than the contact resistance in the case where the device regions 10 are connected by the through electrodes individually formed in the semiconductor wafers 100.

Meanwhile, the through holes 35, 36 penetrate the hole parts 25, 26 of the respective electrode pads 15a, 16a, the in-groove insulating layers 22, and the adhesive layers 33. Parts of the adhesive layers 33 enter the hole parts 25, 26. Therefore, the through holes 35, 36 can be completed by forming holes penetrating only the resin layers (described later for detail). It is unnecessary to form holes penetrating the silicon substrates 30 in order to form the through holes 35, 36. The resin layers are softer than the silicon substrates. Since the through holes 35, 36 are completed only by forming the holes penetrating the resin layers, the formation of the through holes 35, 36 are easily performed by laser beam machining or the like. It takes less labor to form the through holes 35, 36, and it is also possible to reduce the time required for forming the through holes 35, 36. Therefore, the laminated semiconductor wafer 100 has a structure with which the manufacturing time can be further reduced and the number of the laminated chip packages manufacturable per unit time can be further increased.

Besides, the inner surfaces of the electrode pad 15a facing the hole part 25 are four inner surfaces such as the inner surface 15aai, the two inner surfaces 15bbi, and the inner surface 15cci, and the peripheral surface of the through electrode 17 is in direct contact with whole part of all of them. Therefore, a large contact area between the electrode pad 15a and the through electrode 17 is secured. Further, since the electrode pad 15a is in contact with the peripheral surface, in all directions, of the through electrode 17, the current flows more smoothly than the case where the electrode pad 15a is in contact with the peripheral surface in a part of directions.

Furthermore, since the through hole 35 is formed along the hole part 25 of the electrode pad 15a, a hole part on an extension line when the hole part 25 is extended along the laminated direction can be set as the through hole 35. Since such a through hole 35 is easy to form, the time required for forming the through hole 35 can be further reduced.

Further, the electrode pads 15a, 16a of the wiring electrodes 15, 16 are opposed to each other in the laminated semiconductor wafer 100. Therefore, the wiring pattern for forming the wiring electrodes 15, 16 can be relatively easily formed. Further, the position adjustment when the probe is brought into contact with the electrode pads 15, 16 is also easily performed, so that the laminated semiconductor wafer 100 has a structure in which the package inspection is accordingly easily performed.

The through hole 35 (also the through hole 36) penetrates the eight wiring electrodes 15 constituting the laminated electrode group 55. The laminated electrode group 55 is composed of the common wiring electrodes. Therefore, the through hole 35 has a structure capable of connecting the eight electrode pads 15a in the semiconductor wafers 1A to 1H in a shortest distance. Therefore, it take less labor to form the through hole 35 and it is also possible to reduce the time required for forming the through hole 35. Further, the through electrode 17 is in a straight one-bar shape and thus connects the eight electrode pads 15a in a required minimum distance. Accordingly, the metal such as Cu, Au or the like required for forming of the through electrode 17 can also be saved.

Meanwhile, the above-described laminated electrode group 55 is composed of the wiring electrodes 15A being identical common wiring electrodes in all of the eight semiconductor wafers 1A to 1H. The laminated electrode group according to the present invention may be composed of a plurality of kinds of common wiring electrodes. For example, the common wiring electrodes may be different between the four semiconductor wafers 1A to 1D and the four semiconductor wafers 1E to 1H. For example, the wiring electrodes 15A may be used as the common wiring electrodes in the semiconductor wafers 1A to 1D and the wiring electrodes 15 adjacent to the wiring electrodes 15A may be used as the common wiring electrodes in the semiconductor wafers 1E to 1H so that the eight wiring electrodes 15 constitute the laminated electrode group. This constitution requires another electrode between the semiconductor wafer 1D and the semiconductor wafer 1E. Even in this constitution, it is possible to connect all of the eight semiconductor wafers 1A to 1H.

Further, in the above-described semiconductor wafer 100, the eight semiconductor wafers 1A to 1H are laminated. It is also adoptable to use the semiconductor wafer 100 as a unit laminated substrate and laminate a plurality of the unit laminated substrates to form a laminated semiconductor wafer. For example, in the laminated semiconductor wafer in which two unit laminated substrates are laminated, 16 semiconductor wafers are laminated. In three unit laminated substrates, 24 semiconductor wafers are laminated. Accordingly, the number of the semiconductor wafers which are laminated within the laminated semiconductor wafer is a multiple of 8.

Furthermore, it is also adoptable to use the laminated semiconductor wafer in which the four semiconductor wafers 1A to 1D are laminated as a unit laminated substrate, and laminate a plurality of the unit laminated substrates to form a laminated semiconductor wafer. In this case, the number of the semiconductor wafers which are laminated within the laminated semiconductor wafer is a multiple of 4.

When the laminated semiconductor wafer 100 is formed in the above-described unit structure, the number of units according to the capacity of a memory required in the laminated chip package can be easily found. Further, the capacity of the memory in the laminated chip package can be easily varied only by varying the lamination number of unit laminated substrates. For example, when one unit is formed to provide 64 GB, memories of 128 GB and 256 GB can be realized only by varying the lamination number of units. Note that since all multiples of 8 are multiples of 4, it is preferable to laminate the four semiconductor wafers 1A to 1D to form the unit laminated substrate.

(Method of Manufacturing Laminated Semiconductor Wafer 100)

Figure 10:
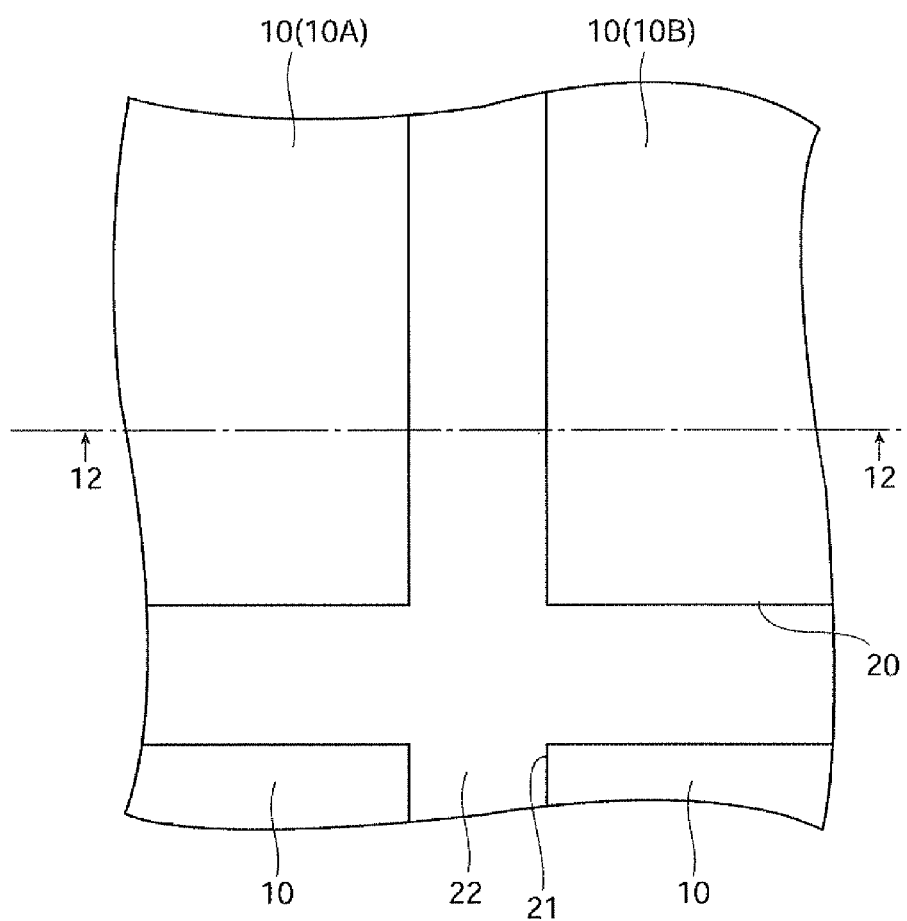
FIG. 10 is a plan view similar to FIG. 2, illustrating the partially manufactured laminated semiconductor wafer.
Figure 11:
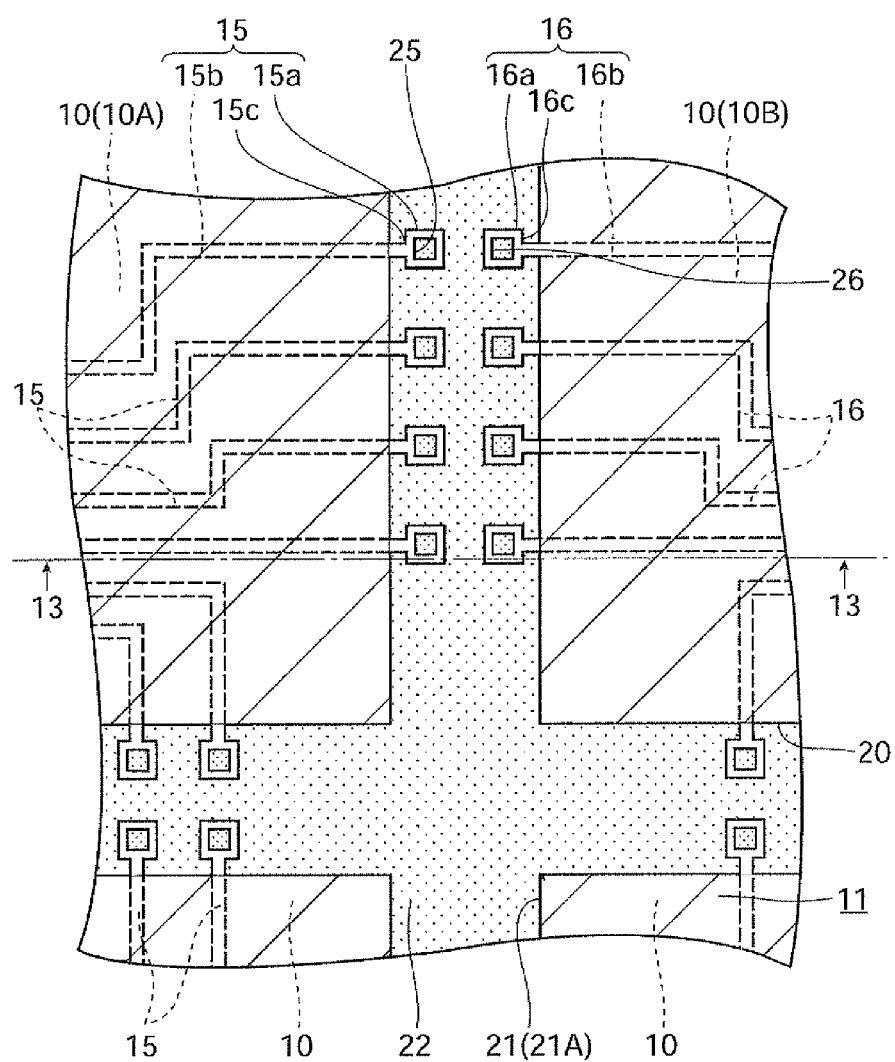
FIG. 11 is a plan view similar to FIG. 2, illustrating the laminated semiconductor wafer subsequent to that in FIG. 10.
Figure 12:
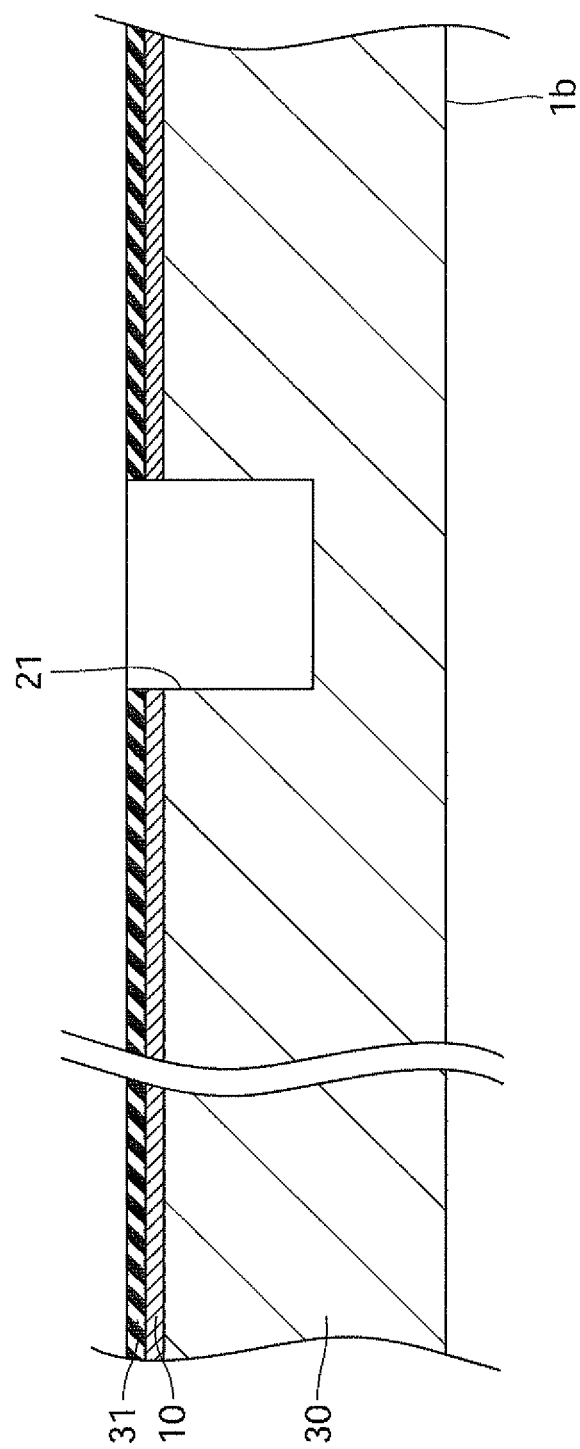
FIG. 12 is a sectional view taken along the line 12-12 in FIG. 10.
Figure 13:
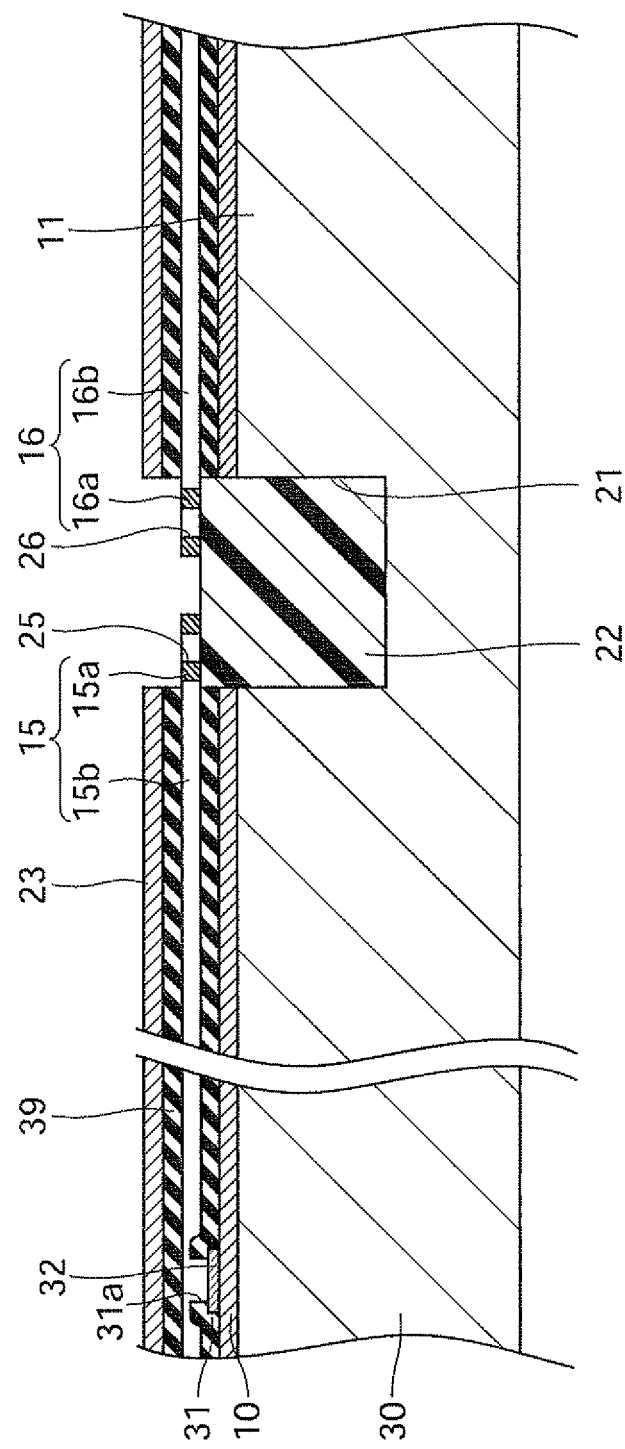
FIG. 13 is a sectional view taken along the line 13-13 in FIG. 11.
Figure 14:
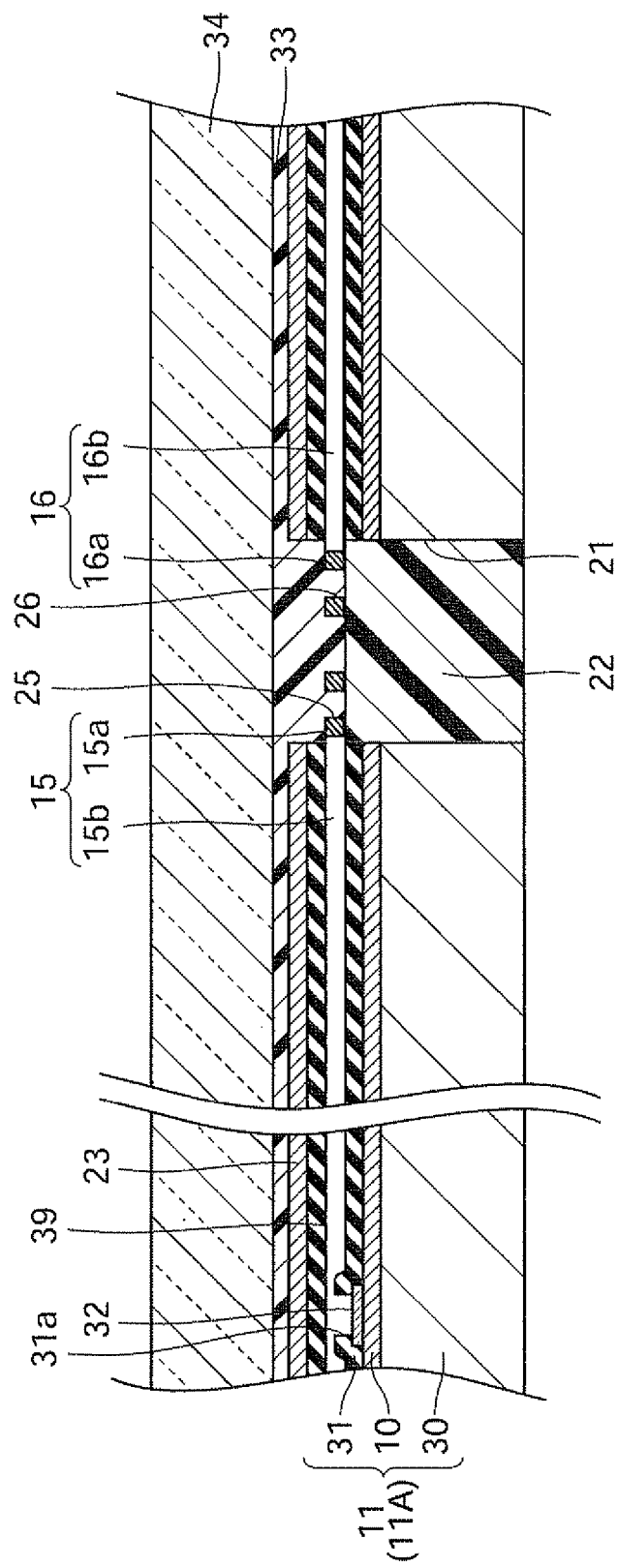
FIG. 14 is a sectional view similar to FIG. 12, illustrating the laminated semiconductor wafer subsequent to that in FIG. 13.

Subsequently, the method of manufacturing the laminated semiconductor wafer 100 having the above-described structure will be described with reference to FIG. 10 to FIG. 19 in addition to FIG. 1 to FIG. 4, FIG. 20 to FIG. 22. Here, FIG. 10 is a plan view similar to FIG. 2, illustrating the partially manufactured laminated semiconductor wafer. FIG. 11 is a plan view similar to FIG. 2, illustrating the laminated semiconductor wafer subsequent to that in FIG. 10. FIG. 12 is a sectional view taken along the line 12-12 in FIG. 10. FIG. 13 is a sectional view taken along the line 13-13 in FIG. 11. Further, FIG. 14 is a sectional view similar to FIG. 12, illustrating the laminated semiconductor wafer subsequent to that in FIG. 13. FIG. 15 to FIG. 19 are sectional views similar to FIG. 12, respectively illustrating the laminated semiconductor wafers subsequent to that in the order.

For manufacturing the laminated semiconductor wafer 100, to begin with, a substrate with groove forming process is performed. In the substrate with groove forming process, a wafer (unprocessed wafer) is prepared which has memory parts and a plurality of connecting pads 32 formed in the device regions 10 by performing wafer process. Then, the protecting insulating layer 31 is formed on the first surface 1a for the unprocessed wafer, as illustrated in FIG. 12.

Then, the plurality of groove parts 20 and 21 are formed along the scribe lines 3A and 3B. In FIG. 10, the groove part 20 and 21 are illustrated one by one, but the plurality of groove parts 20 and 21 are formed respectively. The groove parts 20 and 21 are able to be formed by the dicing saw, and may be formed by etching such as the reactive ion etching or the like. By forming of the plurality of groove parts 20 and 21 respectively, a substrate with groove 11 having a plurality of device regions 10 are formed. In the substrate with groove forming process, eight substrates with groove 11 are formed.

Subsequently, insulating layer forming process is performed. In this insulating layer forming process, an insulating resin, for example, such as an epoxy resin, a polyimide resin or the like is applied to the entire first surface 1a of the substrate with groove 11. Then, the applied resin spreads over the entire surface of the substrate with groove 11 and further flows into the groove parts 20 and 21. Subsequently, the surface of the substrate with groove 11 is polished to be planarized. Thus, the in-groove insulating layer 22 is formed inside the groove parts 20, 21, as illustrated in FIG. 11, 13. A part flowed into the inside of the groove parts 20, 21 in the applied resin become to the in-groove insulating layer 22.

Next, as illustrated in FIG. 13, the contact holes 31a are formed in the insulating layer 31 to expose the connecting pads 32.

After that, electrode forming process is performed. In the electrode forming process, a plurality of wiring electrodes 15 or a plurality of wiring electrodes 16 are formed in the respective device regions 10, regarding the respective substrate with groove 11. In this case, the wiring electrode 15 and the wiring electrode 16 are formed to extend from the device regions 10A, 10B adjacent to each other with the groove part 21 (the interposed groove part 21A) intervening therebetween to the inside of the groove part 21 and not to be in contact with each other but separate from each other. Further, the wiring electrode 15 and the wiring electrode 16 are formed in shapes having the electrode pads 15a, 16a formed with the hole parts 25, 26, respectively. Further, the electrode pads 15a, 16a are opposed to each other with the middle part in the width direction of the groove part 21A intervening therebetween. Since the hole parts 25, 26 penetrate the electrode pads 15a, 16a, the surface of the in-groove insulating layer 22 is exposed inside the hole parts 25, 26 as illustrated in FIG. 11 (dots are illustrated inside the hole parts 25, 26). The wiring electrodes 15 and 16 are able to be formed, for example, in the procedure as follows.

First, a not-shown seed layer for plating is formed on the in-groove insulating layer 22 and the protecting insulating layer 31. Next, a frame (not shown) including groove parts is formed on the seed layer. The frame is formed, for example, by patterning a photoresist by the photolithography. Further, a plating layer which will be parts of the wiring electrodes 15 and 16 is formed within the groove parts of the formed frame and on the seed layer. Subsequently, the frame is removed, and a part of the seed layer other than the part which exists under the plating layer is removed by etching. By the above processing, the wiring electrodes 15 and 16 are able to be formed by the plating layer and the seed layer under the plating layer.

After the wiring electrodes 15, 16 are formed by executing the electrode forming process, an electromagnetic shielding layer forming process is executed. In the electromagnetic shielding layer forming process, regarding all of the eight substrates with groove 11, the electrode insulating layer 39 and the electromagnetic shielding layer 23 are formed respectively. The electrode insulating layer 39 is formed on the device regions 10 that are regions other than the groove part 20, 21 as follows.

First, a resist pattern in a lattice form covering the surface of the groove parts 20, 21 is formed using a photoresist. Then, an insulating resin such as epoxy resin, polyimide resin or the like is applied to the entire first surface 1a of the substrate with groove 11. Thereafter, planarization of the surface of the resin is performed to form the electrode insulating layer 39. Subsequently, the electromagnetic shielding layer 23 is formed on the electrode insulating layer 39. The electromagnetic shielding layer 23 is able to be formed, for example, by sputtering using a soft magnetic material. The electromagnetic shielding layer 23 may be formed by the plating method.

Then, by removing the resist pattern, the electrode insulating layer 39 and the electromagnetic shielding layer 23 are formed on the device regions 10. Thus, the electromagnetic shielding layer 23 is formed in the regions other than the groove parts 20, 21 in the sizes according to the device regions 10. By executing the electromagnetic shielding layer forming process, all of the eight substrates with groove 11 become the substrates with shielding layer in the present invention, so that all of the eight substrates with groove 11 have the configuration as the substrates with shielding layer. Note that the substrate with shielding layer means the substrate with groove having the electromagnetic shielding layer.

Subsequently, laminating process is performed. In the laminating process, later-described laminated wafer 90 is manufactured by laminating of a plurality of substrates with groove 11, as a substrate with shielding layer, manufactured by the above-described process.

First, as illustrated in FIG. 14, an insulating adhesive is applied on the first surface 1a of the substrate with groove 11 to fix it to the base 34. In FIG. 14, the adhesive layer 33 made of the adhesive applied at this time is shown. Since the substrate with groove 11 is laminated in the top side of the later-described laminated wafer 90, the substrate with groove 11 becomes an uppermost substrate. The base 34 is a member for supporting the substrate with groove 11, and a glass plate is used for the base 34 in FIG. 14. By applying the adhesive, the adhesive layer 33 is formed on the side of the first surface 1a of the substrate with groove 11. This adhesive layer 33 is formed inside the hole part 25, 26.

Subsequently, the second surface 1b of the substrate with groove 11 is polished until the groove parts 20 and 21 appear so that the thickness of the substrate with groove 11 is decreased as illustrated in FIG. 14. Then in the substrate with groove 11, a shape which only the in-groove insulating layer 22 is arranged just under the hole parts 25, 26 is obtained. Namely, by polishing of the second surface 1b of the substrate with groove 11 until the groove parts 20 and 21 appear, a part of the silicon substrate 30 disposed under the groove parts 20 and 21 disappear. By this, the groove parts 21 become through groove parts. Accordingly, only resin is arranged, the inside of the hole parts 25, 26, on the extension line along to the laminated direction. Note that the substrate with groove 11 which the base 34 is fixed is set the substrate with groove 11A.

Figure 15:
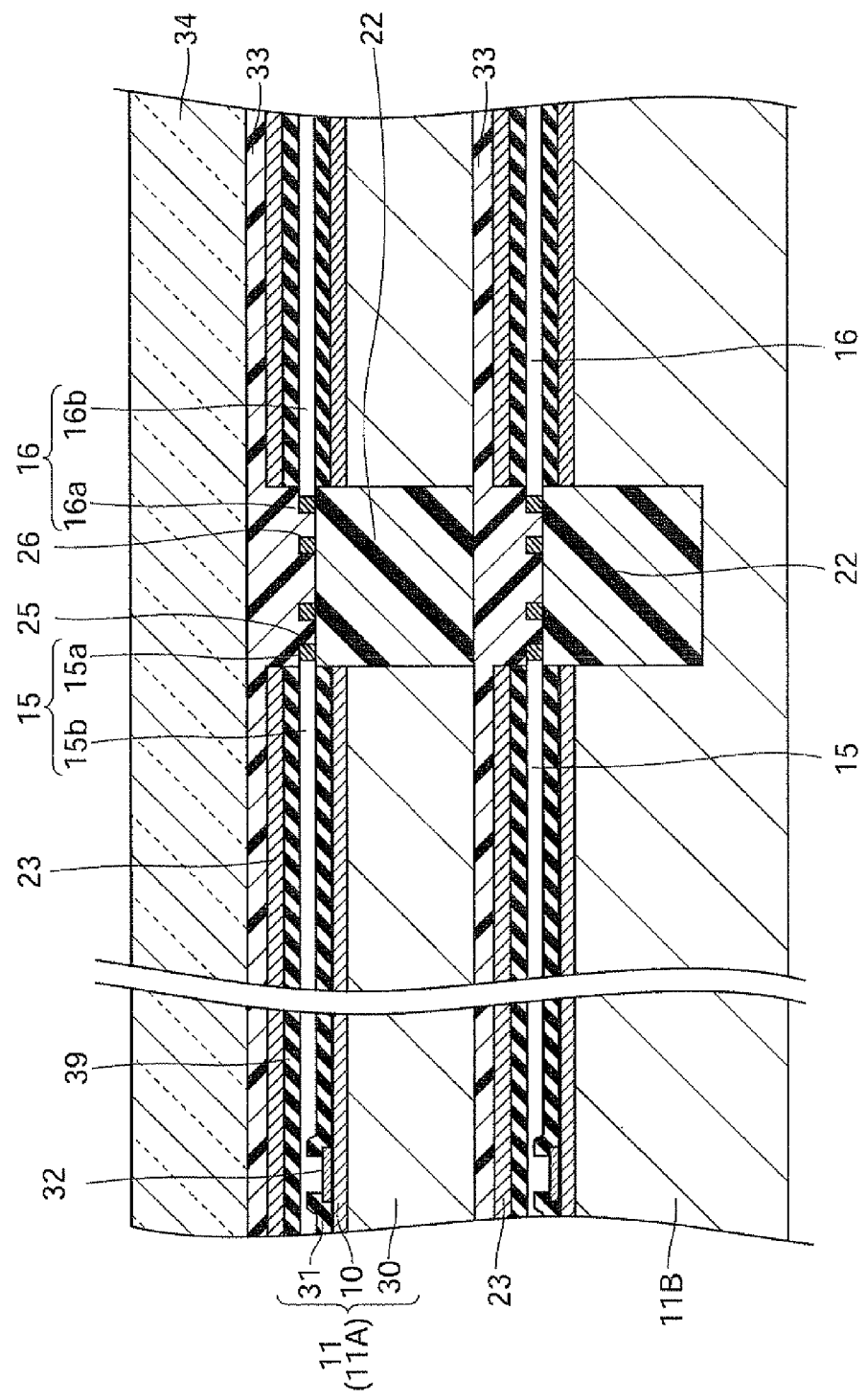
FIG. 15 is a sectional view similar to FIG. 12, illustrating the laminated semiconductor wafer subsequent to that in FIG. 14.

Next, another substrate with groove 11B is bonded to the second surface 1b side of the substrate with groove 11A as illustrated in FIG. 15 using an adhesive. In this event, position adjustment of the substrate with groove 11A and the substrate with groove 11B is performed such that the positions of the groove parts 20, 21 and the wiring electrodes 15, 16 of both of them coincide with each other. Then, the second surface 1b of the substrate with groove 11B is polished until the groove parts 20 and 21 appear.

Figure 16:
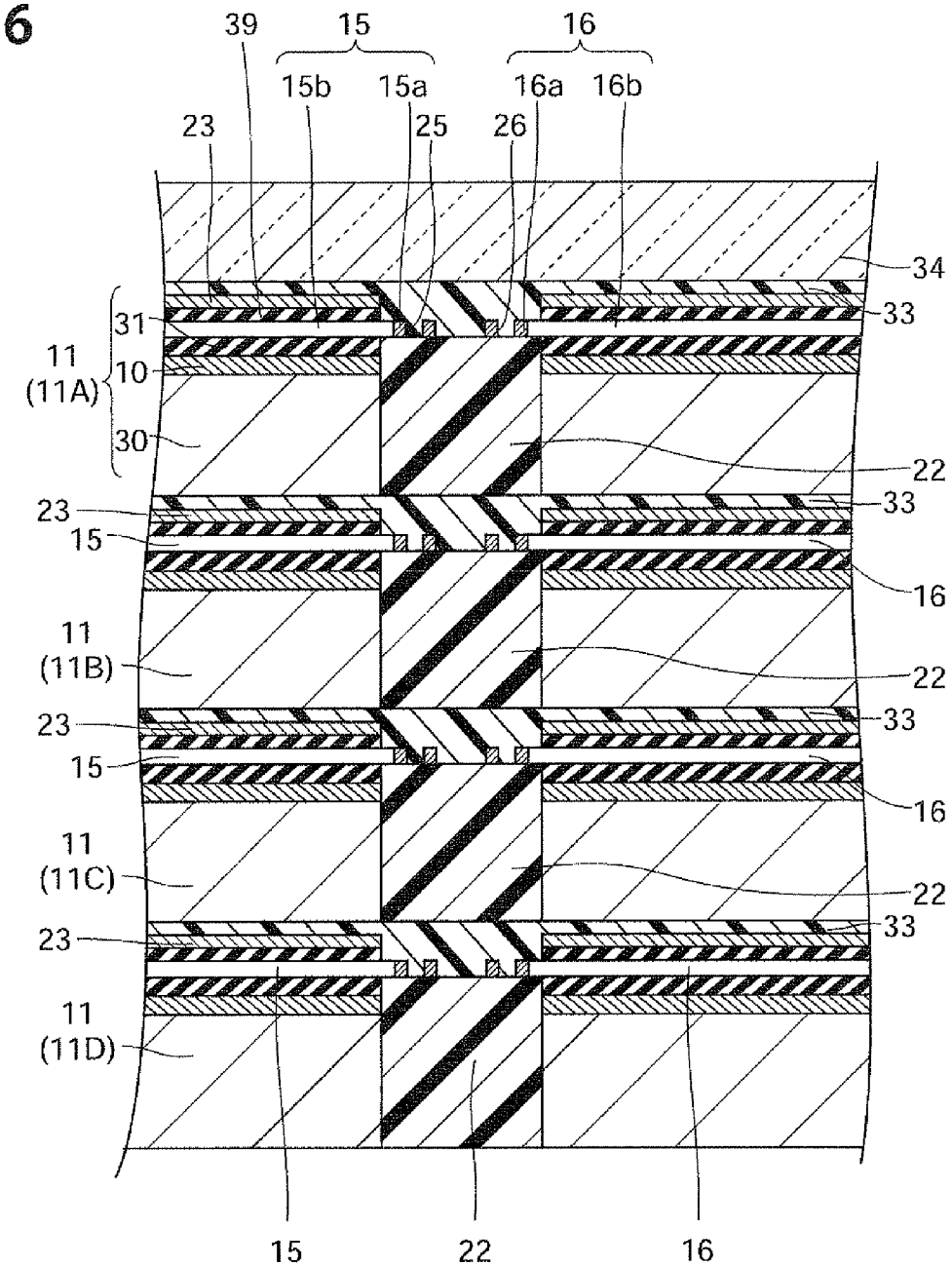
FIG. 16 is a sectional view similar to FIG. 12, illustrating the laminated semiconductor wafer subsequent to that in FIG. 15.

Further, as illustrated in FIG. 16, another substrate with groove 11C, another substrate with groove 11D are prepared. Then, for each of the substrates with groove 11C, 11D, a process of bonding it to the second surface 1b side of the laminated body and polishing it (a bonding and polishing process) is performed.

Figure 17:
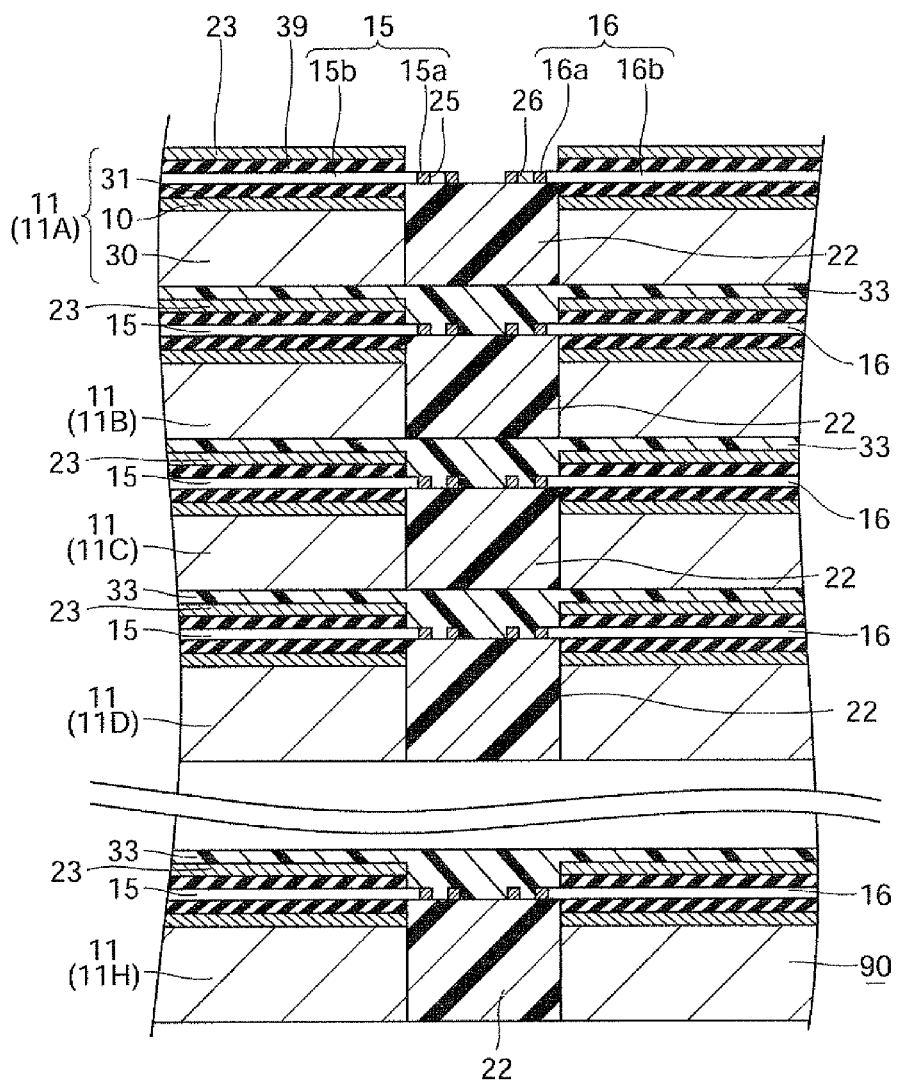
FIG. 17 is a sectional view similar to FIG. 12, illustrating the laminated semiconductor wafer subsequent to that in FIG. 16.
Figure 18:
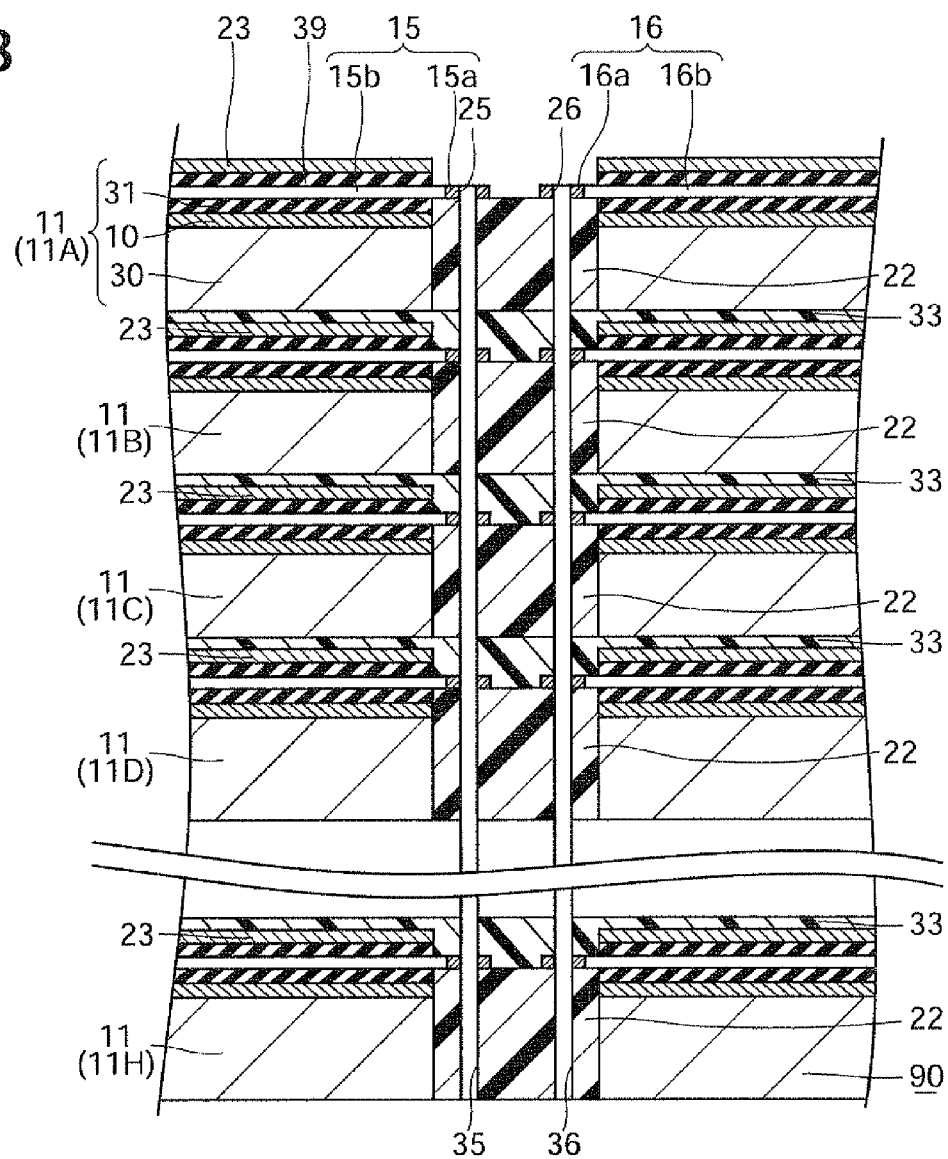
FIG. 18 is a sectional view similar to FIG. 12, illustrating the laminated semiconductor wafer subsequent to that in FIG. 17.
Figure 19:
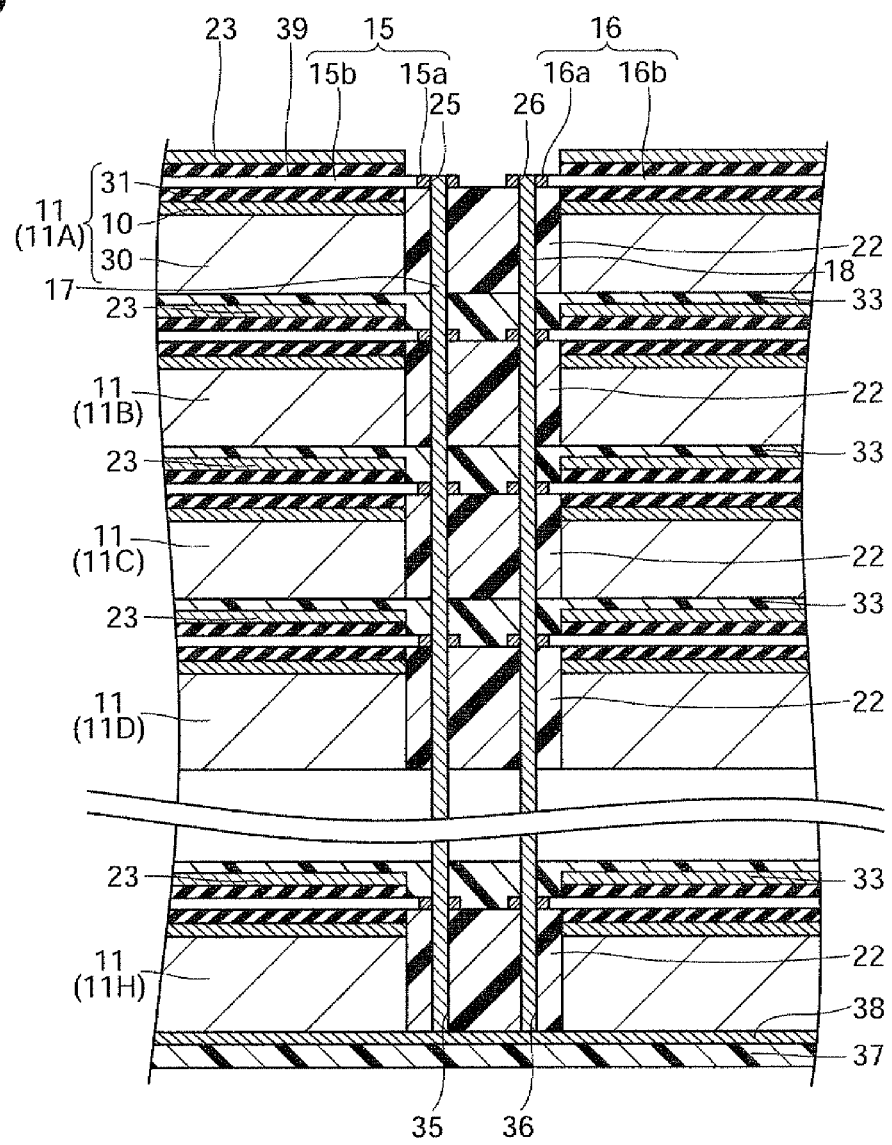
FIG. 19 is a sectional view similar to FIG. 12, illustrating the laminated semiconductor wafer subsequent to that in FIG. 18.

Continuously, as illustrated in FIG. 17, the bonding and polishing process is repeatedly performed for other three substrates with groove 11 (illustration thereof is omitted in FIG. 17 to FIG. 19). Then, the bonding and polishing process is finally performed for the substrate with groove 11H. As a result, the bonding and polishing process is performed for the eight substrates with groove 11 in total.

Thereafter, when the base 34 and the adhesive layer 33 are removed about the substrate with groove 11A, the laminated wafer 90 as shown in FIG. 17 is manufactured. In the laminated wafer 90, the substrate with groove 11A is laminated in the top side, and the seven substrates with groove 11 are stacked thereunder, so that the eight substrates with groove 11 in total are laminated. In this laminated wafer 90, since the substrate with groove 11H is laminated in the bottom side, the substrate with groove 11H becomes an undermost substrate.

Next, through hole forming process is performed. In the through hole forming process, as illustrated in FIG. 18, through holes 35, 36 are formed in the laminated wafer 90 manufactured by the above-described process. The through holes 35, 36 are formed in such a manner that the through holes 35, 36 penetrate all of the groove parts 20, 21, the hole parts 25, 26, the in-groove insulating layers 22, and the adhesive layers 33 of the plurality of (eight) substrates with groove 11 laminated in the direction (the laminated direction) in which the substrates with groove 11 are laminated, and that the whole inner surfaces of the electrode pads 15a, 16a of all of the eight wiring electrodes 15, 16 laminated in the laminated direction appear in the through holes 35, 36.

The through holes 35, 36 can be formed, for example, by laser beam machining. In the laser beam machining, the laser beams are focused on a very small area and applied to the hole parts 25, 26 of the wiring electrodes 15, 16. Then, the energy of the applied laser beams melts the in-groove insulating layers 22 and the adhesive layers 33 on extension lines of the hole parts 25, 26 along the hole parts 25, 26 to form the through holes 35, 36 penetrating the in-groove insulating layers 22 and so on in the laminated direction from the regions where the laser beams are applied. To form the through holes 35, 36, the laser beams need to be applied only to the hole parts 25, 26. The laser beam machining is, however, preferable to form the through holes 35, 36 because the machined regions by the laser beam machining are very fine. In this case, in the laser beam machining, $CO_2$ laser (carbon dioxide gas laser) or THG (Third Harmonic Generation) laser can be used. Especially, the THG laser is suitable for machining the resin such as polyimide and the like and is suitable for finely forming the through holes 35, 36.

In addition to the laser beam machining, for example, RIE (Reactive Ion Etching) using oxygen plasma or IBE (Ion Beam Etching) may be applied to form the through holes 35, 36.

Subsequently, a through electrode forming process is executed. In the through electrode forming process, the through electrodes 17, 18 are formed inside the respective through holes 35, 36 formed in the above-described procedure as illustrated in FIG. 19. The through electrode 17, 18 is formed in a one-bar shape which is in contact with the whole inner surfaces of the electrode pads 15a, 16a of all of the wiring electrodes 15, 16 appearing in the through hole 35, 36 and penetrates all of the eight substrates with groove 11 passing through the through hole 35, 36.

The through electrodes 17, 18 can be formed as follows, for instance. As illustrated in FIG. 19, a seed layer 38 is formed on the second surface 1b of the substrate with groove 11H in the laminated wafer 90 using a holding plate 37 made of resin. The seed layer 38 is made of metal such as Cu or the like and used for forming a plating layer.

Next, electro-plating is performed by passing current through the seed layer 38. Then, a plating film grows from the surface of the seed layer 38 to fill the inside of the through holes 35, 36. Thus, the through electrodes 17, 18 are formed inside the through holes 35, 36. Since the through electrodes 17, 18 are formed by filling the plating film in the through holes 35, 36, the through electrodes 17, 18 come into contact with all of the wiring electrodes 15, 16 appearing in the through holes 35, 36. By forming the through electrodes 17, 18, the device regions 10 laminated in the laminated direction are connected.

Thereafter, electrode pads 27, 28 are formed on the second surface 1b of the substrate with groove 11H in the laminated wafer 90, the laminated semiconductor wafer 100 is manufactured.

(Structure of Laminated Chip Package)

Figure 5:
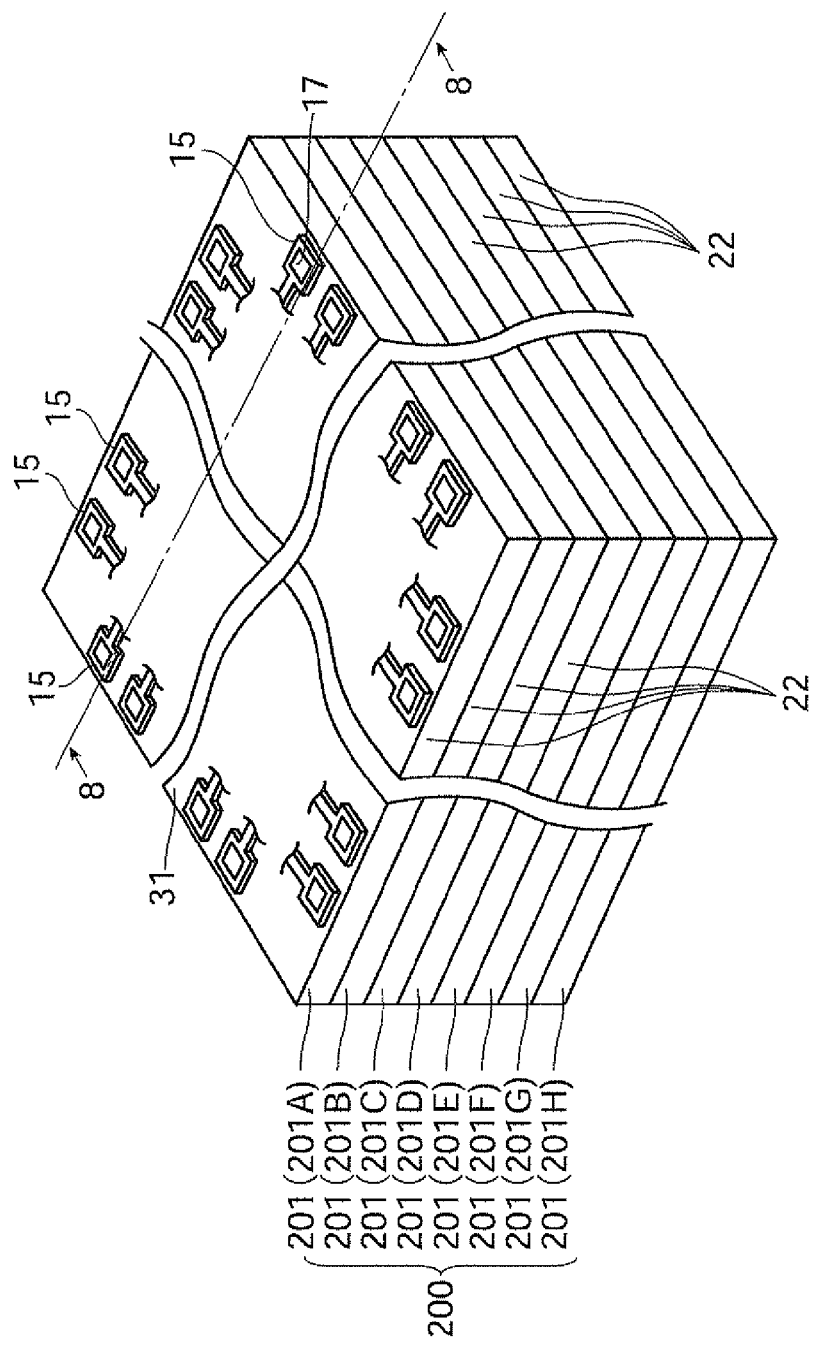
FIG. 5 is a perspective view of a laminated chip package according to the embodiment of the present invention seen from a front side.
Figure 6:
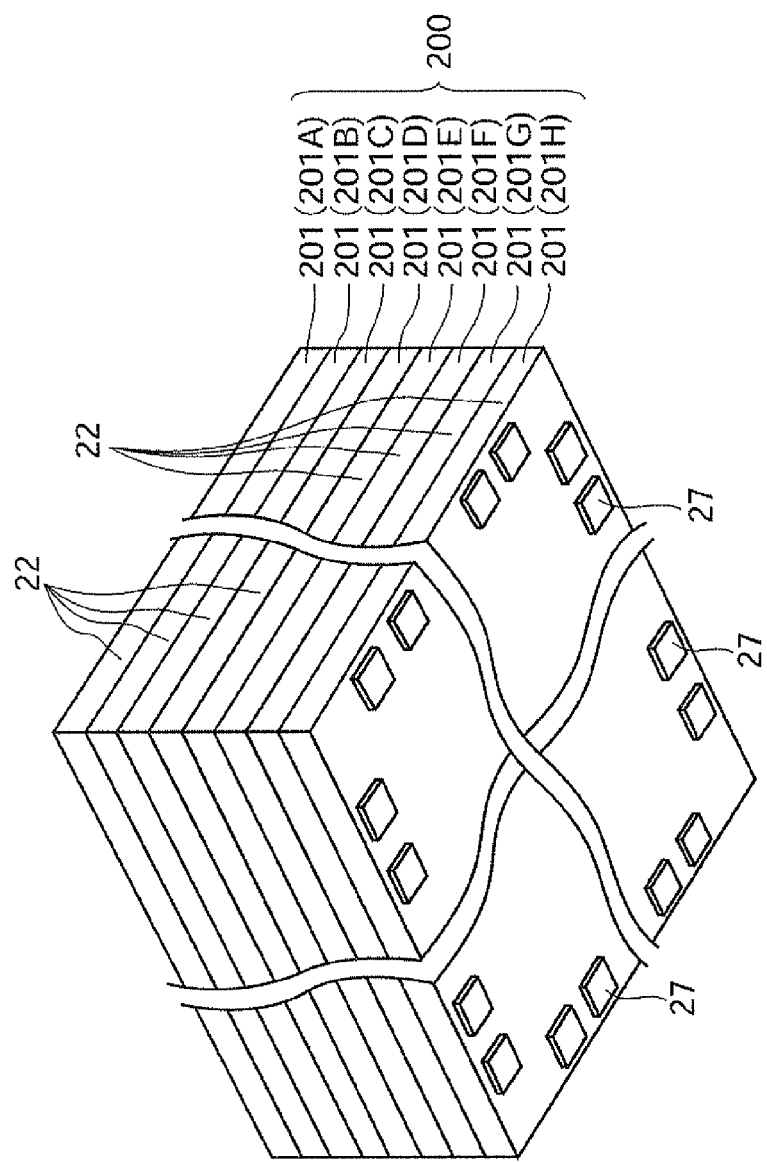
FIG. 6 is a perspective view of a laminated chip package according to the embodiment of the present invention seen from a rear side.
Figure 7:
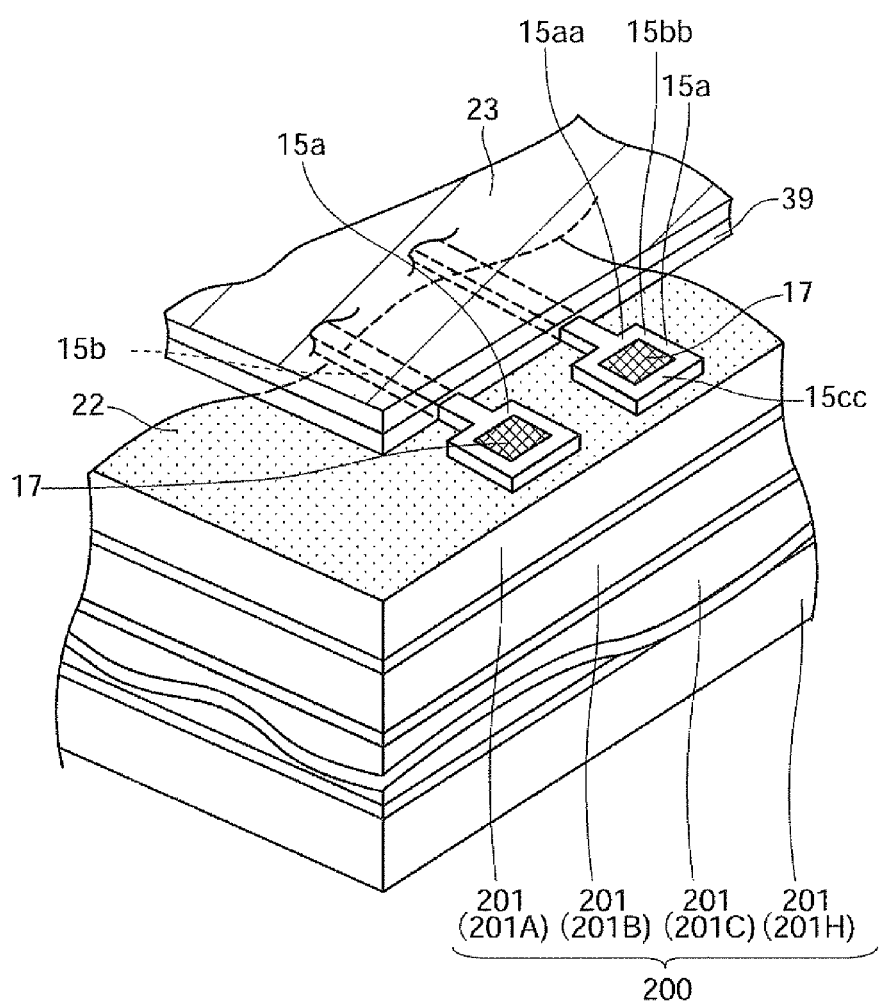
FIG. 7 is a perspective view illustrating a principal part of the laminated chip package with a part of it omitted.
Figure 8:
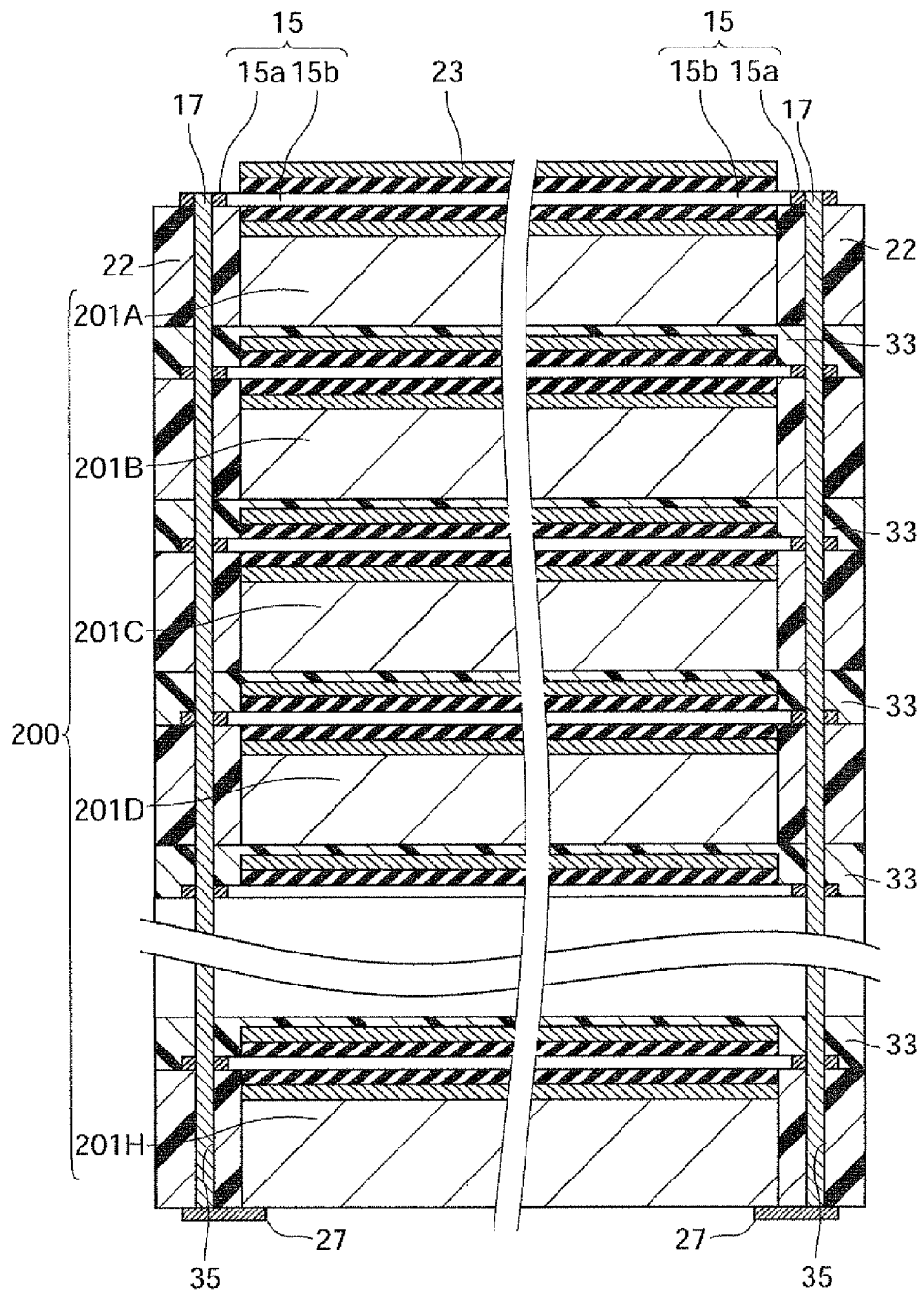
FIG. 8 is a sectional view taken along the line 8-8 in FIG. 5.

By using the laminated semiconductor wafer 100 having the above-described structure, a laminated chip package 200 is able to be manufactured. The structure of the laminated chip package 200 will be described as follows referring to FIG. 5 to FIG. 8. Here, FIG. 5 is a perspective view of a laminated chip package 200 seen from a front side. FIG. 6 is a perspective view of the laminated chip package 200 seen from a rear side. FIG. 7 is a perspective view illustrating a principal part of the laminated chip package 200 with a part of it omitted. FIG. 8 is a sectional view taken along the line 8-8 in FIG. 5.

The laminated chip package 200 is manufactured from the laminated chip region 40A, 40B in the above-described laminated semiconductor wafer 100. The laminated chip package 200 has a structure in which eight semiconductor chips 201 (201A, 201B, 201C, 201D, 201E, 201F, 201G, 201H) are laminated. In the laminated chip package 200, the semiconductor chip 201A as an uppermost chip is laminated in the top side. Under the semiconductor chip 201A, seven semiconductor chips 201B to 201H are laminated. The semiconductor chip 201H as an undermost chip is laminated in the bottom side. The respective semiconductor chips 201A to 201H are bonded together by the adhesive layers 33.

Further, since the laminated chip package 200 is manufactured from the laminated chip region 40A, 40B, a plurality of wiring electrodes 15 are formed on the front side. On the rear side, a plurality of electrode pads 27 are formed. The laminated chip package 200 has the in-groove insulating layers 22 as the resin insulating layers made of insulating resin which are formed to surround the periphery of the laminated chip package 200. The laminated chip package 200 is covered by the in-groove insulating layers 22 in the whole peripheral direction.

Further, all of the eight semiconductor chips 201 in the laminated chip package 200 have the electromagnetic shielding layer 23 and electrode insulating layer 39. The electromagnetic shielding layer 23 and electrode insulating layer 39 are formed in the region other than the in-groove insulating layer 22 as illustrated in detail especially in FIG. 7.

In addition, a plurality of through holes 35 are formed in the laminated chip package 200, and the through electrodes 17 are formed in the respective through holes 35. As illustrated in FIG. 8, all of the through holes 35 are formed in the in-groove insulating layers 22. Each of the through holes 35 penetrates the eight wiring electrodes 15 constituting the laminated electrode group 55, the in-groove insulating layers 22, and the adhesive layers 33 of the semiconductor chips 201A to 201H. The through electrode 17 is a conductor in a one-bar shape passing through the through hole 35 and is in direct contact with the electrode pads 15a of the eight wiring electrodes 15 constituting the laminated electrode group 55.

The laminated chip package 200 is able to realize memories with various storage capacities such as 64 GB (gigabyte), 128 GB, and 256 GB by varying the memory parts in the semiconductor wafer 1. Note that eight semiconductor chips are laminated in the laminated chip package 200. However, it is sufficient that a plurality of semiconductor chips are laminated, and the number of the semiconductor chips which are laminated within the laminated chip package 200 is not limited to eight.

Since the laminated chip package 200 having the above-described structure can be manufactured using the laminated semiconductor wafer 100, more laminated chip packages 200 can be manufactured in a short time. Accordingly, the manufacturing cost of the laminated chip package 200 can be reduced.

In addition, the laminated chip package 200 is manufactured using the laminated semiconductor wafer 100, and is thus manufactured under the environment in which the influence of the electromagnetic waves can be sufficiently avoided. Further, since all of the eight semiconductor chips 201 have the electromagnetic shielding layer 23, the laminated chip package 200 itself has the effect of highly shielding against the electromagnetic waves, and has a structure rarely affected by the electromagnetic waves existing under the external environment. Therefore, the noise caused from the electromagnetic waves rarely mixes into the signal passing through the wiring electrode 15.

Further, the laminated chip package 200 has the through electrode 17 as in the laminated semiconductor wafer 100, and thus has a structure in which the contact resistance caused by the contact between conductors for connecting the semiconductor chips 201 does not occur. Furthermore, all of the semiconductor chips 201 are connected by the through electrode 17. The through electrode 17 is a conductor in a one-bar shape without joint, and thus has a contact resistance lower than the contact resistance in the case where the respective semiconductor wafers 100 are connected by the wiring individually formed in each semiconductor chip 201. Further, since the peripheral surface of the through electrode 17 is in contact with all inner surfaces of the electrode pad 15a facing the hole part 25, a larger contact area is secured between the electrode pad 15a and the through electrode 17 so that the current smoothly flows.

(Method of Manufacturing Laminated Chip Package)

Continuously, the laminated chip package 200 having the above-described structure is able to be manufactured by using the laminated semiconductor wafer 100. In this case, when the laminated semiconductor wafer 100 is cut along the scribe lines 3A and 3B by using the dicing saw, respective laminated chip regions such as the laminated chip regions 40A, 40B are divided into block-like pieces. The respective divided block-like pieces will be the laminated chip packages 200.

When cutting the laminated semiconductor wafer 100, the cutting is performed, as illustrated in FIG. 4, such that a cut line CL by the blade passes through the space between the adjacent wiring electrodes 15 and wiring electrodes 16 and the blade does not come into contact with the wiring electrodes 15 and the wiring electrodes 16. By this, the laminated chip package 200 can be structured such that it is covered by the in-groove insulating layers 22 in the whole peripheral direction.

For the blade to pass through the space between the adjacent wiring electrodes 15 and wiring electrodes 16, the following is set. Here, where the width of the blade is Wb and the distance between the wiring electrode 15 and the wiring electrode 16 is W1, W1≧Wb is set as illustrated in FIG. 27(a). This means that the wiring electrode 15 and the wiring electrode 16 are formed to provide a distance larger than the width Wb of the blade. The distance is set to establish W1≧Wb by devising the size and the arrangement of the electrode pads 15a, 16a of the wiring electrode 15 and the wiring electrode 16.

Conversely, in the case of W1<Wb, parts of the extended terminal parts 15cc, 16cc of the electrode pads 15a, 16a will be cut as illustrated in FIG. 27(b) when the laminated semiconductor wafer 100 is cut. This will form a shape in which the sections of the extended terminal parts 15cc, 16cc are exposed in the periphery of the laminated chip package 200. Even in this case, it is possible to prevent the blade from passing through the hole parts 25, 26, and thus possible to maintain the contact state between the through electrodes 17, 18 and the wiring electrodes 15, 16 (illustration of the through electrodes 17, 18 in FIGS. 27(a), (b) and FIGS. 28(a), (b) is omitted).

Further, it is assumed that Wb>W1+2Wd is set where both the widths of the extended terminal parts 15cc, 16cc in the direction across the groove part 21 are Wd. Then, the blade passes through the insides of the hole parts 25, 26 as illustrated in FIG. 28(a) when the laminated semiconductor wafer 100 is cut, so that the through electrodes 17, 18 are cut. This reduces the areas of parts where the through electrodes 17, 18 are in contact with the wiring electrodes 15, 16, and the flow of current may be deteriorated.

Besides, it is assumed that Wb>W1+2Wd+2We is set where both the widths of the hole parts 25, 26 in the direction across the groove part 21 are We. Then, the blade will pass through the whole hole parts 25, 26 and most of the wiring electrodes 15, 16 as illustrated in FIG. 28(b) when the laminated semiconductor wafer 100 is cut. This removes the through electrodes 17, 18 when the laminated semiconductor wafer 100 is cut along the groove parts 20, 21.

Accordingly, it is preferable that the following relational expression is satisfied by devising the size, the shape, the arrangement and so on of the wiring electrode pads 15a, 16a of the wiring electrode 15 and the wiring electrode 16 in the laminated semiconductor wafer 100. This makes it possible for the blade to pass through the space between the hole parts 25, 26 and not contact with the hole parts 25, 26 when the laminated semiconductor wafer 100 is cut.

$$Wb \leq W1 + 2Wd \quad \text{Relational expression:}$$

By satisfying the above relational expression, at least the situation that the through electrodes 17, 18 are cut as illustrated in FIG. 27(b) can be avoided. By this, the contact state between the through electrodes 17, 18 and the wiring electrodes 15, 16 can be maintained also in the completed laminated chip package 200 as in the same state of the laminated semiconductor wafer 100.

Modified Example

Continuously, the laminated semiconductor wafer 100A according to the modified example will be described. The above-described laminated semiconductor wafer 100, all of the eight semiconductor wafers 1A to 1H have the electromagnetic shielding layer 23. However, as illustrated in FIG. 3, regarding the semiconductor wafer 1H in the rear side, since the device regions 10 are arranged in the outside more than the electromagnetic shielding layer 23, the device regions 10 are likely to take the influence of electromagnetic waves.

Figure 31:
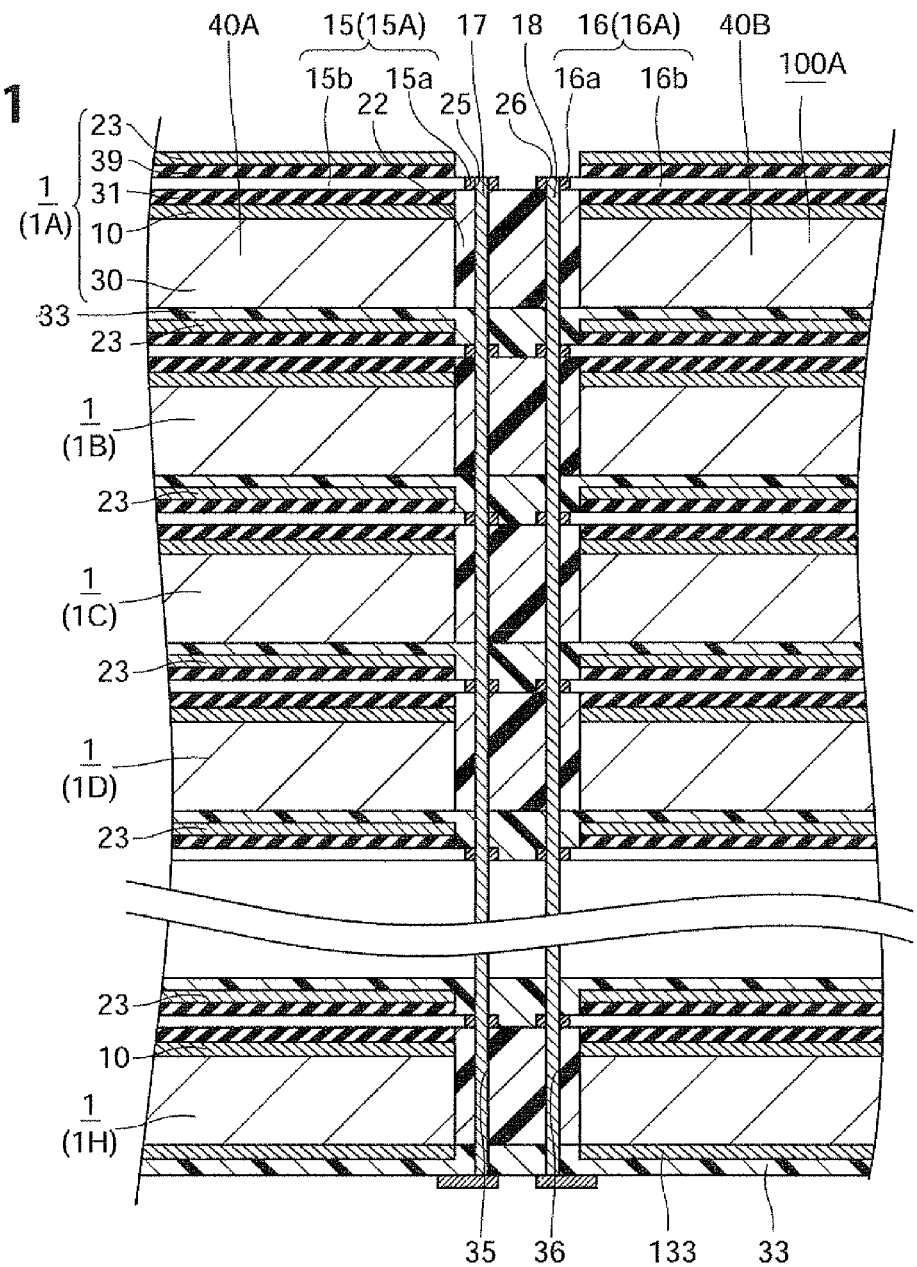
FIG. 31 is a sectional view of a laminated semiconductor wafer according to a modified example, similar to FIG. 3.

Hence, when the electromagnetic shielding layer 23 is formed on the first surface 1a in all of eight semiconductor wafers 1A to 1H as in the laminated semiconductor wafer 100, it is preferable to use a laminated semiconductor 100A illustrated in FIG. 31. The laminated semiconductor wafer 100A is different in that an electromagnetic shielding layer 133 is added, as compared with the laminated semiconductor wafer 100. The electromagnetic shielding layer 133 is formed on the second surface 1b of the semiconductor wafer 1H as the lowermost substrate, and has the configuration as an added electromagnetic shielding layer in the present invention. In this laminated semiconductor wafer 100A, the electromagnetic shielding layer 133 is disposed outside more than the device regions 10. Therefore, it is possible to effectively shield against the electromagnetic waves entering from the rear surface side by the electromagnetic shielding layer 133 so that the effect of shielding against the electromagnetic waves is further enhanced.

Second Embodiment

Structures of Laminated Semiconductor Wafer 151

Figure 32:
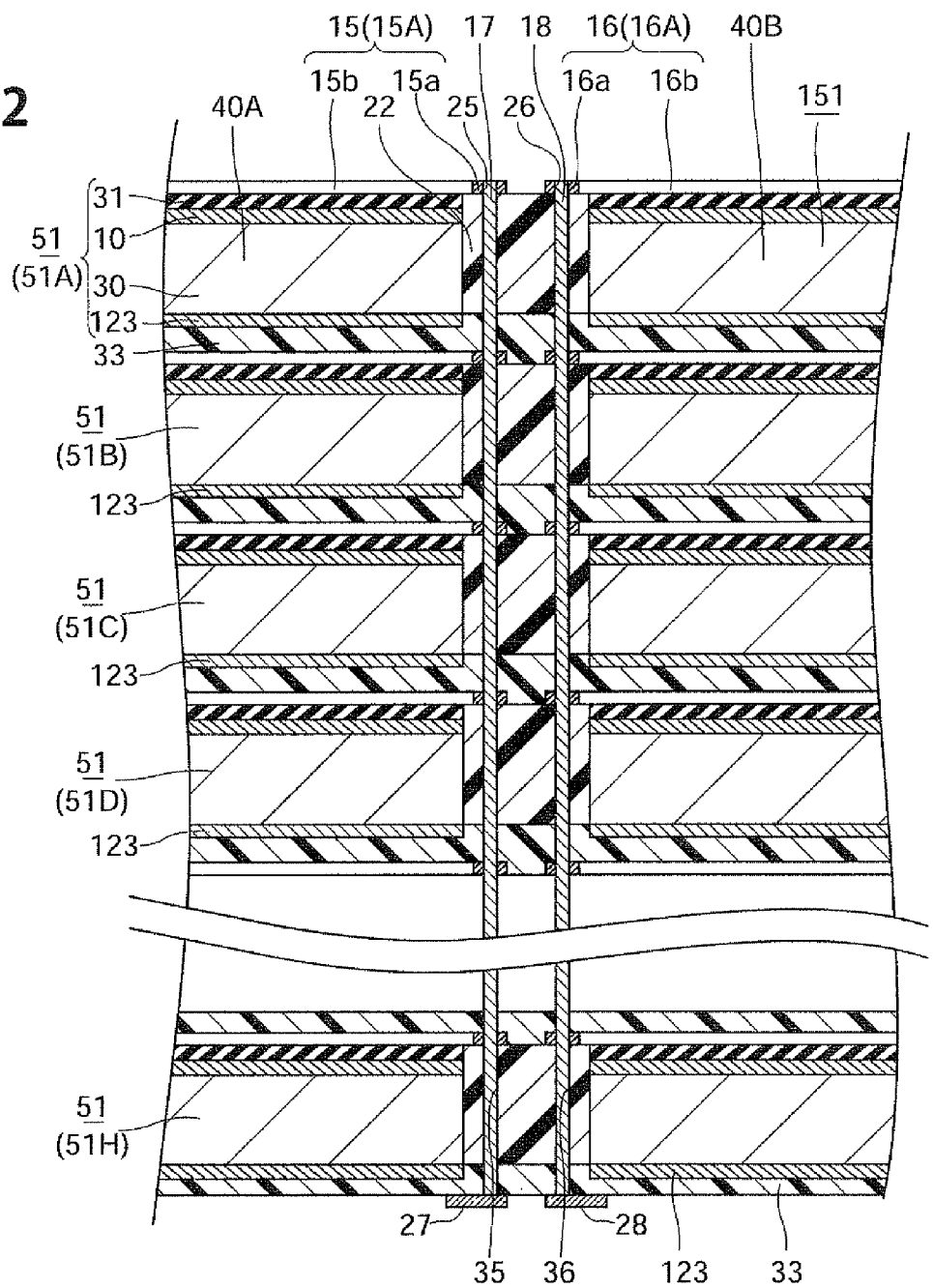
FIG. 32 is a sectional view similar to FIG. 3, illustrating the laminated semiconductor wafer according to a second embodiment of the present invention.

Continuously, a laminated semiconductor wafer 151 according to a second embodiment of the present invention will be described with reference to FIG. 32. Here, FIG. 32 is a plan view illustrating a principal part of the two device regions 10 of the laminated semiconductor wafer 151.

The laminated semiconductor wafer 151 is different in that it is manufactured by using a semiconductor wafer 51, as compared with the laminated semiconductor wafer 100. A plurality of semiconductor wafers 51 are laminated in the laminated semiconductor wafer 151.

The semiconductor wafer 51 is different in that it has an electromagnetic shielding layer 123 in place of the electromagnetic shielding layer 23 and the electrode insulating layer 39, as compared with the semiconductor wafer 1. The electromagnetic shielding layer 123 is different in that it is formed on the second surface 1b, as compared with the electromagnetic shielding layer 23. The electromagnetic shielding layer 123 is also different in that it is formed not covering the plurality of device regions 10 from the outside but formed at corresponding positions corresponding to the plurality of device regions 10 of the second surface 1b, respectively.

In the laminated semiconductor wafer 100 according to the first embodiment, the semiconductor wafers 1 each including the electromagnetic shielding layer 23 on the first surface 1a (front side) are laminated. In contrast, in the laminated semiconductor wafer 151 according to the second embodiment, the semiconductor wafers 51 each including the electromagnetic shielding layer 123 on the second surface 1b (rear side) are laminated.

The locations, where the electromagnetic shielding layer 23 of the laminated semiconductor wafer 100 is formed, is different from the locations where the electromagnetic shielding layer 123 of the laminated semiconductor wafer 151 is formed. However, the laminated semiconductor wafer 100 and the laminated semiconductor wafer 151 are in common as a whole in that eight electromagnetic shielding layers 23 or 123 are formed at regular intervals. Therefore, the effects of shielding against the electromagnetic waves in both cases are equivalent. Further, in the semiconductor wafer 1H, the device region 10 is sandwiched between two electromagnetic shielding layers 23 so that the shielding effect is more effective. Also in this point, the laminated semiconductor wafer 151 is equivalent to the laminated semiconductor wafer 100.

(Method of Manufacturing Laminated Semiconductor Wafer 151)

Figure 33:
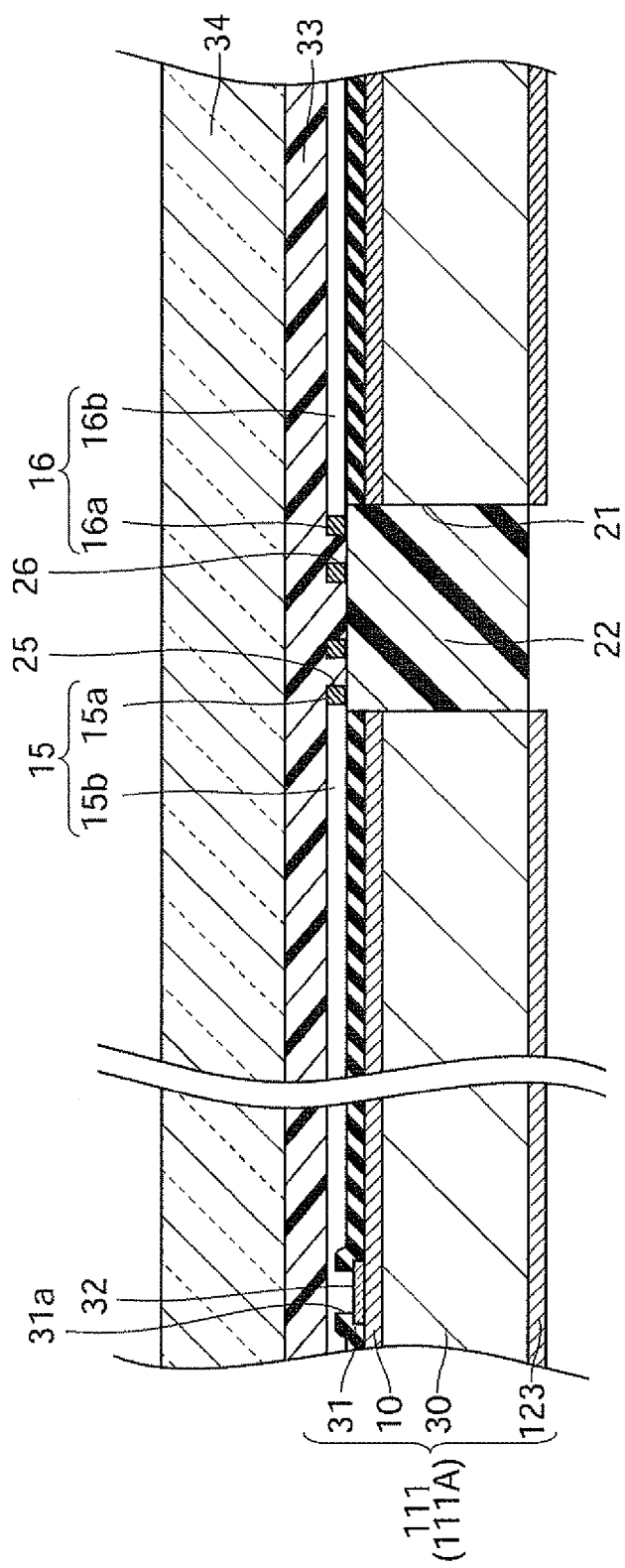
FIG. 33 is a sectional view similar to FIG. 3, illustrating the partially manufactured laminated semiconductor wafer according to a second embodiment of the present invention.

Subsequently, the method of manufacturing the laminated semiconductor wafer 151 will be described as follows. The substrate with groove forming process, the insulating layer forming process, and the electrode forming process are executed in the same procedure as that in manufacturing the laminated semiconductor wafer 100. Then, a substrate with groove 111 as illustrated in FIG. 33 is manufactured. This substrate with groove 111 is different in that it does not have the electrode insulating layer 39 and the electromagnetic shielding layer 23, as compared with the substrate with groove 11.

After the electrode forming process is executed, the electromagnetic shielding layer forming process is executed. In this case, an insulating adhesive is first applied to the first surface 1a of the substrate with groove 111 to fix the substrate with groove 111 to the base 34. Then, the second surface 1b of the substrate with groove 111 is polished until the groove parts 20, 21 appear to reduce the thickness of the substrate with groove 111 as illustrated in FIG. 33. Note that the substrate with groove 111 having the base 34 fixed thereto is a substrate with groove 111A in the following description.

After the second surface 1b is polished, the electromagnetic shielding layer 123 is formed in the regions other than the groove parts 20, 21 in the second surface 1b of the substrate with groove 111A. The electromagnetic shielding layer 123 is formed, for example, by sputtering or the plating method using a soft magnetic material similarly to the electromagnetic shielding layer 23. By forming the electromagnetic shielding layer 123, the substrate with groove 111A becomes the substrate with shielding layer.

Figure 34:
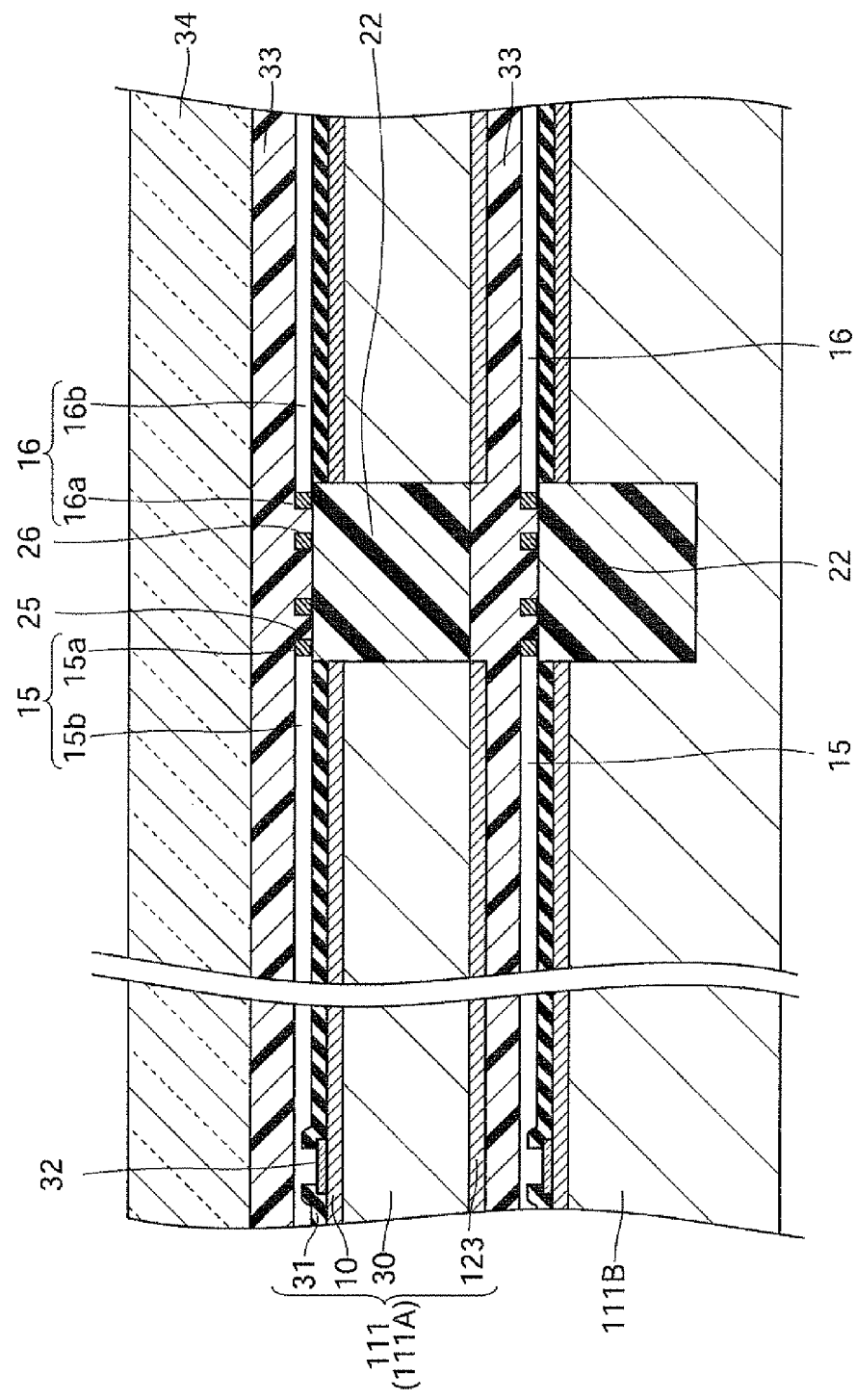
FIG. 34 is a sectional view similar to FIG. 3, illustrating the laminated semiconductor wafer subsequent to that in FIG. 33.

Subsequently, laminating process is performed. In the laminating process, another substrate with groove 111B is bonded to the second surface 1b side of the substrate with groove 111A as illustrated in FIG. 34 using an adhesive. In this event, position adjustment of the substrate with groove 111A and the substrate with groove 111B is performed such that the positions of the groove parts 20, 21 and the wiring electrodes 15, 16 of both of them coincide with each other. Then, the second surface 1b of the substrate with groove 111B is polished until the groove parts 20 and 21 appear. After that, the electromagnetic shielding layer 123 is formed on the second surface 1b of the substrate with groove 111B. Then, the substrate with groove 111B also becomes the substrate with shielding layer.

Figure 35:
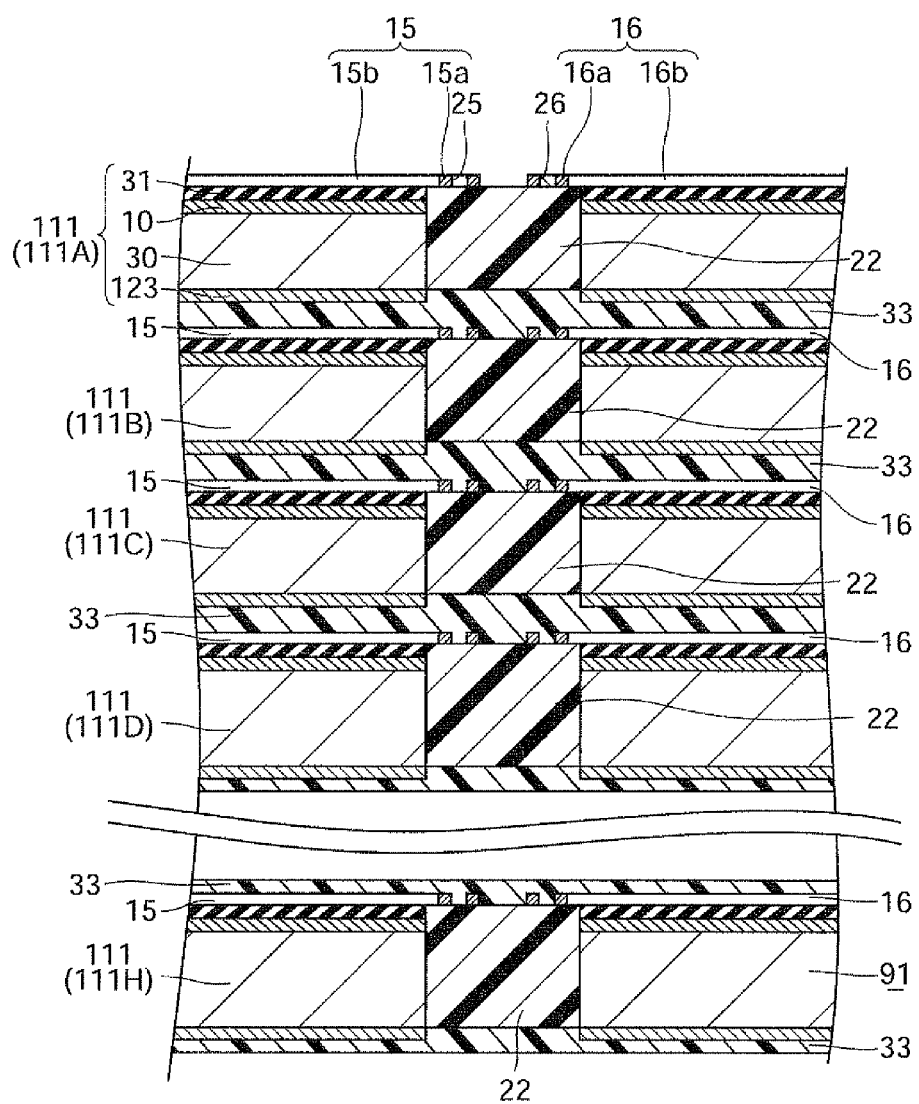
FIG. 35 is a sectional view similar to FIG. 3, illustrating the laminated semiconductor wafer subsequent to that in FIG. 34.
Figure 36:
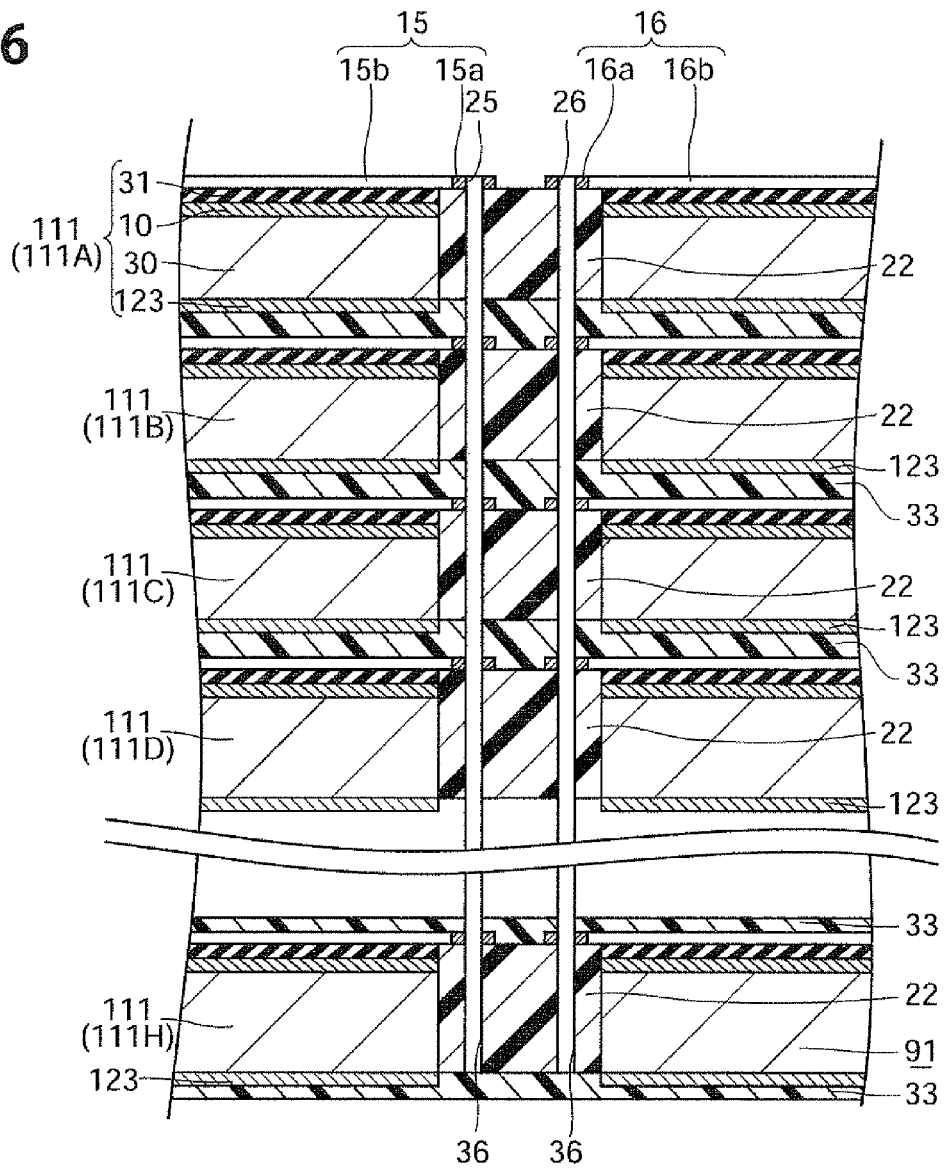
FIG. 36 is a sectional view similar to FIG. 3, illustrating the laminated semiconductor wafer subsequent to that in FIG. 35.

Further, another substrates with groove 111C to 111H are prepared. Then, for each of the substrates with groove 111C to 111H, a process of bonding it to the second surface 1b side of the laminated body and polishing it, further forming the electromagnetic shielding layer 123 is performed. Thereafter, when the base 34 and the adhesive layer 33 are removed about the substrate with groove 111A, the laminated wafer 91 as shown in FIG. 35 is manufactured. Thereafter, as illustrated in FIG. 36, the through hole forming process is performed, and further the through electrode forming process is performed, as in the laminated semiconductor wafer 100, the laminated semiconductor wafer 151, as illustrated in FIG. 32, is formed.

Modified Example

Continuously, the laminated semiconductor wafer 151A according to the modified example will be described. In the above-described laminated semiconductor wafer 151, all of the eight semiconductor wafers 51A to 51H have the electromagnetic shielding layer 123. However, as illustrated in FIG. 32, regarding the semiconductor wafer 51A in the front side, since the device regions 10 are arranged in the outside more than the electromagnetic shielding layer 123, the device regions 10 are likely to take the influence of electromagnetic waves.

Figure 37:
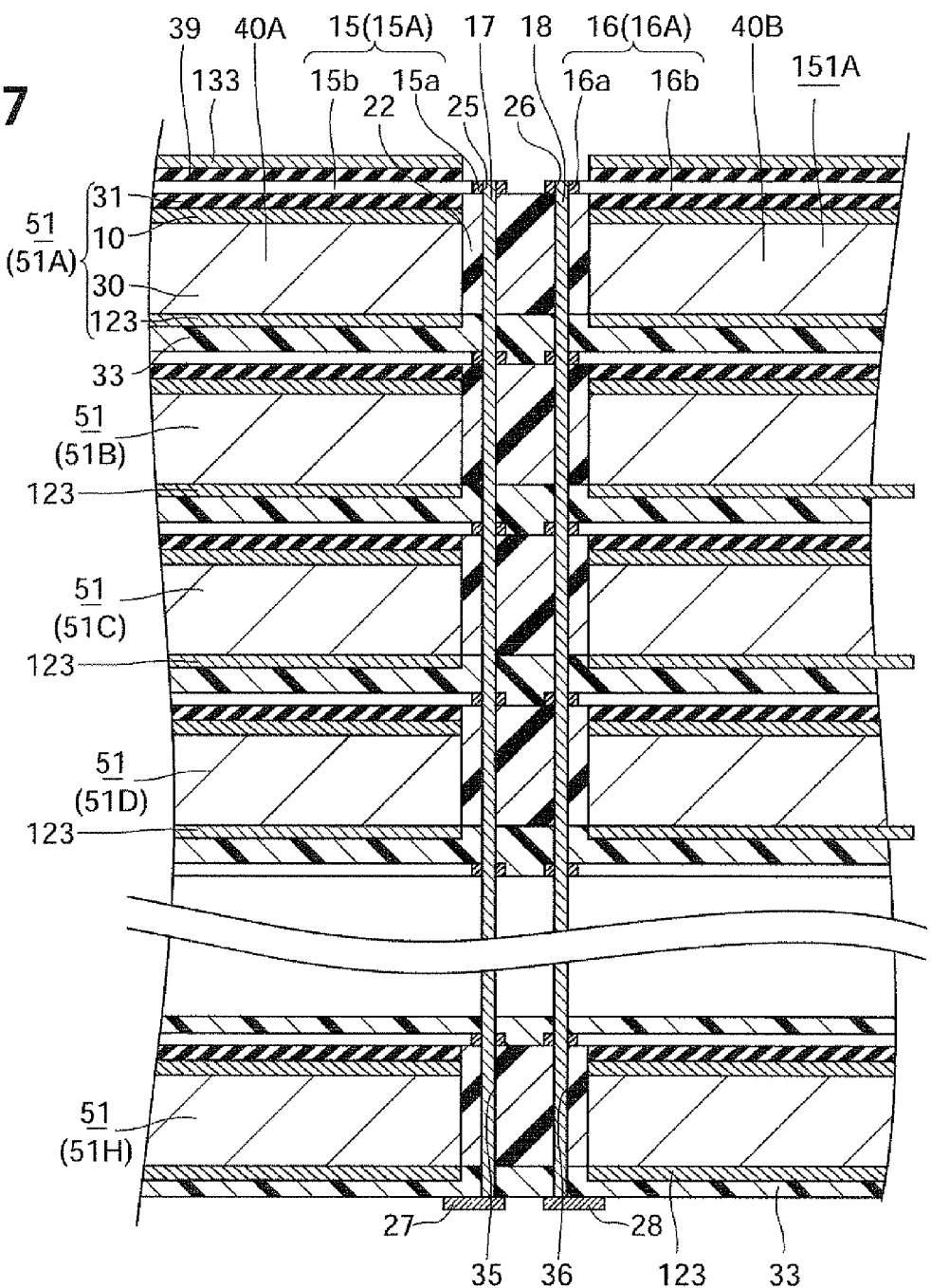
FIG. 37 is a sectional view similar to FIG. 3, illustrating the laminated semiconductor wafer subsequent to that in FIG. 36.

Hence, when the electromagnetic shielding layer 123 is formed on the second surface 1b in all of the eight semiconductor wafers 1A to 1H as in the laminated semiconductor wafer 151, it is preferable to use a laminated semiconductor wafer 151A illustrated in FIG. 37. The laminated semiconductor wafer 151A is different in that an electromagnetic shielding layer 133 is added, as compared with the laminated semiconductor wafer 151. The electromagnetic shielding layer 133 is formed on the fist surface 1a of the semiconductor wafer 1A as the uppermost substrate, and has the configuration as an added electromagnetic shielding layer in the present invention. In this laminated semiconductor wafer 151A, the electromagnetic shielding layer 133 is disposed outside more than the device regions 10. Therefore, it is possible to effectively shield against the electromagnetic waves entering from the front surface side by the electromagnetic shielding layer 133 so that the effect of shielding against the electromagnetic waves is further enhanced.

Other Embodiments

Figure 38:
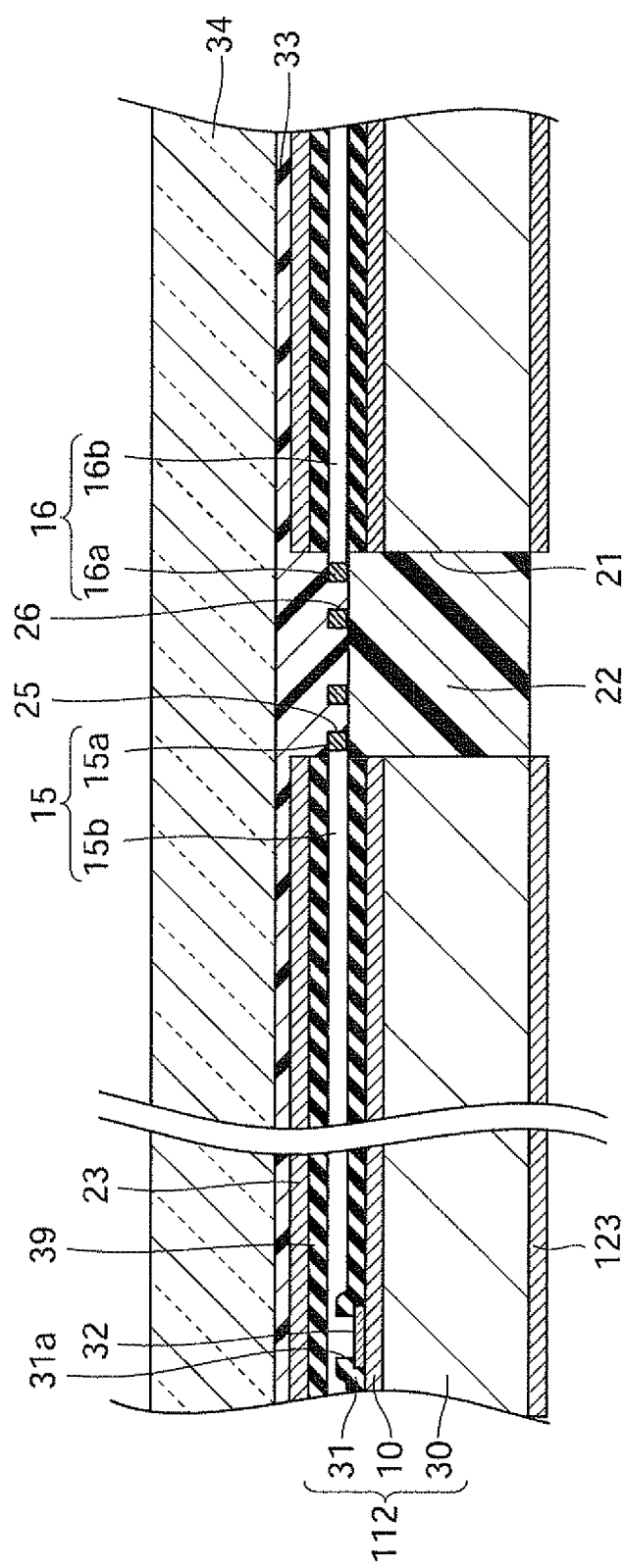
FIG. 38 is a sectional view illustrating a semiconductor wafer constituting an another laminated semiconductor wafer, similar to FIG. 3.

In the above-described laminated semiconductor wafers 100, 151, the electromagnetic shielding layer 23 or the electromagnetic shielding layer 123 is formed on one of the first surface 1a and the second surface 1b of each of the semiconductor wafers 1A to 1H. In short, a single surface shielding-type semiconductor wafers in each of which the shielding layer is formed on the single surface are laminated. Alternatively, the electromagnetic shielding layer 23 and the electromagnetic shielding layer 123 may be formed on the first surface 1a and the second surface 1b respectively as in a semiconductor wafer 112 illustrated in FIG. 38. By laminating both surface shielding-type semiconductor wafers in each of which the shielding layers are formed on both surfaces as in the semiconductor wafer 112, a laminated semiconductor wafer is able to also be formed. With this configuration, the effect of shielding against the electromagnetic waves can be further enhanced.

Figure 39:
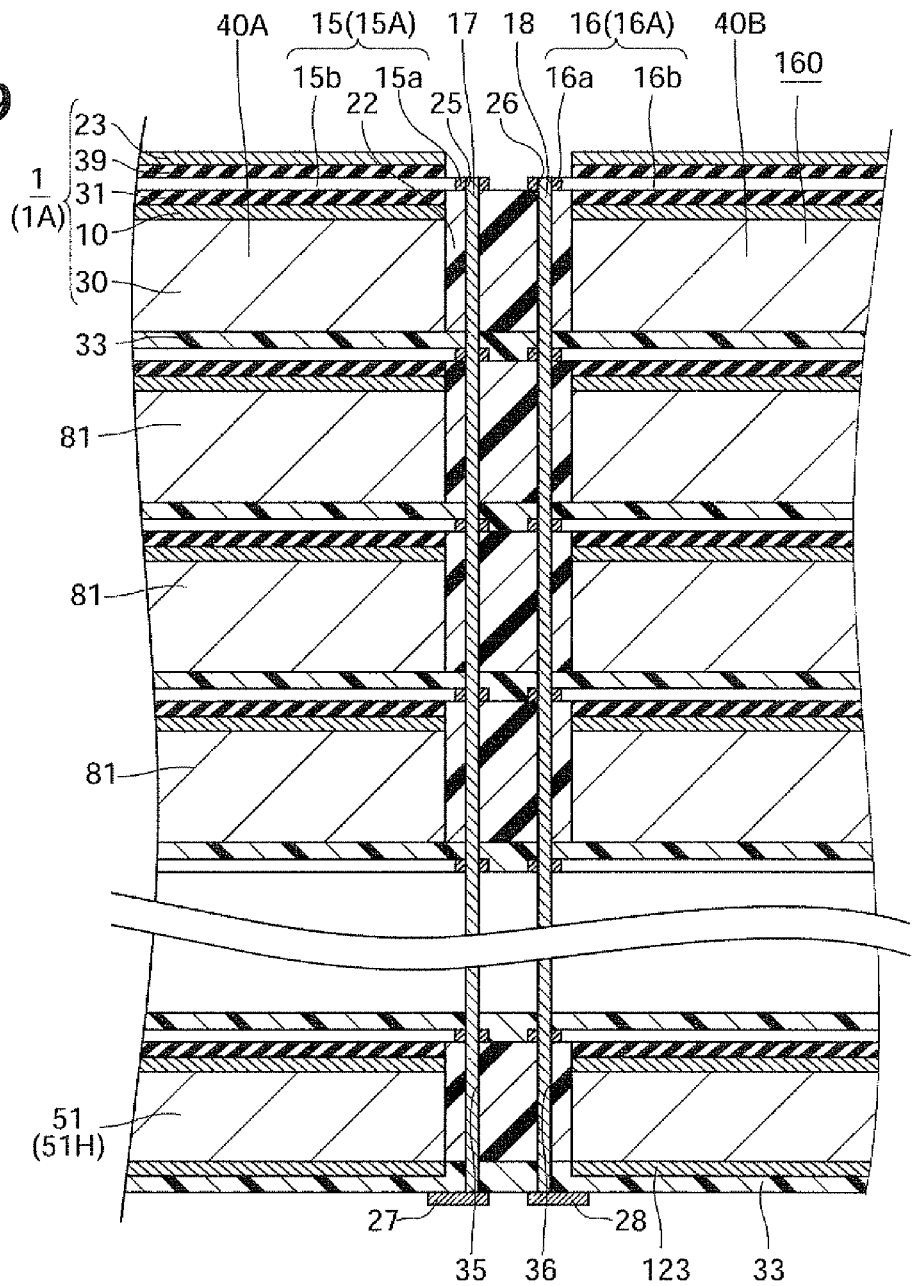
FIG. 39 is a sectional view illustrating an another laminated semiconductor wafer, similar to FIG. 3.

In a laminated semiconductor wafer 160 illustrated in FIG. 39, the uppermost substrate placed on the top side is the semiconductor wafer 1A and the lowermost substrate placed on the bottom side is the semiconductor wafer 51H, between the semiconductor wafer 1A and the semiconductor wafer 51H, substrates without shielding layer 81 are laminated. In the laminated semiconductor wafer 160, only two of eight semiconductor wafers are the substrates with shielding layer, and the remaining substrates between them are the substrates without shielding layer 81. In the laminated semiconductor wafer 160, the semiconductor wafers 1A, 51H as the substrates with shielding layer are placed on the outermost sides.

In manufacturing the laminated semiconductor wafer 160, the semiconductor wafer 1A is manufactured first. The semiconductor wafer 1A has the electromagnetic shielding layer 23. Therefore, even if the substrate without shielding layer 81 is laminated under the semiconductor wafer 1A, the shielding effect during the manufacture can be achieved by the electromagnetic shielding layer 23 of the semiconductor wafer 1A. Further, since the semiconductor wafer 51H laminated last has the electromagnetic shielding layer 123, the electromagnetic shielding layers 23, 123 are placed on both of top and bottom sides of the laminated semiconductor wafer 160. Therefore, it is possible to shield against the electromagnetic waves which can enter from the outside. The electromagnetic shielding layer 23 and the electromagnetic shielding layer 123 are formed on both of top and bottom sides respectively so that the shielding effect is enhanced. It is conceivable that a sufficient shielding effect can be achieved as long as the uppermost substrate and the lowermost substrate are the substrates with shielding layer, as in the laminated semiconductor wafer 160.

Figure 41:
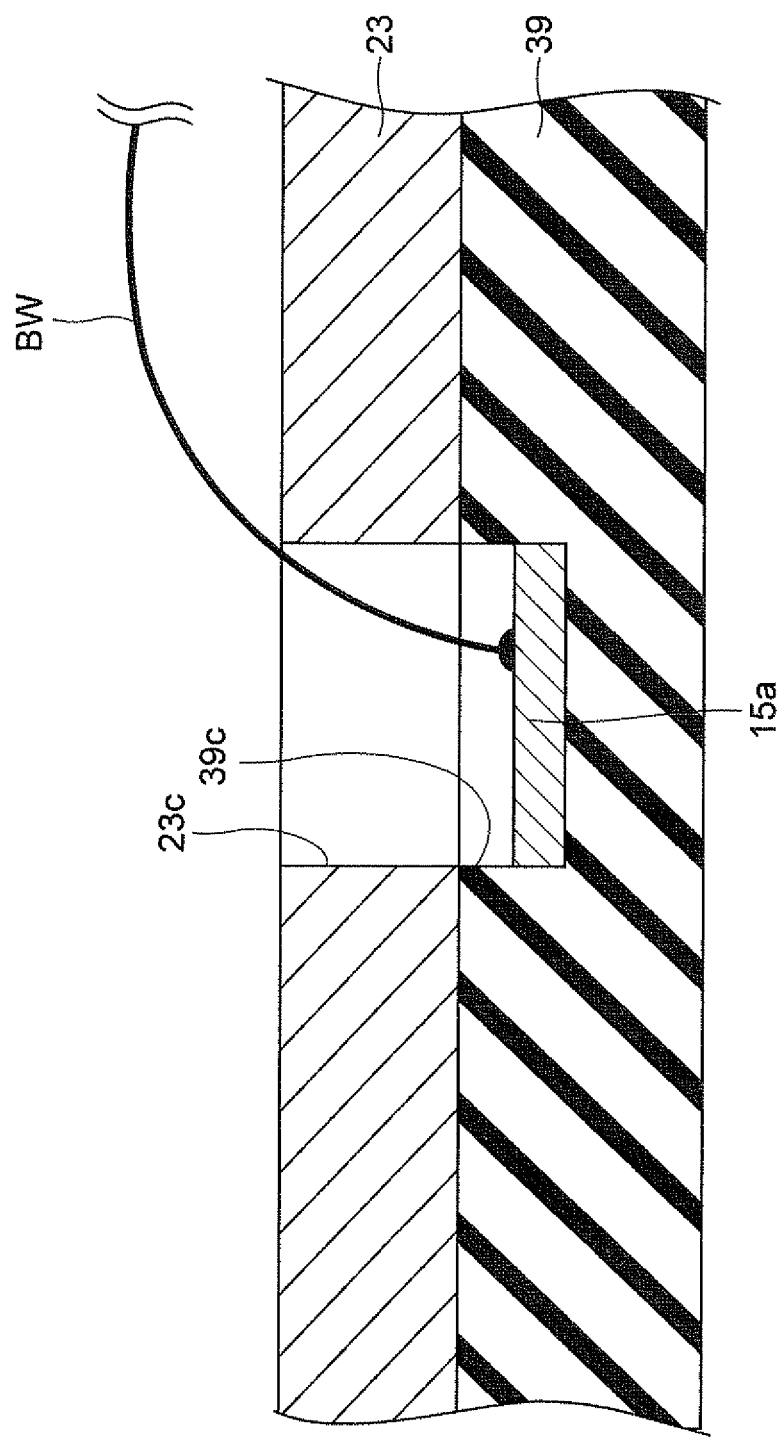
FIG. 41 is a sectional view illustrating connecting holes of an electromagnetic shielding layer and an electrode insulating layer.

In the laminated semiconductor wafer 100 according to the above embodiments, the electromagnetic shielding layer 23 is formed to individually cover the device regions 10. The electromagnetic shielding layer 23 and the electrode insulating layer 39 are not formed in the groove parts 20, 21. The electromagnetic shielding layer 23 and the electrode insulating layer 39 can be formed also on the entire first surface 1a including the groove parts 20, 21. However, in this case, connecting holes 23c, 39c for exposing the electrode pads 15a need to be formed in the electromagnetic shielding layer 23 and the electrode insulating layer 39 respectively as illustrated in FIG. 41. Then, when a bonding wire BW is connected to the electrode pad 15a, the bonding wire BW is undesirably likely to contact with the electromagnetic shielding layer 23. In consideration of this point, the electromagnetic shielding layer 23 is formed in the regions other than the groove parts 20, 21 in this embodiment.

Embodiment about a Wiring Electrode

Figure 23:
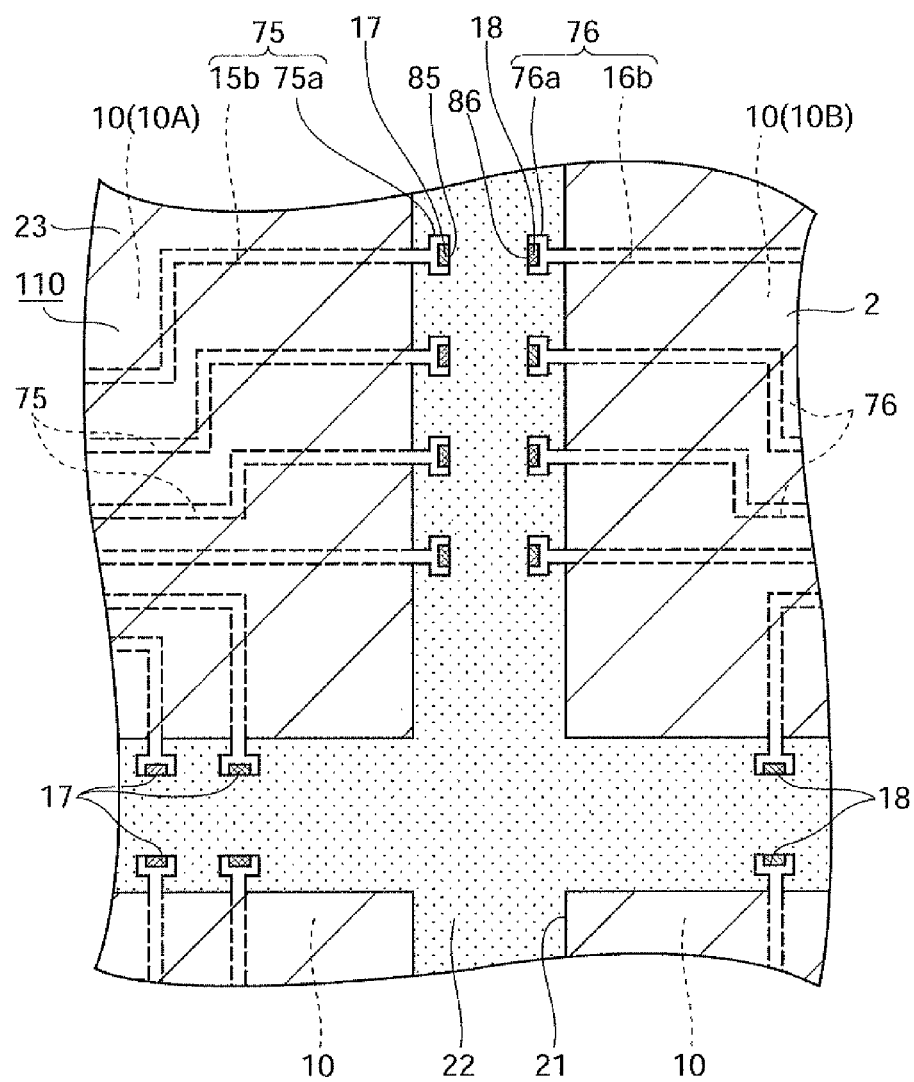
FIG. 23 is a plan view illustrating a principal part of the two device regions of the laminated semiconductor wafer having a wiring electrode different from a wiring electrode in FIG. 2.
Figure 24:
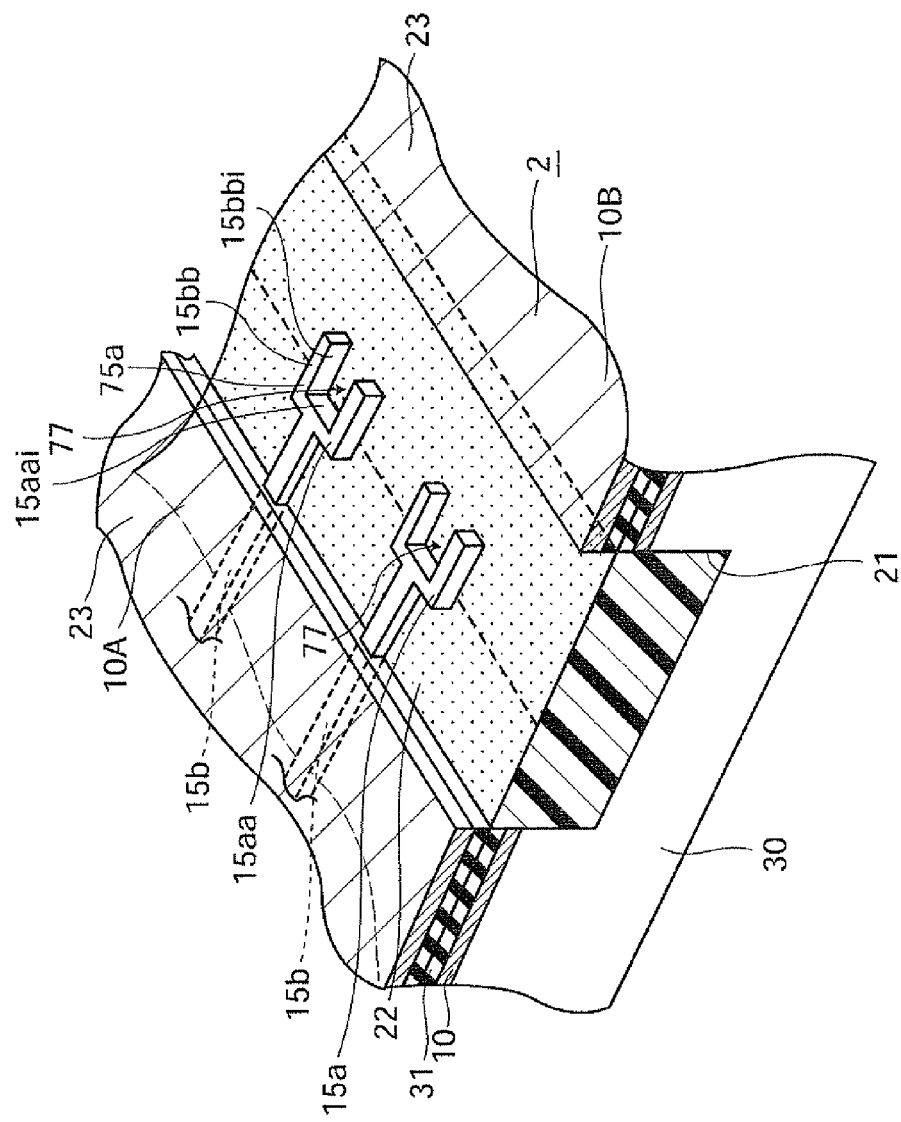
FIG. 24 is a perspective view illustrating a principal part of the semiconductor wafer constituting the partially manufactured laminated semiconductor wafer in FIG. 23.

Continuously, a laminated semiconductor wafer 110 will be described with reference to FIG. 23 and FIG. 24. Here, FIG. 23 is a plan view illustrating a principal part of the two device regions 10 of the laminated semiconductor wafer 110. FIG. 24 is a perspective view illustrating a principal part of the partially manufactured semiconductor wafer 2.

The laminated semiconductor wafer 110 is different in that it is manufactured by using a semiconductor wafer 2, as compared with the laminated semiconductor wafer 100. A plurality of semiconductor wafers 2 are laminated in the laminated semiconductor wafer 110.

The semiconductor wafer 2 is different in that it has wiring electrodes 75 and 76 in place of wiring electrodes 15 and 16, as compared with the semiconductor wafer 1. The wiring electrodes 75 and 76 are different in that they have electrode pads 75a, 76a in place of electrode pads 15a, 16a, as compared with the electrodes 15 and 16.

The electrode pads 75a, 76a are different in that they do not have extended terminal parts 15cc, 16cc, as compared with the electrode pads 15a, 16a. Namely, describing the electrode pad 75a in more detail, the electrode pad 75a has a base part 15aa and two crossing parts 15bb, and is formed in a deformed U-shape surrounding the periphery of a hole part 77 as illustrated in detail in FIG. 24. Further, the two crossing parts 15bb are arranged to open to the inside of the groove part 21. Furthermore, the hole part 77 is formed inside the base part 15aa and the two crossing parts 15bb.

In the laminated semiconductor wafer 110, a plurality of through holes 85, 86 similar to the through holes 35, 36 in the laminated semiconductor wafer 100 are formed, and each of through electrodes 17, 18 is formed inside each of the through holes 85, 86, respectively. Note that since FIG. 24 illustrates the partially manufactured semiconductor wafer 2, the through electrodes 17 and the through holes 85 are not illustrated.

The above-described laminated semiconductor wafer 110, similar to the laminated semiconductor wafer 100, has the wiring electrodes 75 and 76 separated from each other. The two device regions 10A, 10B adjacent to each other are electrically insulated by the in-groove insulating layer 22. Therefore, in the laminated semiconductor wafer 110, similar to the laminated semiconductor wafer 100, the package inspection for the individual laminated chip package is able to be performed in a state of the wafer structure, the laminated semiconductor wafer 110 has a structure in which the package inspection is easily performed for the whole individual laminated chip packages. Therefore, the use of the laminated semiconductor wafer 110 also enables to reduce the manufacturing time of the laminated chip packages, the number of the laminated chip packages manufacturable per unit time can be increased.

Since each semiconductor wafer 2 has the electromagnetic shielding layer 23, the effect of shielding against the electromagnetic waves for a long time is achieved while avoiding the situation that the through electrodes 17 are electrically connected to each other via the electromagnetic shielding layer 23 as in the laminated semiconductor wafer 100, so that the influence of the electromagnetic waves are able to be sufficiently avoided.

Besides, since the laminated semiconductor wafer 110 has the through electrode 17, 18 similar to the laminated semiconductor wafer 100, in the laminated semiconductor wafer 110, the time required for forming the through electrodes can be reduced. Accordingly, the number of the laminated semiconductor wafer 110 manufacturable per unit time can be also further increased by further reducing the manufacturing time. Further, since the laminated semiconductor wafer 110 has the through holes 85, 86 similar to the through holes 35, 36, in the laminated semiconductor wafer 110, it is also possible that the time required for forming the through holes 85, 86 is reduced. Therefore, the number of the laminated semiconductor wafer 110 manufacturable per unit time can be still further increased by still further reducing the manufacturing time.

Meanwhile, since the wiring electrodes 75, 76 do not have the extended terminal parts 15cc, 16cc, a contact area between the wiring electrodes 75, 76 and the through electrode 17, 18 is reduced as compared with the wiring electrodes 15, 16. However, since the three inner surfaces of the wiring electrodes 75, 76 are in contact with the through electrode 17, 18, contacts between the electrode pads 75a, 76a and the through electrode 17, 18 are secured sufficient level for practical use.

Further, since the electrode pads 75a, 76a of the wiring electrodes 75, 76 are opposed to each other, the laminated semiconductor wafer 110 has a structure in which the package inspection is easily performed.

Embodiment about a Wiring Electrode

Figure 25:
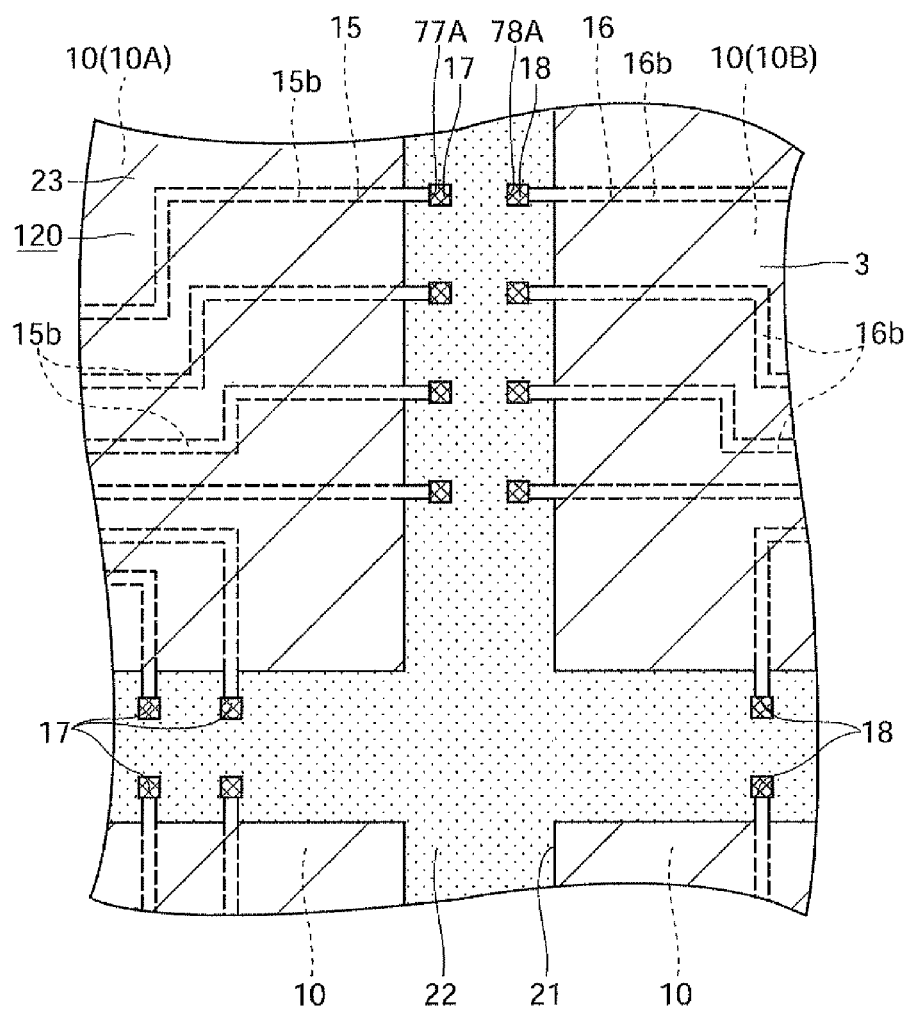
FIG. 25 is a plan view illustrating a principal part of the two device regions of the another laminated semiconductor wafer having a wiring electrode different from a wiring electrode in FIG. 2.
Figure 26:
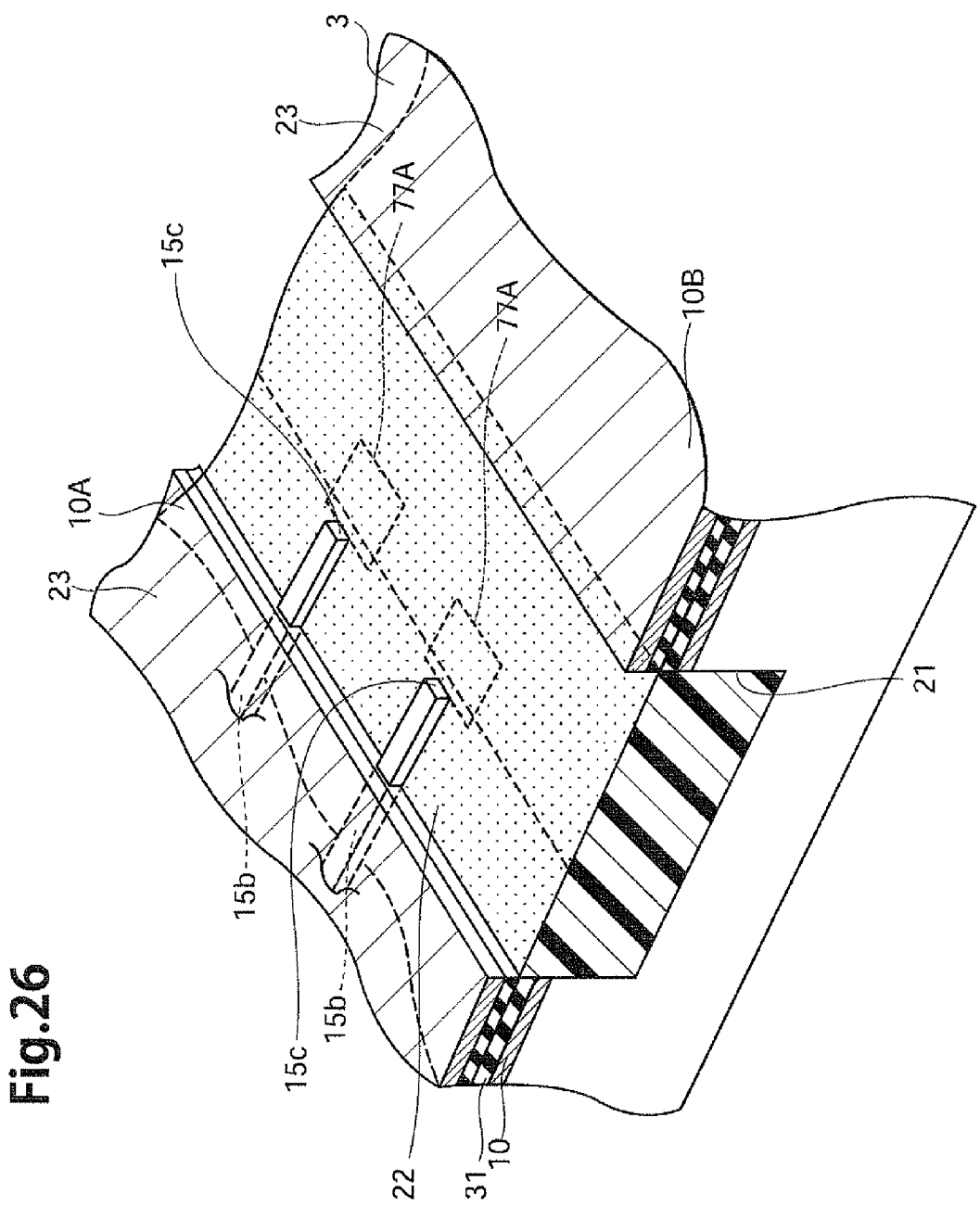
FIG. 26 is a perspective view illustrating a principal part of the semiconductor wafer constituting the partially manufactured laminated semiconductor wafer in FIG. 25.

Continuously, a laminated semiconductor wafer 120 will be described with reference to FIG. 25 and FIG. 26. Here, FIG. 25 is a plan view illustrating a principal part of the two device regions 10 of the laminated semiconductor wafer 120. FIG. 26 is a perspective view illustrating a principal part of the partially manufactured semiconductor wafer 3.

The laminated semiconductor wafer 120 is different in that it is manufactured by using a semiconductor wafer 3, as compared with the laminated semiconductor wafer 100. A plurality of semiconductor wafers 3 are laminated in the laminated semiconductor wafer 120.

The semiconductor wafer 3 is different in that the respective wiring electrodes 15, 16 of it do not have electrode pads 15a, 16a, they have only a line-shape terminal parts 15b, 16b, as compared with the semiconductor wafer 1.

In the laminated semiconductor wafer 120, a plurality of each of through holes 77A, 78A similar to the through holes 35, 36 in the laminated semiconductor wafer 100 are formed, and each of through electrodes 17, 18 is formed inside each of the through holes 77A, 78A, respectively. Further, since FIG. 26 illustrates the partially manufactured semiconductor wafer 3, the through electrodes 17 are not illustrated. Since the through holes 77A will be formed later, the through holes 77A are indicated by a dotted line in FIG. 26.

Each of through holes 77A is different in that it is formed such that the tip parts 15c of the line-shape terminal parts 15b appears, as compared with the through holes 35 of the laminated semiconductor wafer 100. In case of this laminated semiconductor wafer 120, since the tip parts 15c of the line-shape terminal parts 15b is extending to the innermost of the groove part 21, the tip parts 15c is an endmost part. In the laminated semiconductor wafer 120, the tip parts 15c is opposed to a not-shown tip part of the line-shape terminal parts 16b.

The above-described laminated semiconductor wafer 120, similar to the laminated semiconductor wafer 100, has the wiring electrodes 15 and 16 separated from each other. The two device regions 10A, 10B adjacent to each other are electrically insulated by the in-groove insulating layer 22. Therefore, in the laminated semiconductor wafer 120, similar to the laminated semiconductor wafer 100, the package inspection for the individual laminated chip package is able to be performed in a state of the wafer structure, the laminated semiconductor wafer 120 has a structure in which the package inspection is easily performed for the whole individual laminated chip packages. Therefore, the use of the laminated semiconductor wafer 120 also enables to reduce the manufacturing time of the laminated chip packages, the number of the laminated chip packages manufacturable per unit time can be increased.

Since each semiconductor wafer 3 has the electromagnetic shielding layer 23, the effect of shielding against the electromagnetic waves for a long time is achieved while avoiding the situation that the through electrodes 17 are electrically connected to each other via the electromagnetic shielding layer 23 as in the laminated semiconductor wafer 100, so that the influence of the electromagnetic waves are able to be sufficiently avoided.

Besides, since the laminated semiconductor wafer 120 has the through electrode 17, 18 similar to the laminated semiconductor wafer 100, in the laminated semiconductor wafer 120, the time required for forming the through electrodes can be reduced. Accordingly, the number of the laminated semiconductor wafer 120 manufacturable per unit time can be further increased by further reducing the manufacturing time. Further, since the laminated semiconductor wafer 120 has the through holes 77A, 78A similar to the through holes 35, 36, in the laminated semiconductor wafer 120, it is also possible that the time required for forming the through holes 77A, 78A is reduced. Therefore, the number of the laminated semiconductor wafer 120 manufacturable per unit time can be still further increased by still further reducing the manufacturing time.

Meanwhile, since the laminated semiconductor wafer 120 do not have the electrode pads 15a, 16a, a contact area between the wiring electrodes 15, 16 and the through electrode 17, 18 is reduced as compared with the laminated semiconductor wafer 100. However, regarding the wiring electrodes 15 and the through electrode 17, since the tip parts 15c is in contact with the through electrode 17, a contact between the wiring electrodes 15 and the through electrodes 17 are secured. A contact between the wiring electrodes 16 and the through electrodes 18 are also secured.

Figure 29:
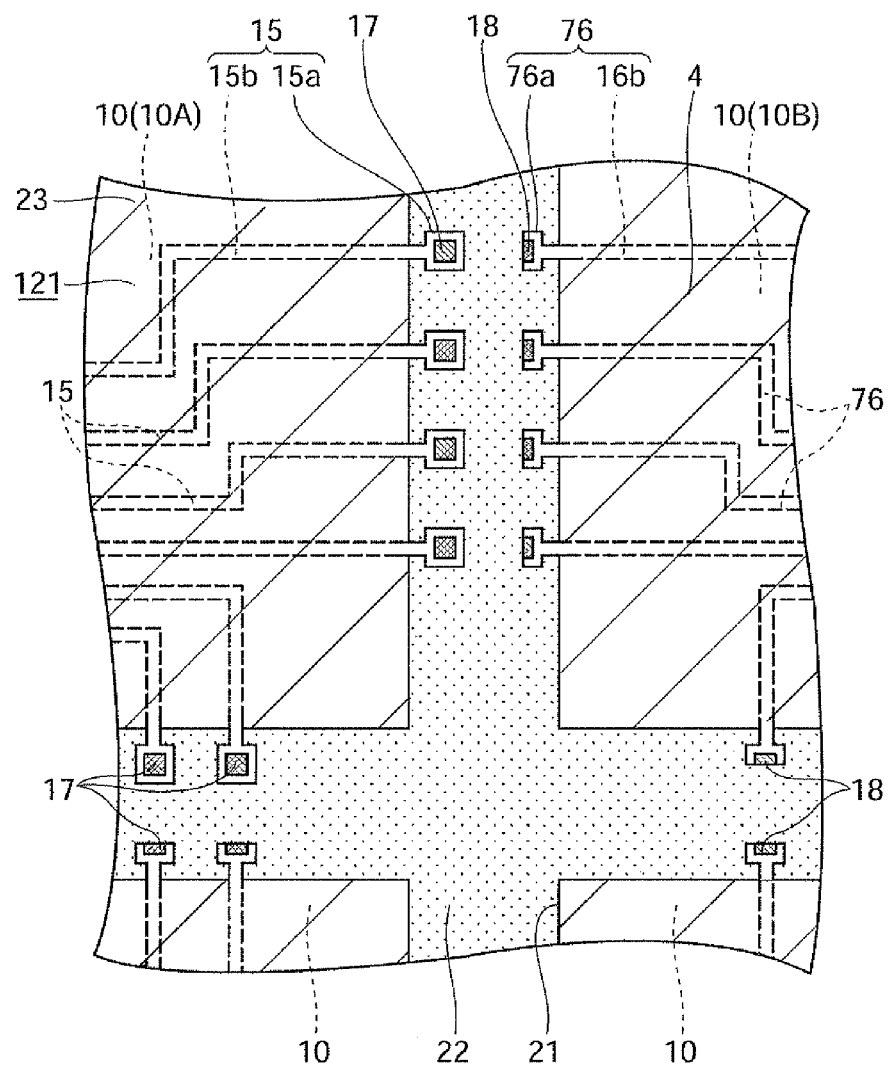
FIG. 29 is a plan view illustrating a principal part of the two device regions of the another laminated semiconductor wafer having a wiring electrode different from a wiring electrode in FIG. 2.

A laminated semiconductor wafer 121 will be described with reference to FIG. 29. Here, FIG. 29 is a plan view illustrating a principal part of two device regions 10 of a semiconductor wafer 4 constituting the laminated semiconductor wafer 121.

Though the wiring electrodes having the same shape (for example, the wiring electrodes 15, 16) are formed with the groove part intervening therebetween in each of the above-described laminated semiconductor wafers, wiring electrodes in different shapes may also be formed. For example, as illustrated in FIG. 29, the laminated semiconductor wafer 121 can be formed using the semiconductor wafer 4 in which wiring electrodes 76 are formed in place of the wiring electrodes 16.

Figure 30:
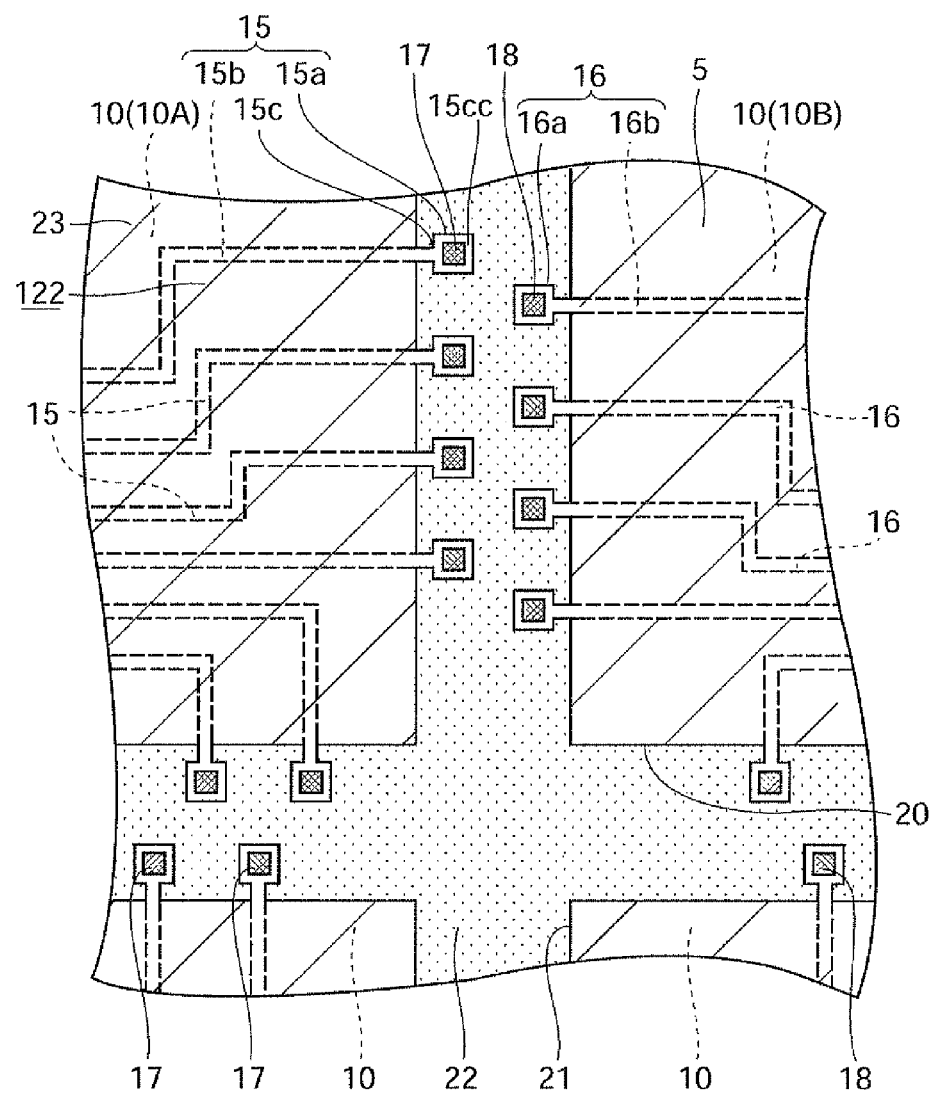
FIG. 30 is a plan view illustrating a principal part of the two device regions of the still another laminated semiconductor wafer having a wiring electrode different from a wiring electrode in FIG. 2.

Meanwhile, the wiring electrodes having the same shape (for example, the wiring electrodes 15, 16) are formed to be opposed to each other with the groove part intervening therebetween in each of the above-described laminated semiconductor wafers. A laminated semiconductor wafer 122 may be formed in which semiconductor wafers 5 illustrated in FIG. 30 are laminated. The semiconductor wafer 5 has the wiring electrodes 15, 16, but the wiring electrodes 15, 16 are formed such that the positions of the wiring electrodes 15, 16 are displaced from each other so that they are not opposed to each other. However, the wiring electrodes 15, 16 are separated from each other and the device regions 10A, 10B are insulated also in the laminated semiconductor wafer 122, so that the package inspection can be performed for the individual laminated chip package in a state of the wafer structure.

In the above embodiments, the groove parts 20, 21 are formed on the semiconductor wafer 1, and so on. However, only the groove parts 21 may be formed without forming the groove parts 20. In the case of this laminated semiconductor wafer, a plurality of groove parts 21 are arranged at regular intervals and the groove parts are formed in the shape of stripes not intersecting with each other, in the semiconductor wafer 1. Further, the groove part 21 may be formed along every other scribe line 3B.

In the above-described embodiments, the laminated electrode group 55 is composed of eight common wiring electrodes laminated in the laminated direction. The wafer test is performed by measuring the electrical characteristics in each chip planned part for each semiconductor wafer 1 before lamination. As a result of performing the wafer test and the quality judgment on each chip planned part, a bad chip planned part may be included in the semiconductor wafer 1. However, only good chip planned parts need to be used for the laminated chip package 200.

Therefore, when a bad chip planned part is included in the semiconductor wafer 1, it is preferable not to form the wiring electrode in the bad chip planned part. In this case, the positional information of the bad chip planned part is saved during the wafer test so that the wiring electrode is not formed in the device region according to the positional information in the substrate manufacturing process. By this, the bad chip planned part can be excluded from the subject for electrical connection, though the bad chip planned part is physically included in the laminated chip package.

Further, the laminated chip package including the bad chip planned part may be excluded as a bad product. In this case, identification information of the semiconductor wafer including the bad chip planned part is saved together with the positional information of the bad chip planned part, and the laminated chip package including the bad chip planned part may be excluded at a stage of the package inspection according to the positional information and the identification information.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A laminated semiconductor wafer, comprising:
   a plurality of semiconductor substrates having a plurality of scribe-groove parts formed along scribe lines,
   each of the plurality of semiconductor substrates including:
   a plurality of device regions insulated from each other, each of which is in contact with at least one of the plurality of scribe-groove parts and has a semiconductor device formed therein; and
   an electromagnetic shielding layer formed in regions other than the scribe-groove parts using a ferromagnetic body, provided in each of an uppermost substrate laminated on the top side and a lowermost substrate laminated on the bottom side among the plurality of semiconductor substrates,
   a through hole formed in the scribe-groove part which penetrates the plurality of semiconductor substrates laminated in a laminated direction in which the plurality of semiconductor substrates are laminated; and
   a through electrode penetrating the plurality of semiconductor substrates through the through hole.

2. The laminated semiconductor wafer according to claim 1,
   wherein all of the plurality of semiconductor substrates including the uppermost substrate and the lowermost substrate each have the electromagnetic shielding layer.

3. The laminated semiconductor wafer according to claim 1,
   wherein all of the plurality of semiconductor substrates including the uppermost substrate and the lowermost substrate each have the electromagnetic shielding layer, and
   wherein in all of the plurality of semiconductor substrates, all of the plurality of device regions are formed on a first surface being one of surfaces of the semiconductor substrate, and the electromagnetic shielding layer is formed on the first surface to cover all of the plurality of device regions from the outside.

4. The laminated semiconductor wafer according to claim 3,
   wherein the electromagnetic shielding layer is formed in regions other than the scribe-groove parts on the first surface, and has individual structures having sizes according to the plurality of device regions respectively, individually covering all of the plurality of device regions, and separated from one another.

5. The laminated semiconductor wafer according to claim 3, further comprising:
   an added electromagnetic shielding layer formed using a ferromagnetic body on a second surface on the rear surface side of the first surface in the lowermost substrate.

6. The laminated semiconductor wafer according to claim 1, wherein all of the plurality of semiconductor substrates including the uppermost substrate and the lowermost substrate each have the electromagnetic shielding layer, and wherein in all of the plurality of semiconductor substrates, all of the plurality of device regions are formed on a first surface being one of surfaces of the semiconductor substrate, and the electromagnetic shielding layer is formed on a second surface on the rear surface side of the first surface.

7. The laminated semiconductor wafer according to claim 6 wherein the electromagnetic shielding layer has a size according to each of the plurality of device regions respectively and is formed at corresponding position corresponding to each of the plurality of device regions on the second surface, and wherein the laminated semiconductor substrate further comprises an added electromagnetic shielding layer formed using a ferromagnetic body on the first surface in the uppermost substrate.

8. The laminated semiconductor wafer according to claim 1, wherein the electromagnetic shielding layer is formed using a soft magnetic material.

9. The laminated semiconductor wafer according to claim 1, wherein the plurality of semiconductor substrates each further comprises:

a first wiring electrode and a second wiring electrode which are connected to the respective semiconductor devices in a first device region and a second device region adjacent to each other across at least one interposed groove part of the plurality of scribe-groove parts of the plurality of device regions, and extend to the inside of the interposed groove part from the first device region and the second device region respectively, and are separated from each other, wherein the laminated semiconductor substrate further comprises:

a plurality of laminated chip regions each of which is composed of the device regions laminated in the laminated direction in all of the plurality of semiconductor substrates, wherein the through hole penetrates the interposed groove parts of the plurality of semiconductor substrates, and a plurality of the first wiring electrodes constituting a laminated electrode group laminated in the laminated direction of the first wiring electrodes appear in the through hole, and wherein the through electrode is in contact with all of the first wiring electrodes appearing in the through hole.

10. The laminated semiconductor wafer according to claim 9, wherein where the first wiring electrodes having a common position among the first wiring electrodes in each of the plurality of semiconductor substrates are common wiring electrodes, the laminated electrode group is composed of the common wiring electrodes identical, regarding all of the plurality of semiconductor substrates.

11. The laminated semiconductor wafer according to claim 10, wherein the first wiring electrode has an electrode pad disposed inside the interposed groove part and having a hole part formed along the laminated direction, and wherein the through hole is formed in a straight line connecting all of the hole parts formed in the respective electrode pads of the plurality of the first wiring electrodes constituting the laminated electrode group.

12. A laminated chip package, comprising:

a plurality of semiconductor chips having a semiconductor device, each of the plurality of semiconductor chips including:

a resin insulating layer made of an insulating resin formed to surround the semiconductor chip; and a wiring electrode which is connected to the semiconductor device and has an end part disposed on the resin insulating layer, an electromagnetic shielding layer formed in a region other than the resin insulating layer using a ferromagnetic body, provided in each of an uppermost chip laminated on the top side and a lowermost chip laminated on the bottom side among the plurality of semiconductor chips;

a through hole formed penetrating the resin insulating layers of the plurality of semiconductor chips laminated in a laminated direction in which the plurality of semiconductor chips are laminated; and a through electrode penetrating the plurality of semiconductor chips through the through hole.

13. The laminated chip package according to claim 12, wherein all of the plurality of semiconductor chips including the uppermost chip and the lowermost chip each have the electromagnetic shielding layer.

14. The laminated chip package according to claim 12, wherein all of the plurality of semiconductor chips including the uppermost chip and the lowermost chip each have the electromagnetic shielding layer, and wherein in all of the plurality of semiconductor chips, the semiconductor device is formed on a first surface being one of surfaces of the semiconductor chip, and the electromagnetic shielding layer is formed on the first surface to cover the semiconductor device from the outside.

15. The laminated chip package according to claim 12, wherein all of the plurality of semiconductor chips including the uppermost chip and the lowermost chip each have the electromagnetic shielding layer, and wherein in all of the plurality of semiconductor chips, the semiconductor device is formed on a first surface being one of surfaces of the semiconductor chip, and the electromagnetic shielding layer is formed on a second surface on the rear surface side of the first surface.

16. The laminated chip package according to claim 12, wherein a plurality of the wiring electrodes constituting a laminated electrode group laminated in the laminated direction among the wiring electrodes appear in the through hole, and wherein the through electrode is in contact with all of the wiring electrodes appearing in the through hole.

17. A method of manufacturing a laminated semiconductor substrate, comprising:

a substrate with groove forming step of forming a plurality of scribe-groove parts along scribe lines in a first surface where semiconductor devices are formed, in all of a plurality of unprocessed substrates having the semiconductor devices formed thereon, to form a plurality of substrates with groove including a plurality of device regions each of which is in contact with at least one of the plurality of scribe-groove parts and has the semiconductor device formed therein;

an electromagnetic shielding layer forming step of forming an electromagnetic shielding layer in regions other than the scribe-groove parts using a ferromagnetic body, on the first surface or a second surface on the rear surface side of the first surface, in at least two of the plurality of substrates with groove;

a lamination step of laminating the plurality of substrates with groove such that substrates with shielding layer each having the electromagnetic shielding layer among the plurality of substrates with groove formed in the substrate with groove forming step are placed on the top side and the bottom side respectively to manufacture a laminated wafer;

a through hole forming step of forming a through hole penetrating the plurality of substrates with groove laminated in a laminated direction in which the plurality of substrates with groove are laminated, in the laminated wafer; and a through electrode forming step of forming a through electrode penetrating the plurality of substrates with groove through the through hole.

18. The method of manufacturing a laminated semiconductor substrate according to claim 17, wherein in the electromagnetic shielding layer forming step, the electromagnetic shielding layer is formed in all of the plurality of substrates with groove to make all of the plurality of substrates with groove into the substrates with shielding layer, and wherein in the lamination step, a plurality of only the substrates with shielding layer are laminated.

19. The method of manufacturing a laminated semiconductor substrate according to claim 18, wherein in the electromagnetic shielding layer forming step, the electromagnetic shielding layer is formed on the first surface to have individual structures having sizes according to the plurality of device regions respectively, individually covering all of the plurality of device regions, and separated from one another.

20. The method of manufacturing a laminated semiconductor substrate according to claim 18, wherein in the electromagnetic shielding layer forming step, when forming the electromagnetic shielding layer on the second surface of the substrate with groove, the second surface of the substrate with groove is polished until the scribe-groove parts appear, and then the electromagnetic shielding layer is formed on the second surface to make the substrate with groove into the substrate with shielding layer, and the lamination step is executed by laminating another substrate with groove on the second surface of the substrate with shielding layer.

21. The method of manufacturing a laminated semiconductor substrate according to claim 17, further comprising:

an electrode forming step of forming a first wiring electrode and a second wiring electrode which are connected to the respective semiconductor devices in a first device region and a second device region adjacent to each other across at least one interposed groove part of the plurality of scribe-groove parts among the plurality of device regions in the substrate with groove, and extend to the inside of the interposed groove part from the first device region and the second device region respectively, and are separated from each other, wherein the electromagnetic shielding layer forming step is executed after the first wiring electrode and the second wiring electrode are formed by executing the electrode forming step.

22. A method of manufacturing a laminated chip package, comprising the step of:

cutting the laminated semiconductor substrate manufactured by the manufacturing method according to claim 17 along the scribe-groove parts to cause resin insulating layers made of an insulating resin to appear in a cut surface to manufacture laminated chip packages.

\* \* \* \* \*